US012809433B2

(12) United States Patent
Guim Bernat et al.

(10) Patent No.: US 12,809,433 B2
(45) Date of Patent: Nov. 24, 2026

(54) SYSTEMS, APPARATUS, AND METHODS FOR MANAGING COOLING OF COMPUTE COMPONENTS

(71) Applicant: Intel Corporation, Santa Clara, CA (US)

(72) Inventors: Francesc Guim Bernat, Barcelona (ES); Kshitij Arun Doshi, Tempe, AZ (US); Adrian Hoban, County Clare (IE); Thijs Metsch, Bruehl (DE); John J. Browne, Limerick (IE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/313,993

(22) Filed: May 8, 2023

(65) Prior Publication Data

US 2023/0273659 A1 Aug. 31, 2023

(30) Foreign Application Priority Data

Dec. 30, 2022 (IN) ............................ 202241077201

(51) Int. Cl.
*H05K 7/20* (2006.01)
*G06F 1/20* (2006.01)

(52) U.S. Cl.
CPC ......... *G06F 1/206* (2013.01); *H05K 7/20281* (2013.01)

(58) Field of Classification Search
CPC ...... G06F 1/206; G06F 1/20; G06F 2200/201; H05K 7/20281; H05K 7/20736; H05K 7/20836; Y02D 10/00
See application file for complete search history.

(56) References Cited

U.S. PATENT DOCUMENTS 9,003,003 B1 * 4/2015 Hyser ................. H04L 67/1008 700/35
2006/0047808 A1 * 3/2006 Sharma ................. G06F 9/5094 709/224

(Continued)

FOREIGN PATENT DOCUMENTS

AU 2009261991 A1 12/2009
CA 2731994 A1 2/2010

(Continued)

OTHER PUBLICATIONS

Kleinman, "Tiny date centre used to heat public swimming pool," BBC News, Mar. 14, 2023, retrieved from <https://www.bbc.com/news/technology-64939558> on Apr. 3, 2023, 12 pages.

(Continued)

*Primary Examiner* — Christopher E. Everett
(74) *Attorney, Agent, or Firm* — Hanley, Flight & Zimmerman, LLC

(57) ABSTRACT

Systems, apparatus, and methods for managing cooling of compute components are disclosed. An example apparatus includes programmable circuitry to at least one of instantiate or execute machine readable instructions to identify a workload to be performed by a compute device, identify a service level objective associated with the workload or the compute device, determine a parameter of a coolant to enable the service level objective to be satisfied during performance of the workload, and cause a cooling distribution unit to control the coolant based on the coolant parameter.

20 Claims, 35 Drawing Sheets

(56) References Cited

U.S. PATENT DOCUMENTS

| | | | | |
|---|---|---|---|---|
| 2007/0260417 | A1* | 11/2007 | Starmer | G01K 7/425 374/E7.043 |
| 2009/0265045 | A1* | 10/2009 | Coxe, III | G06F 1/20 700/300 |
| 2010/0217454 | A1* | 8/2010 | Spiers | H05K 7/20836 713/320 |
| 2011/0132579 | A1 | 6/2011 | Best et al. | |
| 2011/0240281 | A1 | 10/2011 | Avery | |
| 2012/0216065 | A1* | 8/2012 | Nastacio | H05K 7/20836 713/340 |
| 2014/0040899 | A1 | 2/2014 | Yuan | |
| 2014/0104784 | A1 | 4/2014 | Chen et al. | |
| 2016/0011607 | A1 | 1/2016 | James | |
| 2019/0069433 | A1* | 2/2019 | Balle | G06F 9/505 |
| 2021/0320050 | A1 | 10/2021 | Robinson et al. | |
| 2022/0011834 | A1 | 1/2022 | Heydari | |
| 2022/0117121 | A1* | 4/2022 | Heydari | H05K 7/1492 |
| 2022/0179465 | A1 | 6/2022 | Bose | |
| 2023/0229216 | A1 | 7/2023 | Lerer | |
| 2023/0289087 | A1 | 9/2023 | Ali | |
| 2024/0040753 | A1* | 2/2024 | Khan I | G06F 11/3058 |
| 2024/0224467 | A1 | 7/2024 | Dibbad | |

FOREIGN PATENT DOCUMENTS

| | | | |
|---|---|---|---|
| GB | 2576032 | | 4/2021 |
| GB | 2576030 | | 12/2021 |
| GB | 2595496 | A | 12/2021 |
| GB | 2597525 | | 2/2022 |
| GB | 2601357 | | 6/2022 |
| WO | 2009158683 | A3 | 4/2010 |
| WO | 2021214752 | A1 | 10/2021 |

OTHER PUBLICATIONS

United States Patent and Trademark Office, “Non-Final Office Action,” issued in connection with U.S. Appl. No. 18/313,994, dated Feb. 26, 2026, 28 pages.

United States Patent and Trademark Office, “Final Office Action,” issued in connection with U.S. Appl. No. 18/313,994, dated Aug. 4, 2026, 14 pages.

* cited by examiner

SYSTEMS, APPARATUS, AND METHODS FOR MANAGING COOLING OF COMPUTE COMPONENTS

RELATED APPLICATION

This patent claims priority to Indian Provisional Patent Application No. 202241077201, which was filed on Dec. 30, 2022. Indian Provisional Patent Application No. 202241077201 is hereby incorporated herein by reference in its entirety.

FIELD OF THE DISCLOSURE

This disclosure relates generally to liquid cooling systems for electronic components and, more particularly, to systems, apparatus, and methods for managing cooling of compute components.

BACKGROUND

Air cooling can be used to cool electronic components by facilitating airflow over the electronic components to promote dissipation of heat. In some instances, the use of liquids to cool electronic components is being explored to address thermal management risks resulting from increased thermal design power in high performance systems (e.g., CPU and/or GPU servers in data centers, cloud computing, edge computing, and the like).

BRIEF DESCRIPTION OF THE DRAWINGS

In general, the same reference numbers will be used throughout the drawing(s) and accompanying written description to refer to the same or like parts. The figures are not necessarily to scale.

Figure 1:
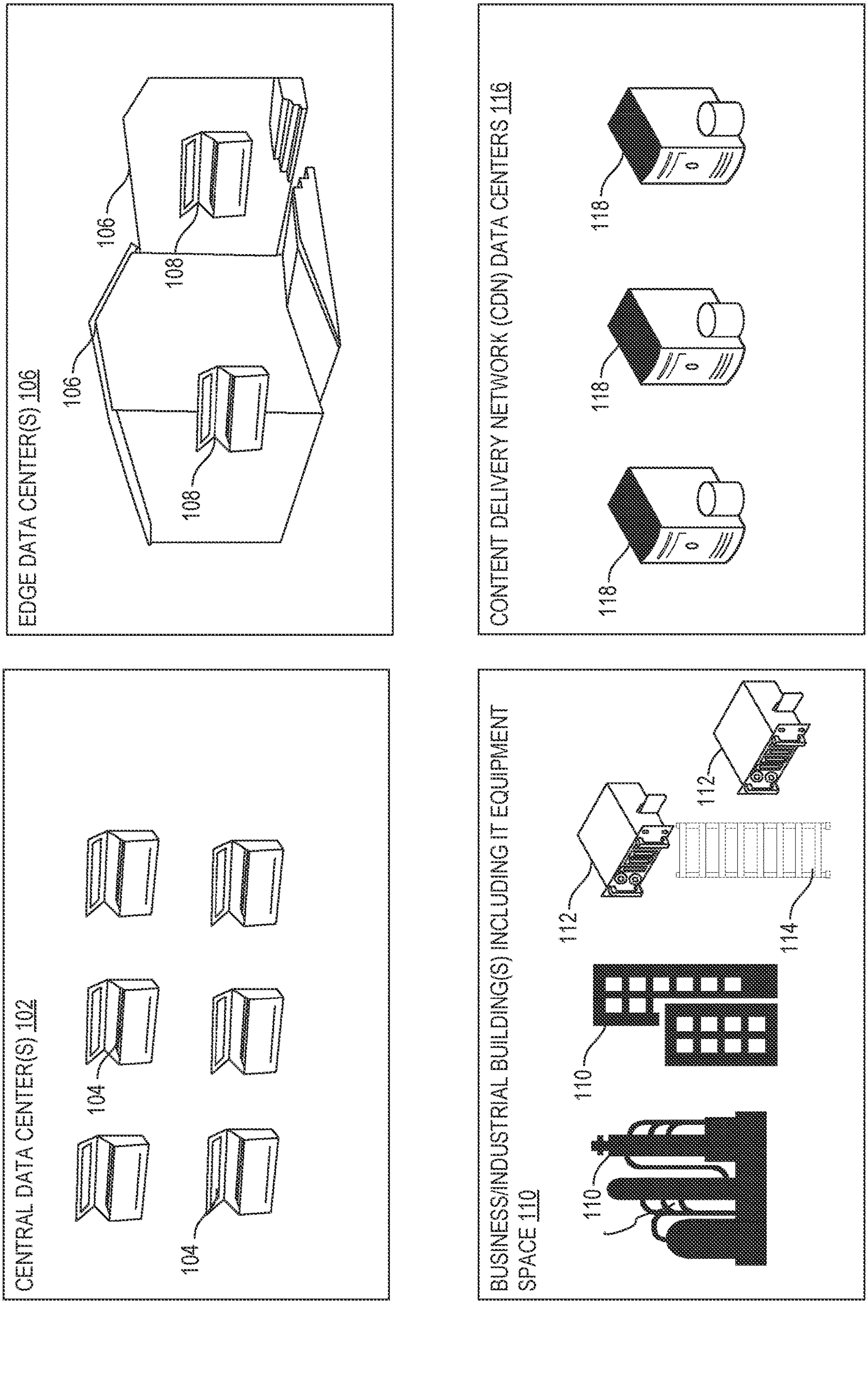
FIG. 1 illustrates one or more example environments in which teachings of this disclosure may be implemented.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

DETAILED DESCRIPTION

As noted above, the use of liquids to cool electronic components is being explored for its benefits over more traditional air cooling systems, as there are increasing needs to address thermal management risks resulting from increased thermal design power in high performance systems (e.g., CPU and/or GPU servers in data centers, accelerators, artificial intelligence computing, machine learning computing, cloud computing, edge computing, and the like). More particularly, relative to air, liquid has inherent advantages of higher specific heat (when no boiling is involved) and higher latent heat of vaporization (when boiling is involved). In some instances, liquid can be used to indirectly cool electronic components by cooling a cold plate that is thermally coupled to the electronic component(s). An alternative approach is to directly immerse electronic components in the cooling liquid. In direct immersion cooling, the liquid can be in direct contact with the electronic components to directly draw away heat from the electronic components. To enable the cooling liquid to be in direct contact with electronic components, the cooling liquid is electrically insulative (e.g., a dielectric liquid).

A liquid cooling system can involve at least one of single-phase cooling or two-phase cooling. As used herein, single-phase cooling (e.g., single-phase immersion cooling) means the cooling fluid (sometimes also referred to herein as cooling liquid or coolant) used to cool electronic components draws heat away from heat sources (e.g., electronic components) without changing phase (e.g., without boiling and becoming vapor). Such cooling fluids are referred to herein as single-phase cooling fluids, liquids, or coolants. By contrast, as used herein, two-phase cooling (e.g., two-phase immersion cooling) means the cooling fluid (in this case, a cooling liquid) vaporizes or boils from the heat generated by the electronic components to be cooled, thereby changing from the liquid phase to the vapor phase. The gaseous vapor may subsequently be condensed back into a liquid (e.g., via a condenser) to again be used in the cooling process. Such cooling fluids are referred to herein as two-phase cooling fluids, liquids, or coolants. Notably, gases (e.g., air) can also be used to cool components and, therefore, may also be referred to as a cooling fluid and/or a coolant. However, indirect cooling and immersion cooling typically involves at least one cooling liquid (which may or may not change to the vapor phase when in use). Example systems, apparatus, and associated methods to improve cooling systems and/or associated cooling processes are disclosed herein.

In some edge environments, compute resources of an edge device can be purchased and/or accessed by one or more tenants (e.g., parties, clients, etc.). For instance, the tenants can purchase usage of and/or access to the compute resources to perform workloads for the corresponding tenants. In some cases, an amount, duration, and/or price of the compute resources purchased by a corresponding tenant are controlled based on a service-level agreement (SLA) or service level objective (SLO) associated with the tenant. The SLA/SLO can further indicate a temperature at which the compute resources are to be maintained to facilitate performance of the workloads. In some cases, the compute resources generate heat while performing workloads for the tenants. As such, cooling systems are implemented in the edge environments to cool the compute resources to and/or maintain the compute resources at the temperature indicated in the SLA/SLO (e.g., to prevent overheating). In some instances, workloads may differ across the compute resources at a given time, such that cooling needs may vary across the compute resources. Further, the cooling needs for respective ones of compute resources may vary over time, such that tenants may wish to purchase fewer or greater cooling resources for the respective compute resources.

In some instances, a cooling system of an edge environment includes one or more cooling distribution units (CDUs) to distribute cooling resources to and/or between edge locations (e.g., edge nodes and/or devices) in the edge environment. The CDU(s) distribute the fluid based on amounts of cooling fluid purchased and/or expected by corresponding tenants operating at the edge locations. In some cases, the cooling resources expected and/or to be provided (e.g., to sufficiently cool a component, to meet SLA/SLO criteria) at a particular edge location may vary based on changing conditions. For instance, an amount of cooling fluid to cool a given node can vary as a result of a change in ambient temperature, a change in workload at the node, a change in a number of processor cores implemented at the node, an average power draw at the node, a peak power draw at the node, etc. In some such cases, additional cooling fluid may be expected and/or excess cooling fluid may be available for the node.

Telemetry provides for collection of data (e.g., performance data, operational data) associated with components (e.g., compute devices such as servers) of a system architecture that can be used by schedulers, orchestrators, operations support systems, and/or business support systems. For instance, data can be collected from performance counters associated with a central processing unit (CPU). In some known examples, information captured via telemetry is associated with a logical entity that is typically identified by a unique identifier. In emerging system architectures, the system can be understood as a volumetric and dynamic system and, thus, telemetry for the system should be expanded. For instance, some known cooling systems operate based on a level of telemetry that shows temperature for a particular element and/or a temperature of a coolant. However, additional details about the cooling behavior across the system would permit more robust analysis of heat reuse and cooling scheduling policies. For instance, in systems where cooling is used as a mean to dissipate heat, detailed information about cooling states throughout the system could permit the dissipated heat to be collected it and distributed across other elements of the infrastructure.

Examples disclosed herein provide for dynamic adjustments of cooling parameters and/or workload parameters based on analysis of sensor telemetry and compute performance telemetry to facilitate performance of workloads. In particular, examples disclosed herein facilitate performance of workloads to satisfy parameters set forth in SLAs associated with the node. Examples disclosed herein provide for observability in the context of a system or infrastructure that considers cooling of multiple compute devices and capabilities to reuse heat generated during the cooling (e.g., to heat buildings). Examples disclosed herein monitor how the coolant is distributed within the system architecture and/or how resulting heated fluid is consumed. Examples disclosed herein provide for detailed cooling telemetry that can be used to establish heatmaps for the respective compute devices and the overall infrastructure. The heatmaps can be used to provide for, for example, advanced orchestration of resources and/or infrastructure analysis (e.g., using machine learning, deep learning) and prediction with respect to behavior of cooling and/or reuse of heat across the system.

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase cooling or two-phase cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

Figure 2:
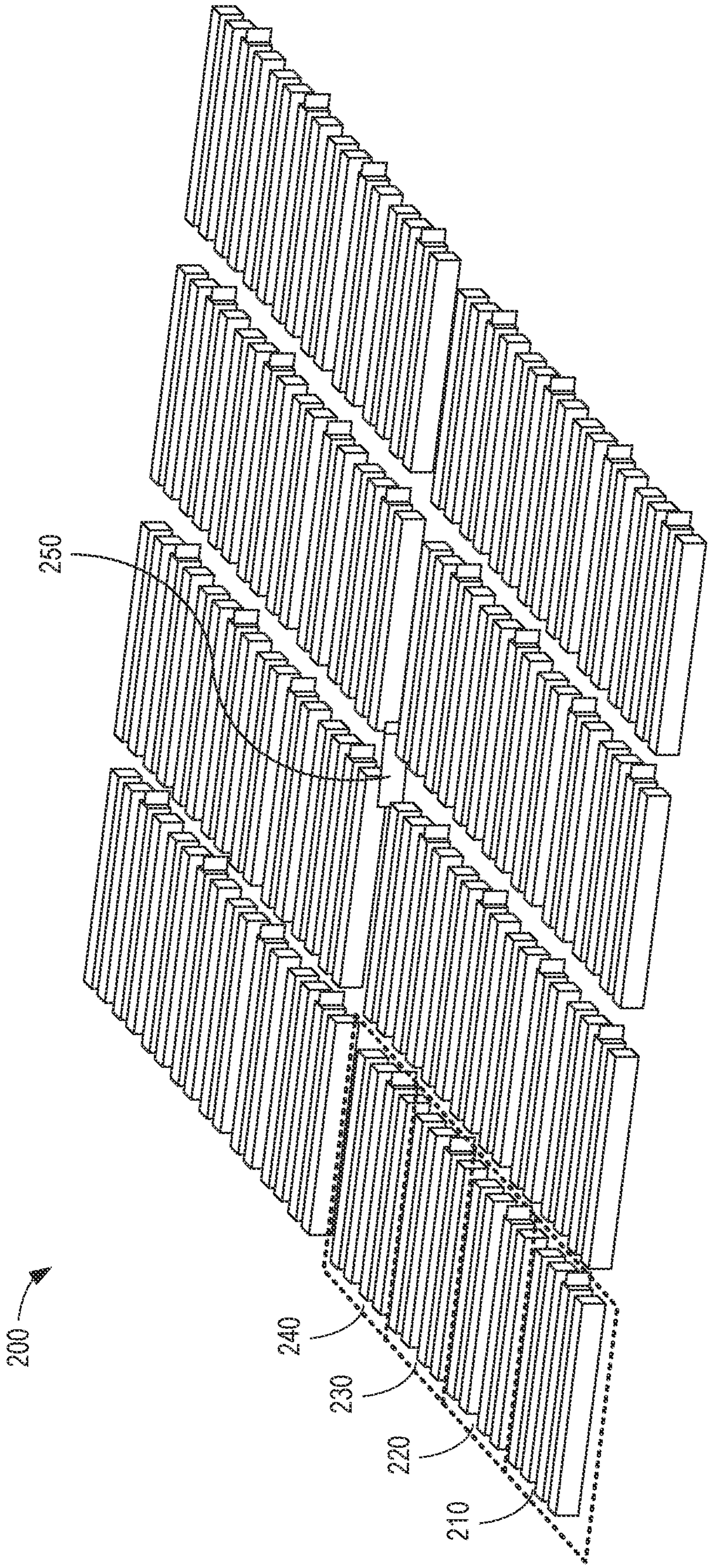
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose programmable circuitry), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first programmable circuitry assigned to one managed node and second programmable circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (programmable circuitry, storage, accelerators, etc.) typically have different refresh rates, greater resource utilization and reduced total cost of ownership may be achieved. For example, a data center operator can upgrade the programmable circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
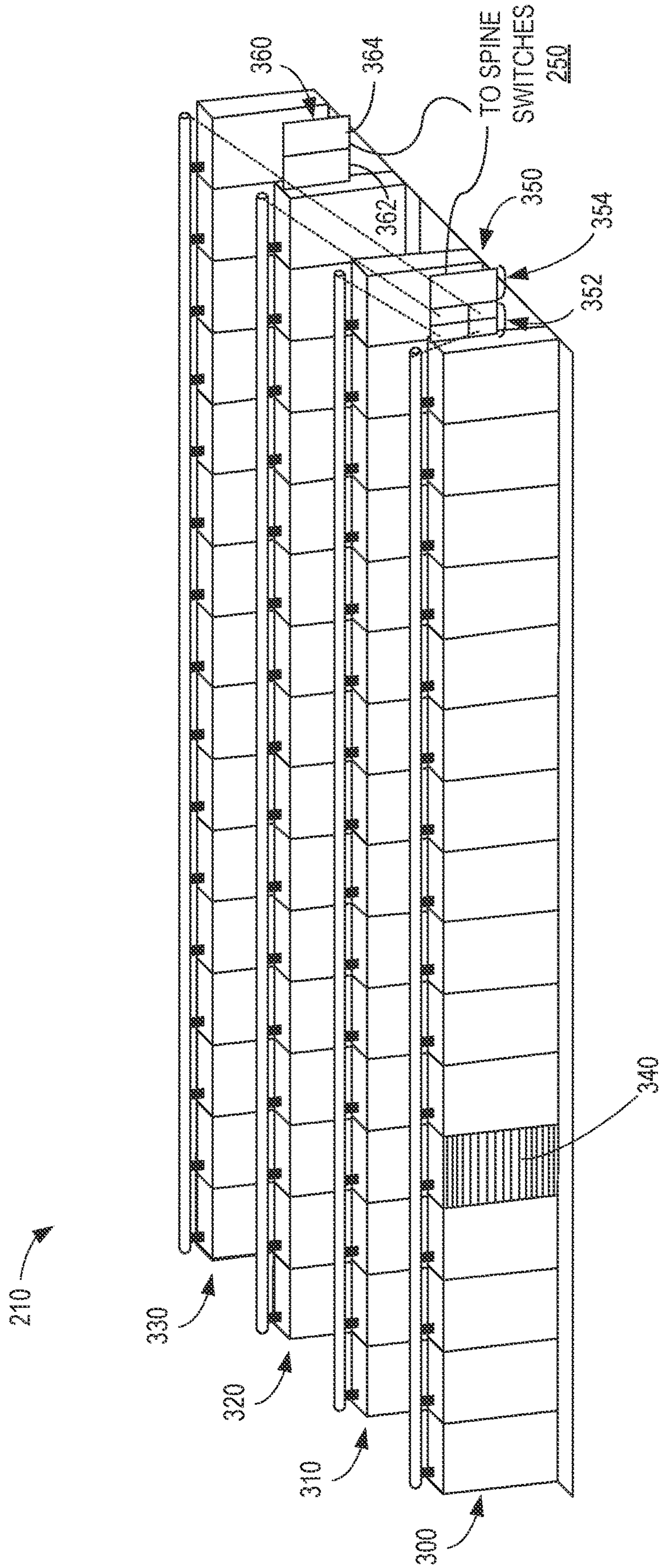
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
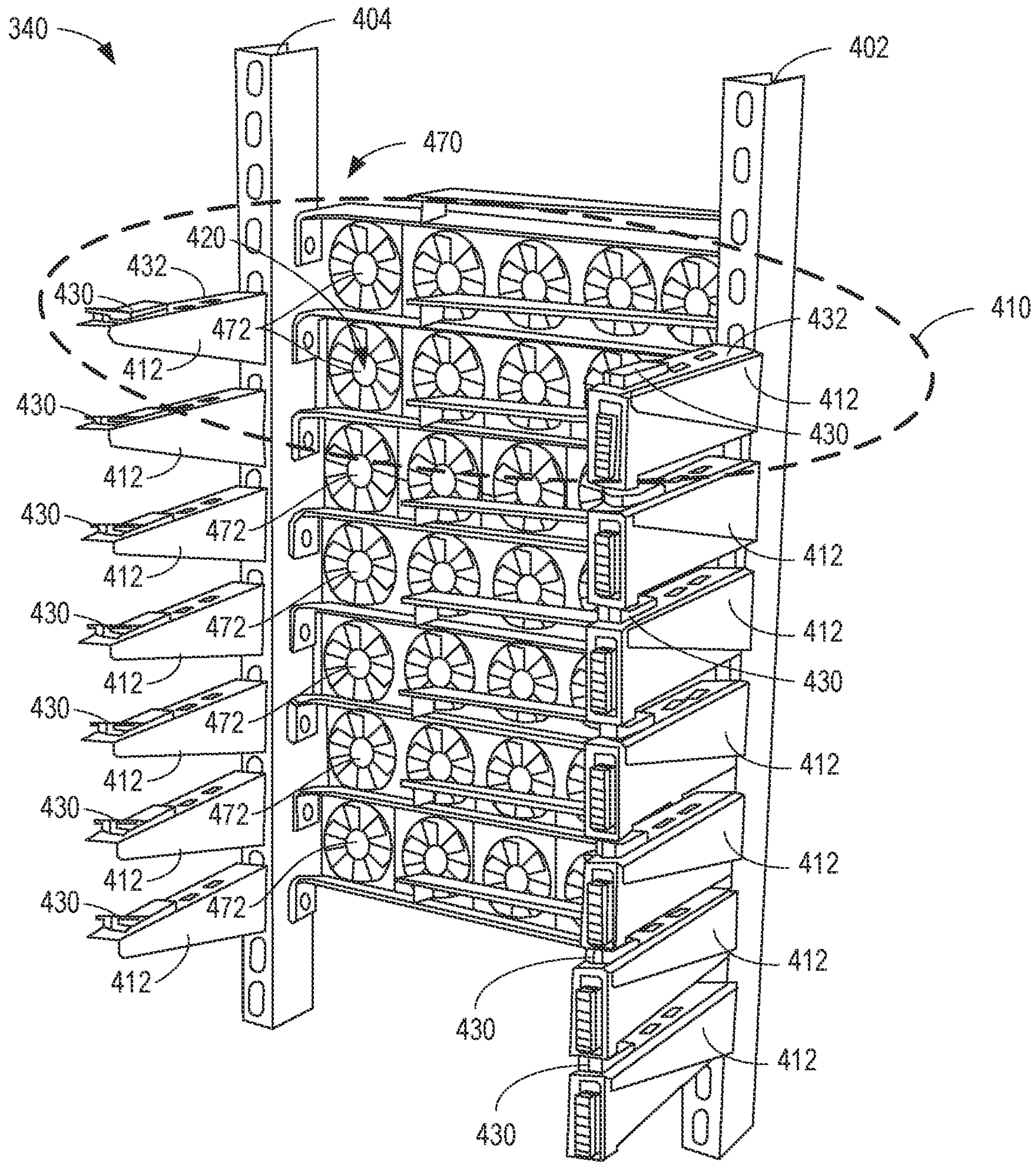
FIG. 4 is a perspective view of at least one example of a rack that may be included in the pod of FIG. 3.
Figure 5:
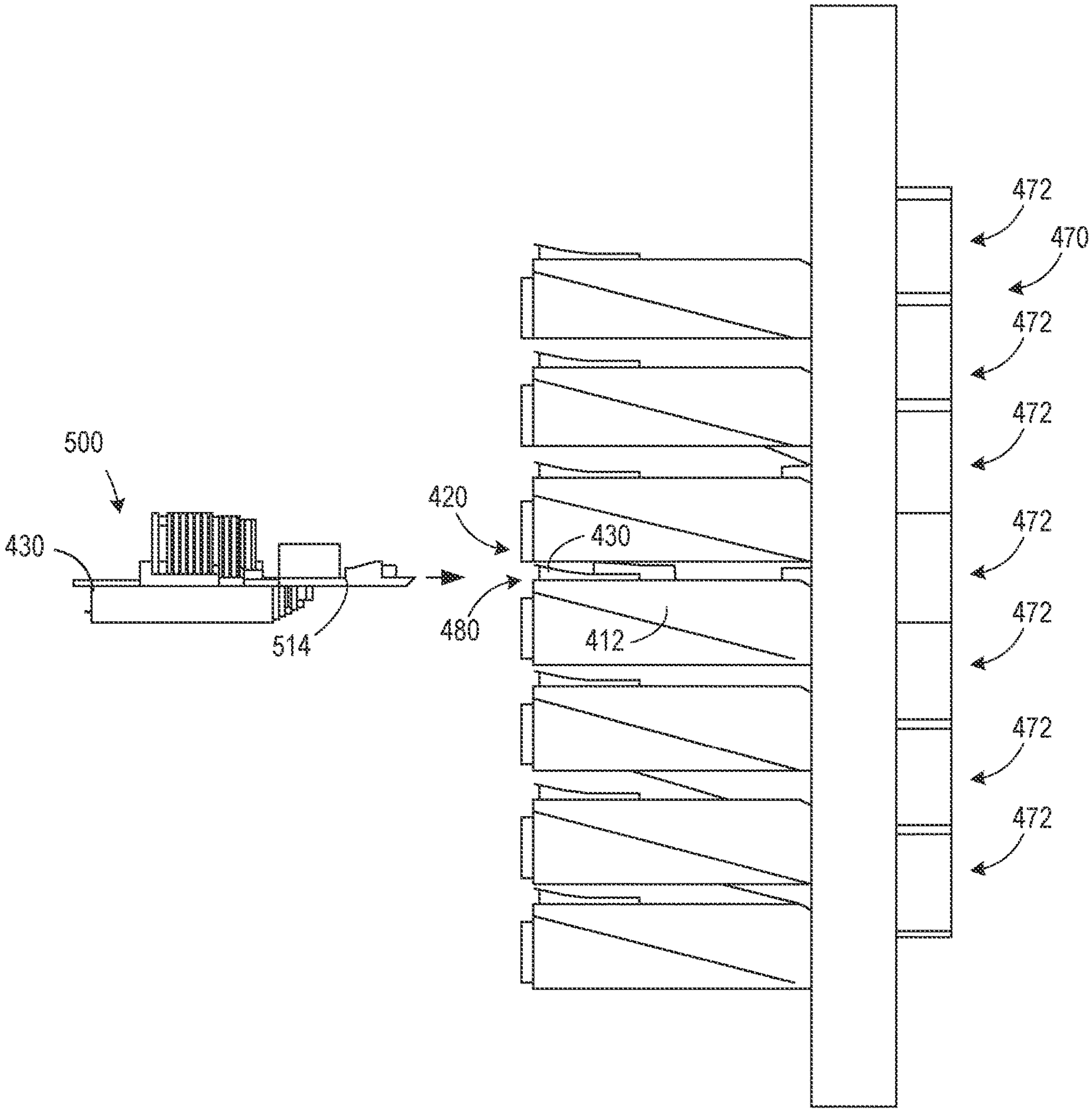
FIG. 5 is a side elevation view of the rack of FIG. 4.
Figure 6:
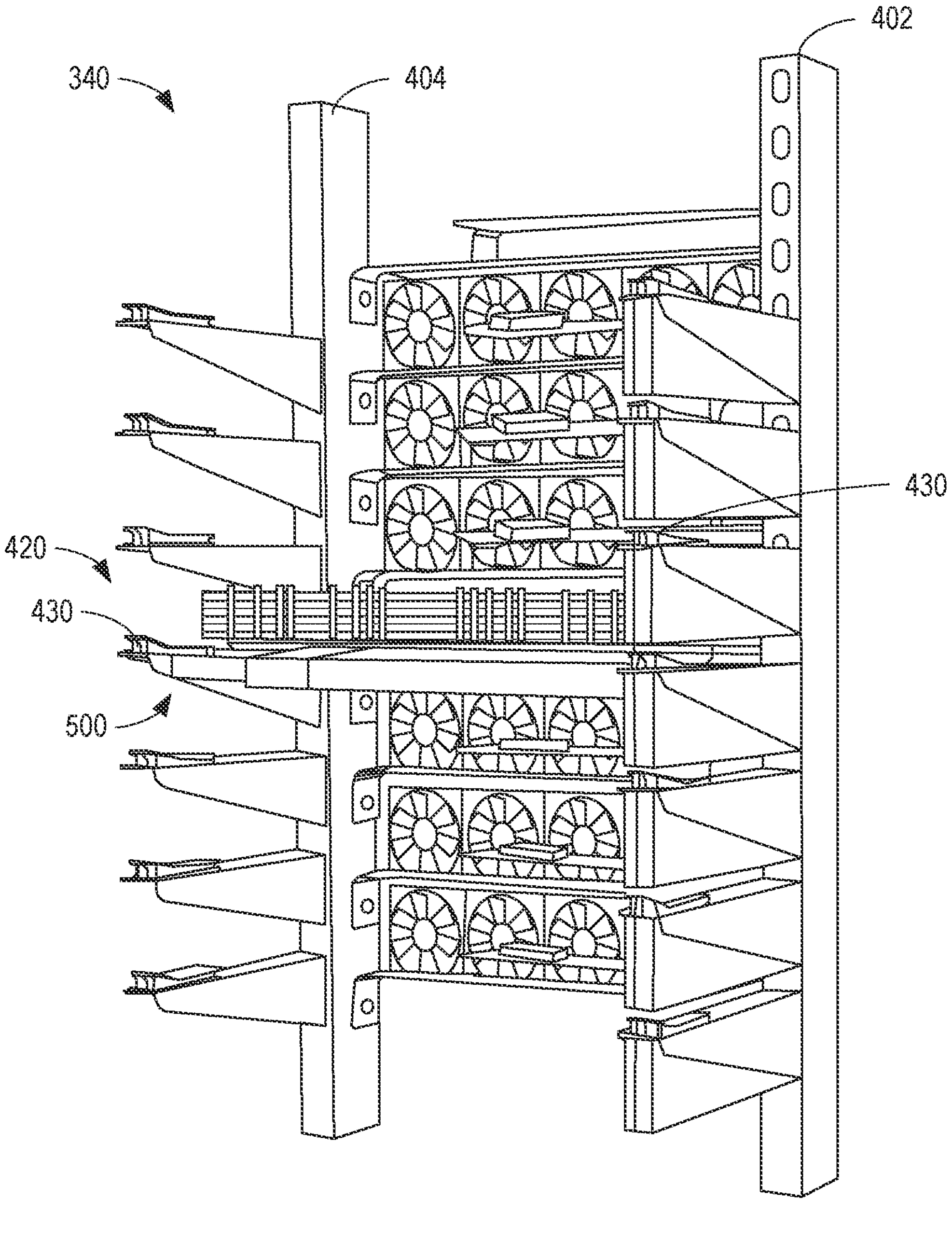
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., programmable circuitry, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1 U"). That is, the vertical distance between pairs 410 of elongated support arms 412 may be less than a standard rack unit "1 U." Additionally, due to the relative decrease in height of the sled slots 420, the overall height of the rack 340 in some examples may be shorter than the height of traditional rack enclosures.

For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1 U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
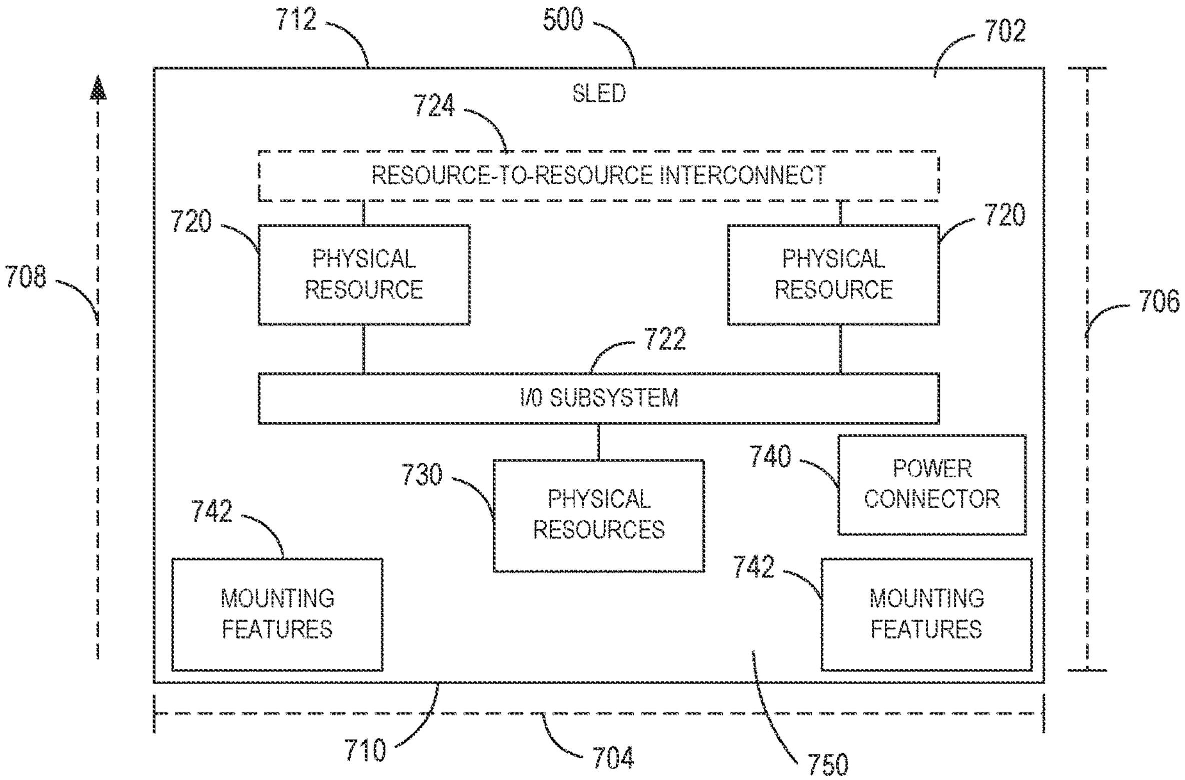
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a given sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches.

As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of programmable circuitry, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processor circuitry in examples in which the sled 500 is implemented as a compute sled, as accelerator co-processor circuitry or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The IO subsystem 722 may be implemented as circuitry and/or components to facilitate input/output operations with the physical resources 720, the physical resources 730, and/or other components of the sled 500. For example, the IO subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500.

That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of programmable circuitry 920 (see FIG. 9), and power is routed from the voltage regulators to the programmable circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 500 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
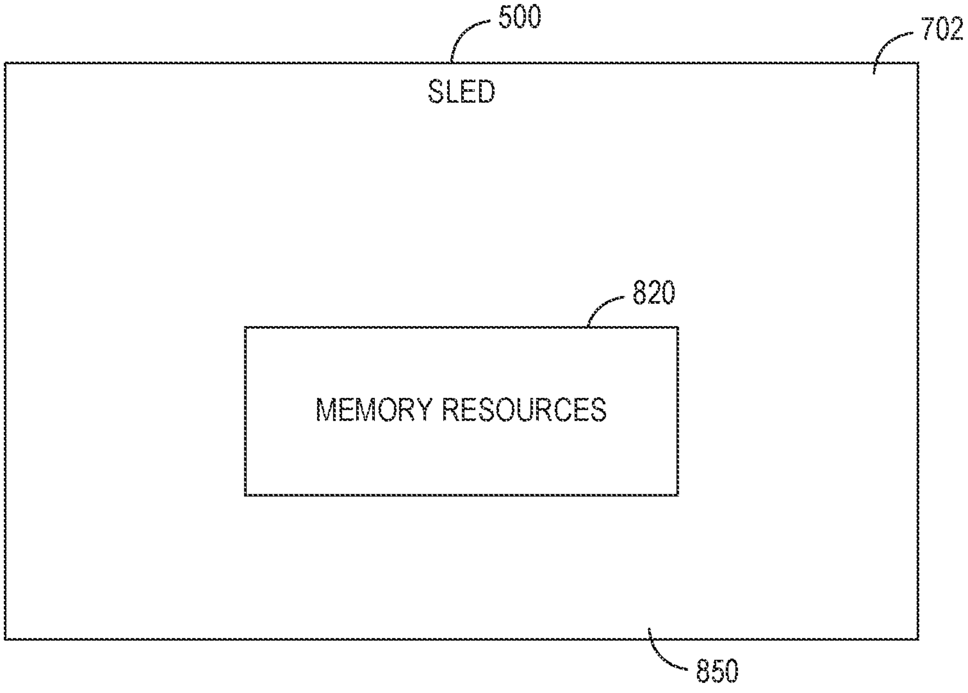
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
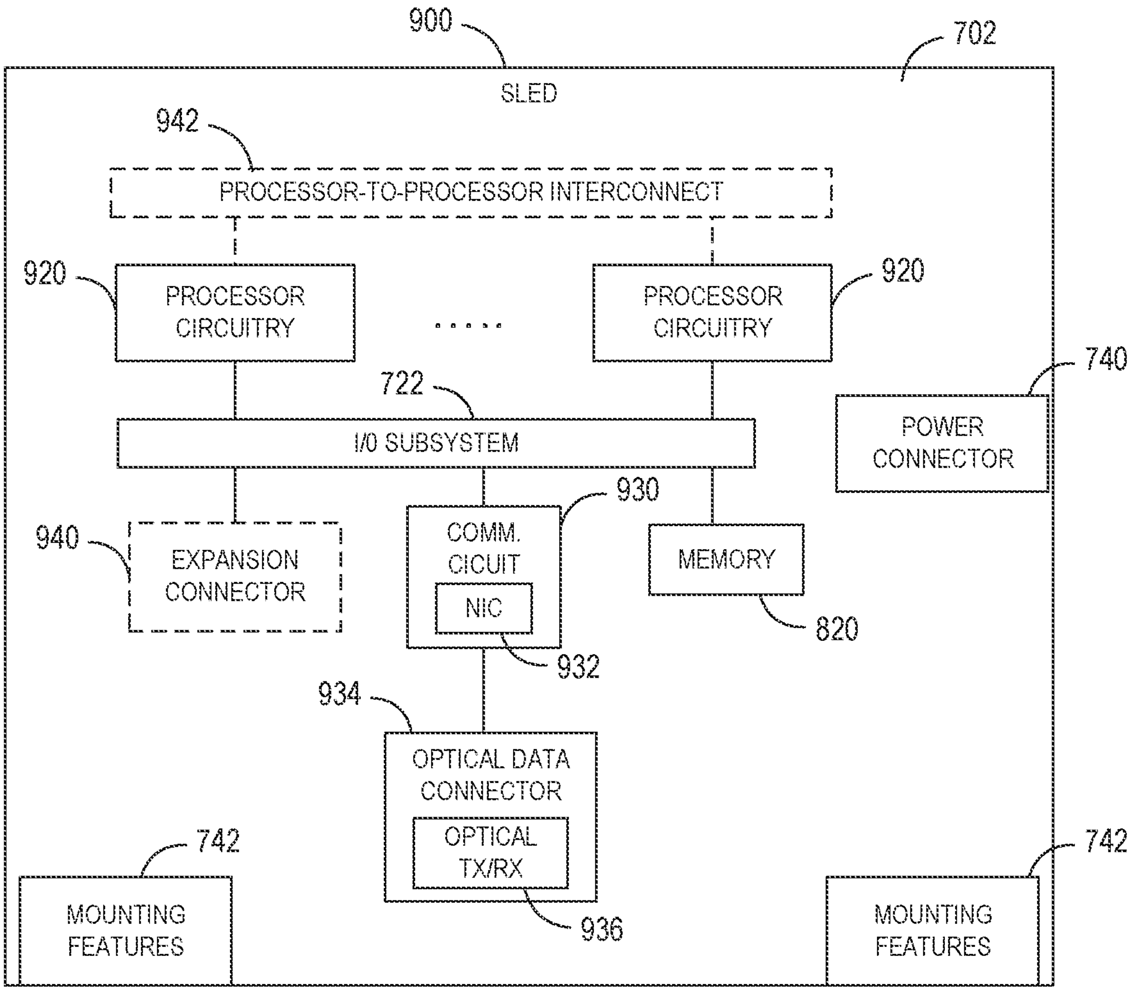
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include programmable circuitry 920. Although only two blocks of programmable circuitry 920 are shown in FIG. 9, it should be appreciated that the compute sled 900 may include additional programmable circuits 920 in other examples. Illustratively, the programmable circuitry 920 corresponds to high-performance processor circuitry 920 and may be configured to operate at a relatively high power rating. Although the high-performance programmable circuitry 920 generates additional heat operating at power ratings greater than typical processor circuitry (which operate at around 155-230 W), the enhanced thermal cooling characteristics of the chassis-less circuit board substrate 702 discussed above facilitate the higher power operation. For example, in the illustrative example, the programmable circuitry 920 is configured to operate at a power rating of at least 250 W. In some examples, the programmable circuitry 920 may be configured to operate at a power rating of at least 350 W.

In some examples, the compute sled 900 may also include a programmable circuitry-to-programmable circuitry interconnect 942. Similar to the resource-to-resource interconnect 724 of the sled 500 discussed above, the programmable circuitry-to-programmable circuitry interconnect 942 may be implemented as any type of communication interconnect capable of facilitating programmable circuitry-to-programmable circuitry interconnect 942 communications. In the illustrative example, the programmable circuitry-to-programmable circuitry interconnect 942 is implemented as a high-speed point-to-point interconnect (e.g., faster than the I/O subsystem 722). For example, the programmable circuitry-to-programmable circuitry interconnect 942 may be implemented as a QuickPath Interconnect (QPI), an UltraPath Interconnect (UPI), or other high-speed point-to-point interconnect dedicated to programmable circuitry-to-programmable circuitry communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processor circuits, or included on a multichip package that also contains one or more processor circuits. In some examples, the NIC 932 may include a local processor circuit (not shown) and/or a local memory (not shown) that are both local to the NIC 932. In such examples, the local processor circuit of the NIC 932 may be capable of performing one or more of the functions of the programmable circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the programmable circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processor circuitry, memory devices, storage devices, and/or accelerator circuits including, for example, field programmable gate arrays (FPGA), application-specific integrated circuits (ASICs), security co-processor circuits, graphics processing units (GPUs), machine learning circuits, or other specialized processor circuits, controllers, devices, and/or circuits.

Figure 10:
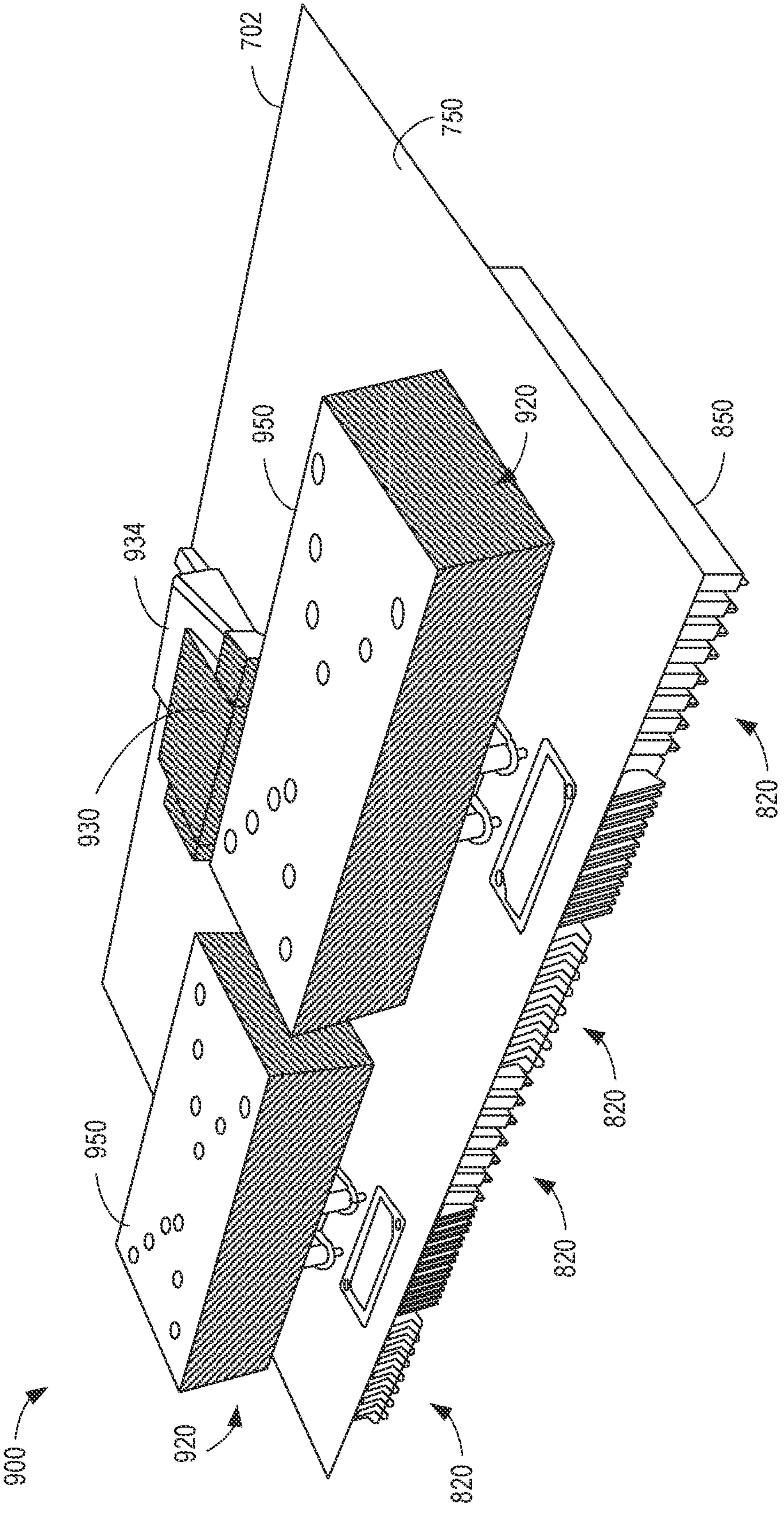
FIG. 10 is a top perspective view of at least one example of the compute sled of FIG. 9.

Referring now to FIG. 10, an illustrative example of the compute sled 900 is shown. As shown, the programmable circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor circuit socket), holders, or brackets. In some cases, some of the electrical components may be directly mounted to the chassis-less circuit board substrate 702 via soldering or similar techniques.

As discussed above, the separate programmable circuitry 920 and the communication circuit 930 are mounted to the top side 750 of the chassis-less circuit board substrate 702 such that no two heat-producing, electrical components shadow each other. In the illustrative example, the programmable circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the programmable circuitry 920 located on the top side 750 via the I/O subsystem 722. Because the chassis-less circuit board substrate 702 is implemented as a double-sided circuit board, the memory devices 820 and the programmable circuitry 920 may be communicatively coupled by one or more vias, connectors, or other mechanisms extending through the chassis-less circuit board substrate 702. Different programmable circuitry 920 (e.g., different processor circuitry) may be communicatively coupled to a different set of one or more memory devices 820 in some examples. Alternatively, in other examples, different programmable circuitry 920 (e.g., different processor circuitry) may be communicatively coupled to the same ones of the memory devices 820. In some examples, the memory devices 820 may be mounted to one or more memory mezzanines on the bottom side of the chassis-less circuit board substrate 702 and may interconnect with a corresponding programmable circuitry 920 through a ball-grid array.

Different programmable circuitry 920 (e.g., different processor circuitry) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the programmable circuitry heatsinks 950 include cooling fans attached thereto. That is, the heatsinks 950 may be fan-less heatsinks. In some examples, the heatsinks 950 mounted atop the programmable circuitry 920 may overlap with the heatsink attached to the communication circuit 930 in the direction of the airflow path 708 due to their increased size, as illustratively suggested by FIG. 10.

Figure 11:
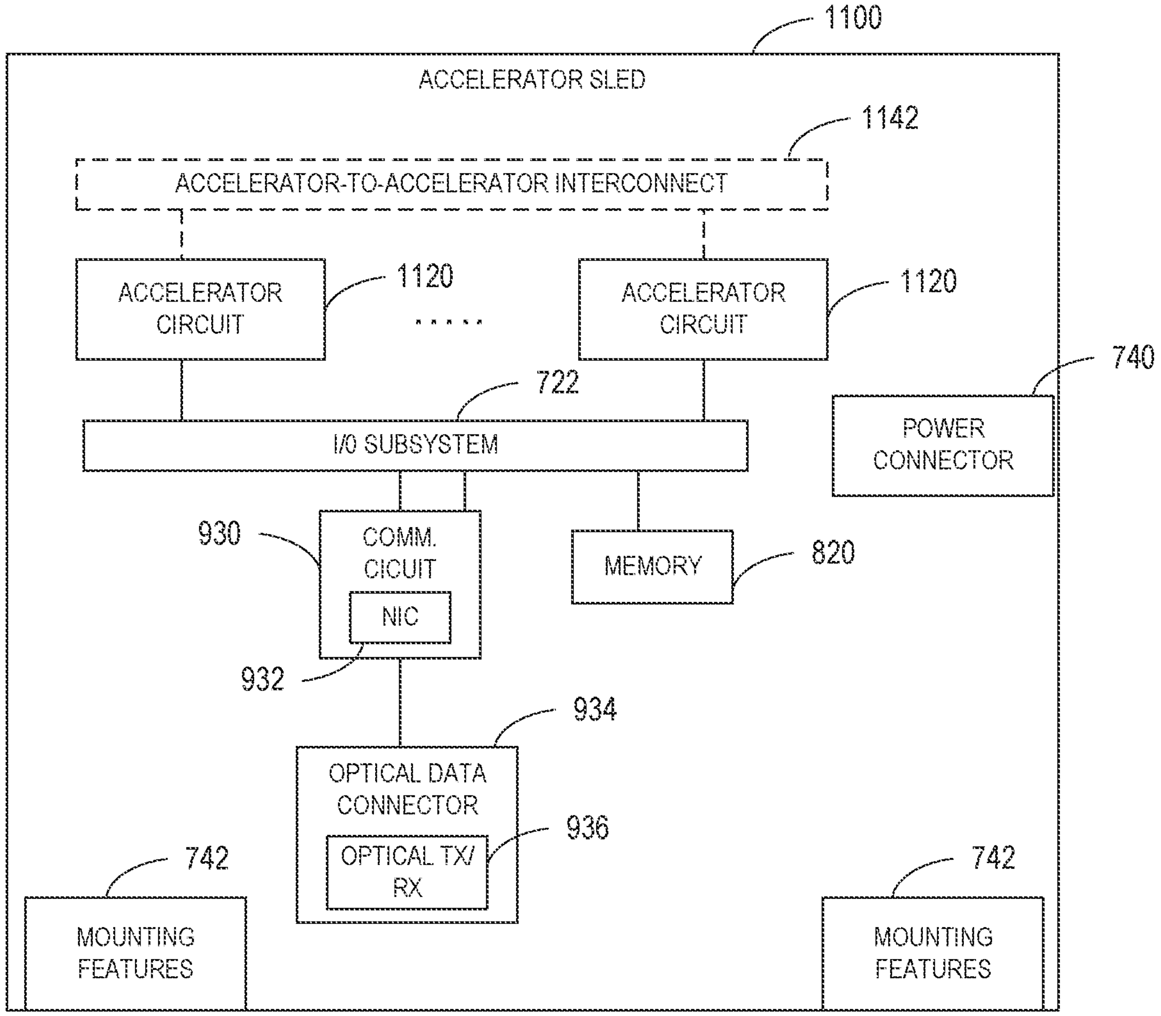
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
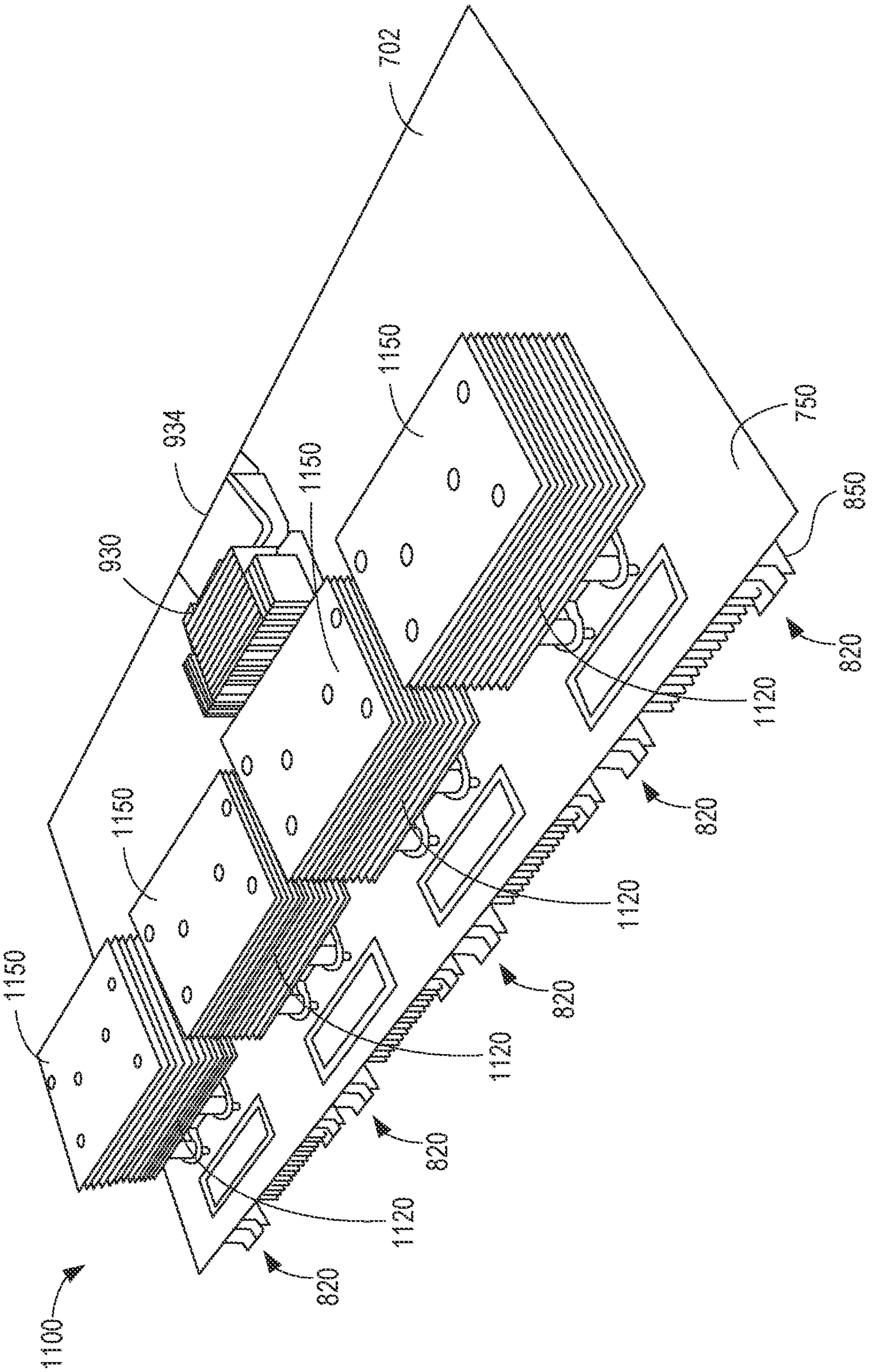
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor circuitry, co-processor circuitry, compute circuit, or other device capable of performing compute or processing operations. For example, the accelerator circuits 1120 may be implemented as, for example, field programmable gate arrays (FPGA), application-specific integrated circuits (ASICs), security co-processor circuitry, graphics processing units (GPUs), neuromorphic processor units, quantum computers, machine learning circuits, or other specialized processor circuitry, controllers, devices, and/or circuits.

In some examples, the accelerator sled 1100 may also include an accelerator-to-accelerator interconnect 1142. Similar to the resource-to-resource interconnect 724 of the sled 500 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to programmable circuitry-to-programmable circuitry communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 500. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
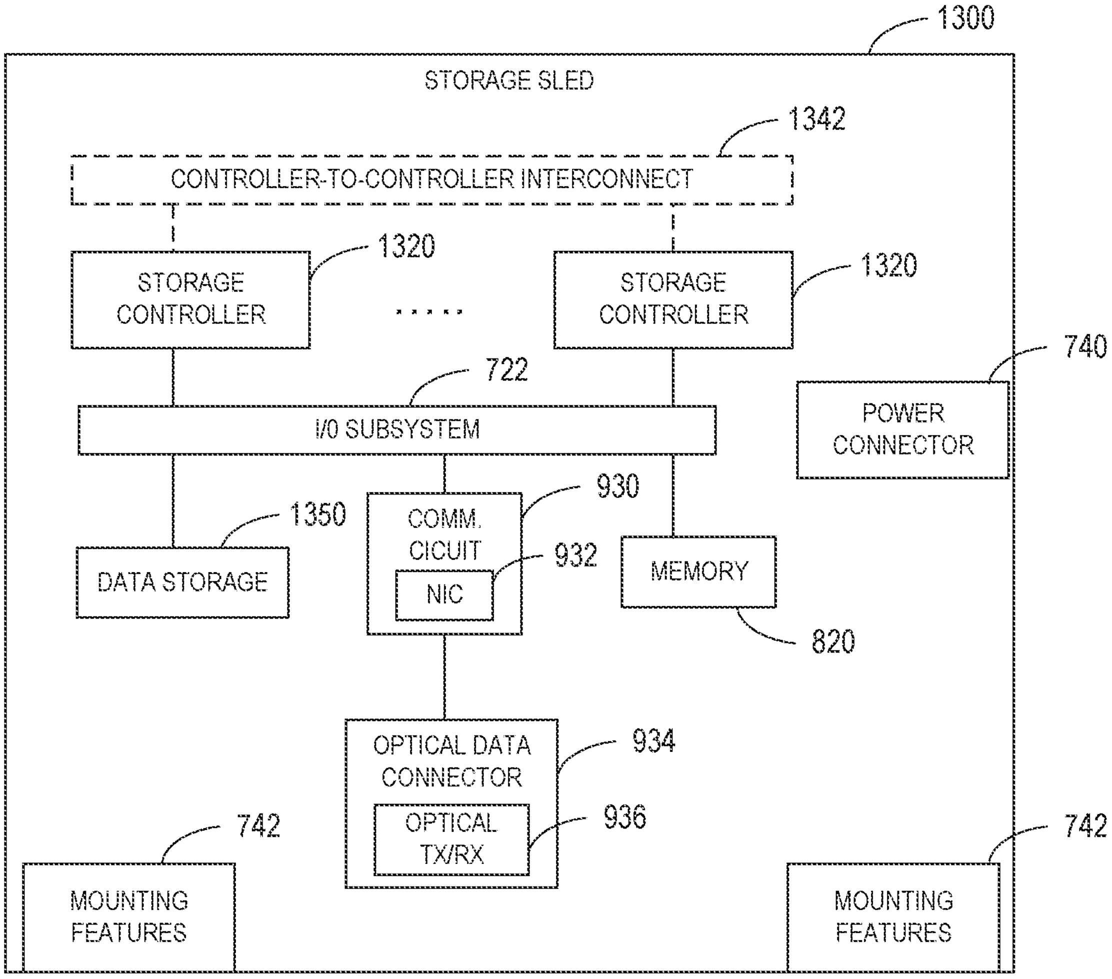
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of programmable circuitry, controller, or control circuit capable of controlling the storage and retrieval of data into the data storage 1350 based on requests received via the communication circuit 930. In the illustrative example, the storage controllers 1320 are implemented as relatively low-power programmable circuitry or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to programmable circuitry-to-programmable circuitry communications.

Figure 14:
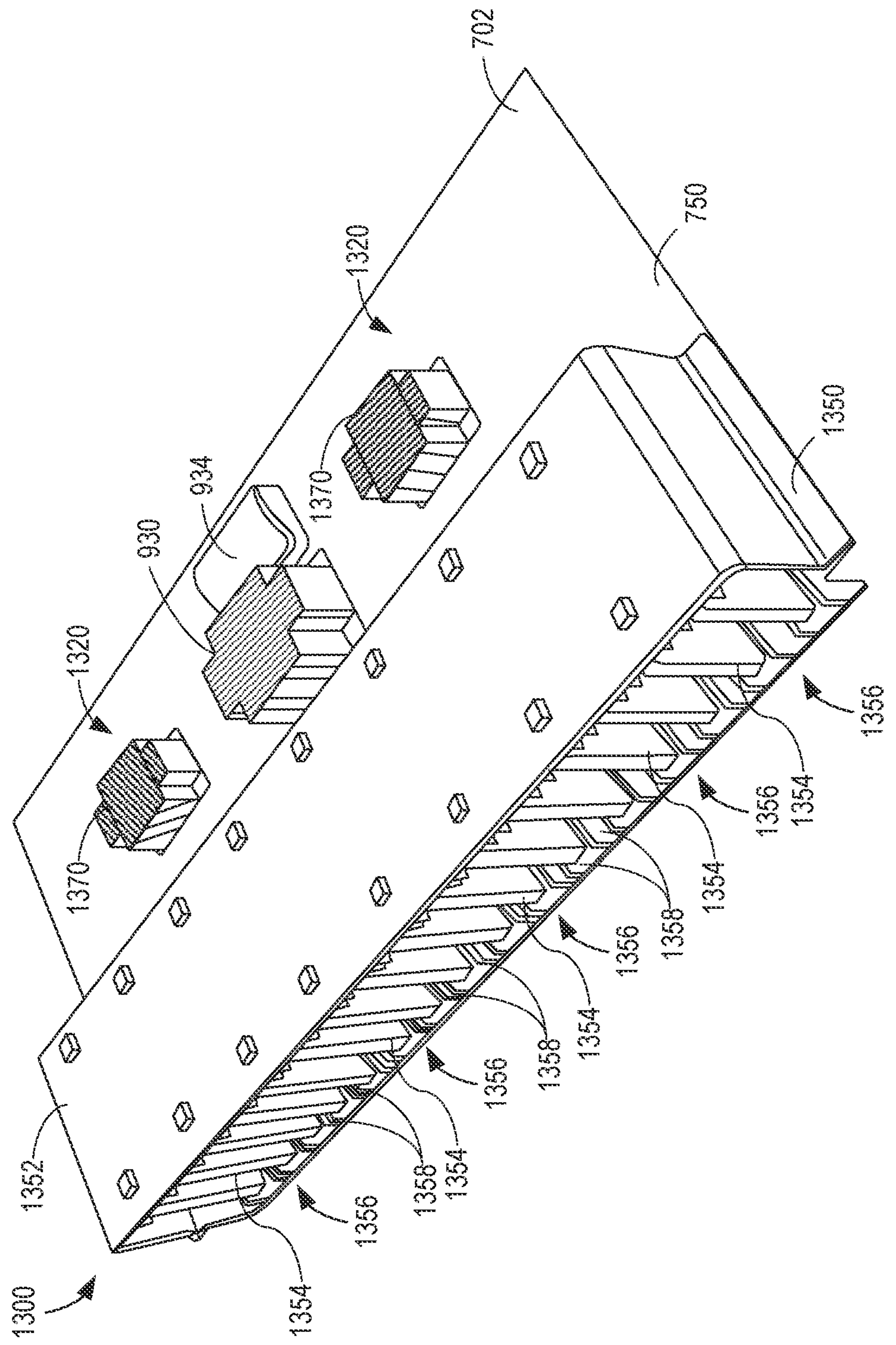
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 340. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor circuit socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
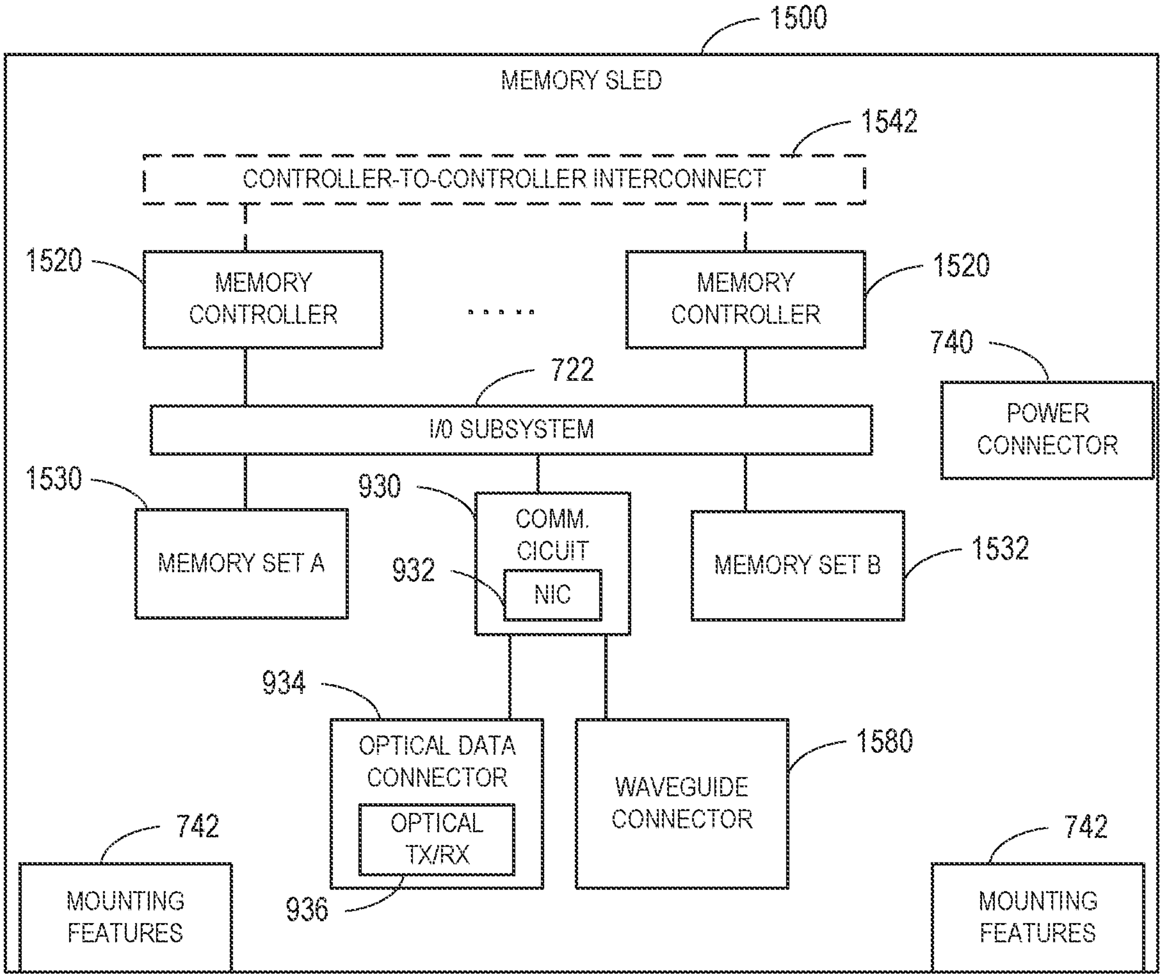
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of programmable circuitry, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to programmable circuitry-to-programmable circuitry communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
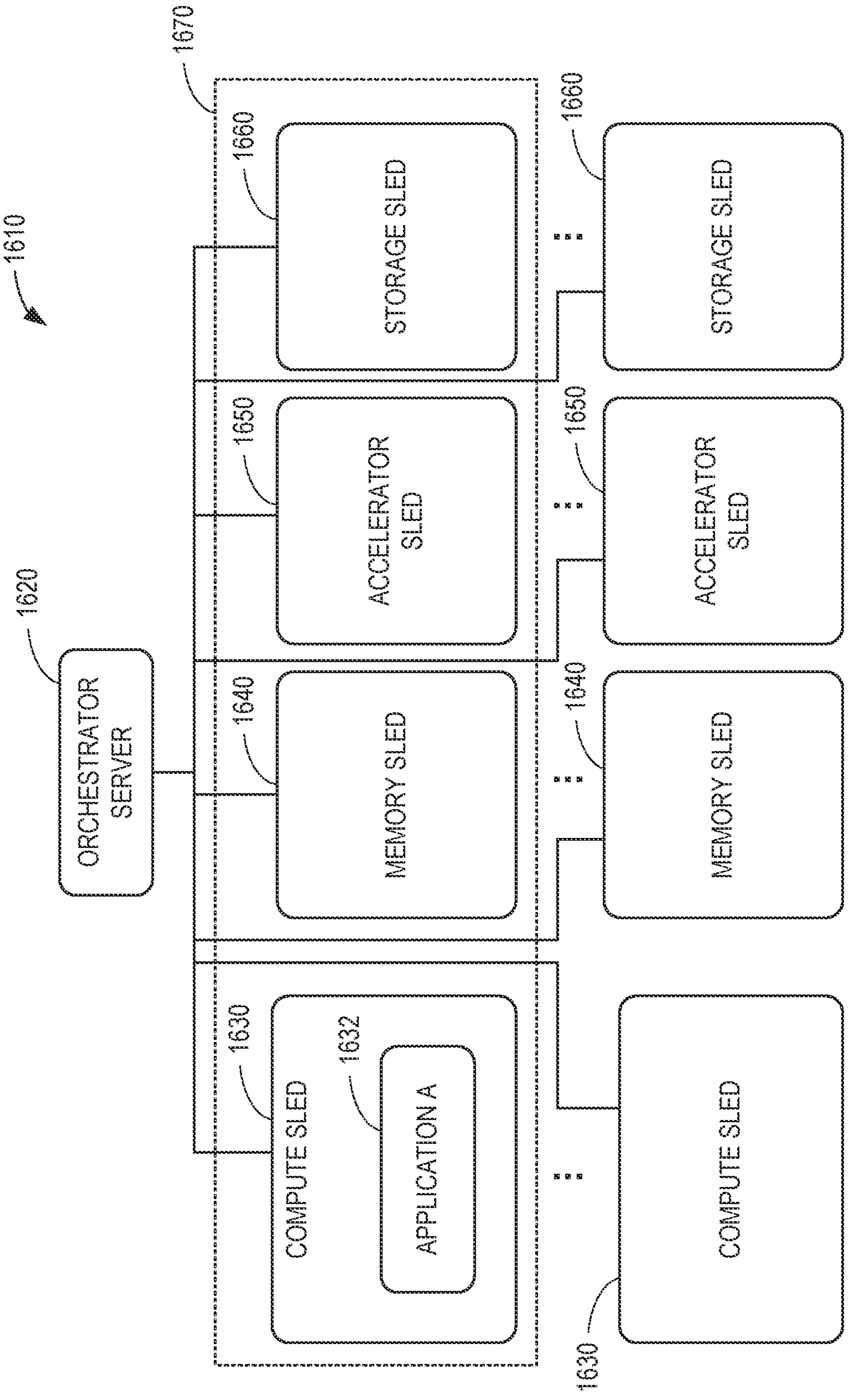
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., programmable circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1500), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as programmable circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement or objective for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of programmable circuitry or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17:
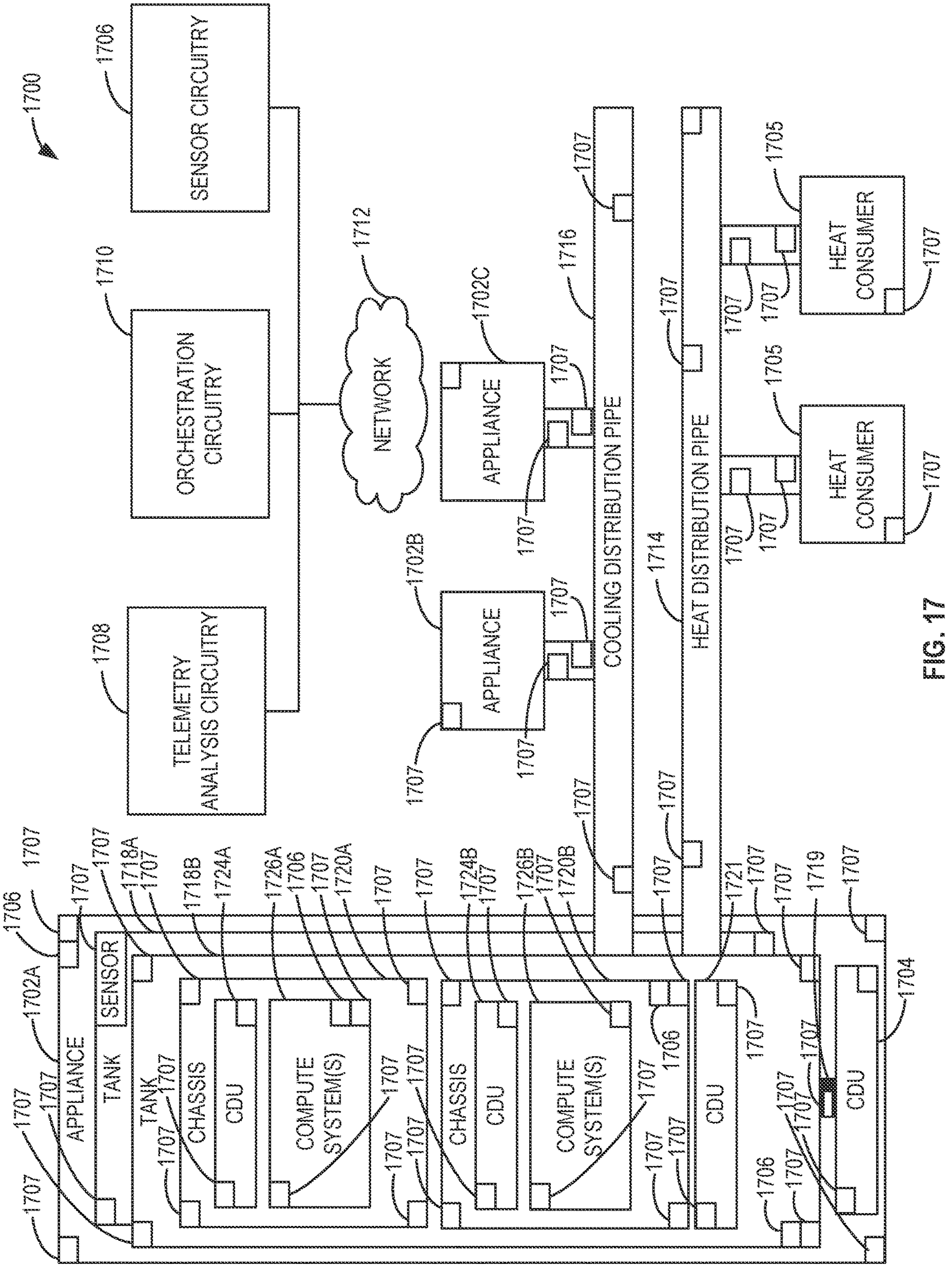
FIG. 17 is a block diagram of an example environment in which example sensors, example sensor circuitry, example telemetry analysis circuitry, and example orchestration circuitry operate to control distribution of cooling fluid and/or to manage workload(s) of electronic device(s) in the environment.

FIG. 17 is a block diagram of an example environment 1700 (e.g., an edge environment) in which examples disclosed herein may be implemented. In the illustrated example of FIG. 17, the environment 1700 includes example edge appliances 1702 including a first example edge appliance 1702A, a second example edge appliance 1702B, and a third edge appliance 1702C. The edge appliances 1702 can include one or more of the central data centers 102, one or more of the edge data centers 106, one or more of the buildings 110, one or more of the CDN data centers 116 of FIG. 1, one or more of the racks 340, etc. Although three of the edge appliances 1702 are shown in FIG. 17, the example edge environment 1700 can include additional over fewer appliances 1702.

In the illustrated example of FIG. 17, the environment 1700 includes a fluid distribution network fluidly coupled (e.g., in fluid connection, in fluid communication, etc.) to the appliances 1702 and one or more heat consumers 1705. In particular, the fluid distribution network includes one or more heat distribution pipe(s) 1714 and/or one or more cooling distribution pipe(s) 1716. The coolant distribution pipe(s) 1716 convey coolant (e.g., thermal energy transferring fluid) to the appliances 1702 to cool electronic components (e.g., compute devices) of the respective appliances 1702 to prevent, for example, the electronic components from overheating during performance of workloads. In the example of FIG. 17, the respective appliances 1702 include an appliance cooling distribution unit (CDU) 1704 to control distribution of the coolant to the electronic components of the appliances 1702 via pipes 1719 in the appliance 1702.

A temperature of the coolant provided to the respective appliances 1702 increases due to exposure of the coolant the electronic components (e.g., heat emitted by the electronic components is absorbed by the coolant as the coolant flows past the electronic components). The heated coolant is carried away from the appliances 1702 by the heat distribution pipe(s) 1714. The heated fluid can be delivered to the heat consumers 1705 for purposes of heating, for example, a building. Thus, in the example of FIG. 17, the heated coolant is re-used for purposes of heating within the environment 1700. The heat consumer(s) 1705 can include, for example, parties that purchase the heated fluid for use in heating buildings (e.g., office building, factories), government entities that purchase the heated fluid for use with public buildings and/or other public infrastructure, etc. In some example, the heated fluid is provided to, for instance, a building 110 that houses the appliance(s) 1702. The example environment 1700 can includes additional or fewer heat consumers or heat consumption points than shown in FIG. 17.

For illustrative purposes, the appliances 1702 will be discussed in connection with the example appliance 1702A with the understanding that the other appliances 1702B, 1702C could include one or more of the same or similar components as the appliance 1702A. In the illustrated example of FIG. 17, the appliance 1702A includes one or more example tank(s) 1718 (e.g., immersion tanks). While two of the tanks 1718 (e.g., a first example tank 1718A and a second example tank 1718B) are shown in the illustrated example of FIG. 17, a different number of the tanks 1718 (e.g., one tank, more than two tanks) may be included in the appliance 1702A. In some examples, one or more cold plates may be used in addition to or instead of the tank(s) 1718.

In this example, the tanks 1718 include one or more example chassis 1720 (e.g., including a first chassis 1720A and a second chassis 1720B). In some examples, the tank 1718 includes an example tank CDU 1721 to direct the coolant provided to the tank 1804 to one(s) of the chassis 1720. The CDU 1721 can be in fluid communication with the appliance CDU 1704. While two of the chassis 1720 are shown in the illustrated example of FIG. 17, a different number of the chassis 1720 (e.g., one chassis, more than two chassis) may be included in the tank 1718. In the illustrated example of FIG. 17, the chassis 1720 contain (e.g., store, house) one or more example electronic components and/or compute devices(s) 1726 of the appliance 1702. The compute device(s) 1726 (e.g., compute resources) perform or facilitate performance of workloads. The compute device(s) 1726 can include, for example, one or more example central processing units (CPUs), one or more example graphics processing units (GPUs), one or more memory chips, one or more server(s), etc. In some examples, a chassis-less sled may be used to support the compute device(s) 1726 instead of one or more of the chassis 1720 of FIG. 17. In some examples, one or more of the compute devices(s) 1726 of the appliance 1702 can be submerged and/or stored in the coolant in the tanks 1718 to facilitate cooling thereof. In the illustrated example of FIG. 17, the tanks 1718 are fluidly coupled to the fluid distribution network. For example, the appliance CDU 1704 receives and/or obtains coolant (e.g., a thermal transfer fluid) provided to the appliance 1702A via the cooling distribution pipe(s) 1716 and causes the coolant to be to and/or between one(s) of the tanks 1718.

In the illustrated example of FIG. 17, the chassis 1720 include example chassis CDUs 1724 to distribute the coolant to one(s) of the compute devices(s) 1726 (e.g., the CPU(s), the GPU(s), the memory chip(s)) and/or portions thereof. In some examples, one(s) of the chassis 1720 include one or more cold plates operatively coupled to the one(s) of the compute devices(s) 1726 and/or to one or more portions of the compute devices(s) 1726. In such examples, the chassis CDUs 1724 provide the coolant to the cold plate(s) and/or to portions of the cold plate(s) to cool the one(s) of the compute device(s) 1726. In some examples, one or more of the chassis 1720 and/or compute device(s) 1726 may be positioned in respective partitions of the tank 1718. In such examples, the partitions may include respective partition CDUs to distribute the cooling fluid to one or more example chassis 1720 and/or compute device(s) 1726 included within the corresponding partition(s).

In the illustrated example of FIG. 17, each of the chassis 1720 implements a corresponding one of the chassis CDUs 1724, each of the tanks 1718 implements a corresponding one of the tank CDUs 1721, and the appliance 1702A implements a an appliance CDU 1704. In some examples, one or more of the chassis CDUs 1724, the tank CDUs 1721, and/or the appliance CDU 1704 may be omitted. For example, one(s) of the chassis CDUs 1724 may operate across multiple ones of the chassis 1720, one(s) of the tank CDUs 1721 may operate across multiple ones of the tanks 1718, and/or one(s) of the appliance CDUs 1704 may operate across multiple ones of the appliances 1702A, 1702B, 1702C. In some examples, one or more of the chassis CDUs 1724, the tank CDUs 1721, and/or the appliance CDUs 1704 can serve any combination of the chassis 1720, the tanks 1718, and/or the appliances 1702. In some examples, at least one CDU (e.g., the CDU 1704) is implemented on the appliance 1702A, 1702B, 1702C to control fluid flow to and/or between one or more compute device(s) 1726.

In some examples, one or more tenants can operate on the edge appliance 1702. In examples disclosed herein, a "tenant" refers to one or more users having access to one or more edge devices. As used herein, an "edge device" encompasses one or more of the appliances 1702, one or more of the tanks 1718, one or more of the chassis 1720, and/or one or more of the compute device(s) 1726 of the environment 1700 of FIG. 17.

Service-level objectives (SLOs), which can be based on agreements (e.g., SLAs) between (a) the provider(s) (e.g., owner(s)) of the edge appliance(s) 1702 and/or respective component(s) thereof and (b) the respective tenants can be used to define parameters such as workload(s) to be performed by the edge devices 1702, 1718, 1720, 1726 for the tenant, available memory for tenant workload(s), speed(s) at which the workload(s) are to be performed, time(s) at which the workload(s) are to be performed, etc. In some examples, the SLOs include QoS targets. In some examples, the SLOs are indicative of a temperature at which the compute device(s) 1726 are to be maintained to facilitate performance of the workloads.

In the example of FIG. 17, a plurality of sensors 1707 are distributed in the environment 1700 to provide for detailed collection of data across the environment 1700. The sensors 1707 can include thermal sensors, density sensors, flow rate sensors, etc. to generate outputs indicative of properties of the coolant throughout the environment 1700.

In this example, the edge devices 1702, 1718, 1720, 1726 that are exposed to the coolant each include one or more of the sensors 1707. For example, the appliances 1702, the CDUs 1704, 1721, 1724, the tanks 1718, the chassis 1720, and the compute device(s) 1726 each include one or more of the sensors 1707. Further, the sensors 1707 can be associated with various locations within the edge devices 1702, 1718, 1720, 1726. In some examples, ones of the sensors 1707 may be positioned in the edge devices 1702, 1718, 1720, 1726 based on thermal activity associated with the area (e.g., where multiple processors are located and, thus, expected to output heat).

Additionally, ones of the sensors 1707 are positioned in, and/or operatively coupled to, the pipe(s) 1716 that convey the (lower temperature) fluid to the appliances 1702 and/or the tanks 1718 and the pipe(s) 1714 that carry (higher temperature) fluid to the heat consumers 1705. More generally, ones of the sensors 1707 are positioned in, and provide telemetry associated with, a certain area of, and/or position within, the environment 1700. For example, respective ones of the sensors 1707 are associated with certain positions within the pipes 1714, 1716 and certain positions within the appliances 1702 including certain positions within the CDUs 1704, 1721, 1724, certain positions within the tanks 1718, certain positions on and/or within the chassis 1720, and certain positions on and/or within the compute device(s) 1726. For example, one of the sensors 1707 positioned in, and/or operatively coupled to the heat distribution pipe 1714 can be positioned downstream of the sensor(s) 1707 in the first appliance 1702A. Such sensor(s) 1707 of the heat distribution pipe 1714 can be used to measure a temperature of the coolant exiting the first appliance 1702A before substantially flowing through the heat distribution pipe (e.g., to record an initial temperature of the heated fluid as a result of the heat dissipated by the compute device(s) 1726 into the coolant in advance of the coolant flowing through the heat distribution pipe). While a certain number of instances of the sensors 1707 is shown in FIG. 17, it should be understood that the environment 1700 may include any number of instances of the sensors 1707 (i.e., additional or fewer sensors 1707). Similarly, while the sensors 1707 are shown in certain positions in FIG. 17, it should be understood that the sensors 1707 may be placed in alternative positions based on, for instance, areas of thermal interest in the environment 1700.

The outputs of the sensors 1707 are analyzed by example sensor circuitry 1706. In some examples, the sensor circuitry 1706 is implemented at, for instance, the appliance(s) 1702, the tank(s) 1718, the chassis 1720, the CDU(s) 1704, 1721, 1724, etc. in communication with one or more of the respective sensors 1707. In some examples, each sensor 1707 includes associated sensor circuitry 1706. In some examples, two or more sensors 1707 are in communication with the sensor circuitry 1706 located at, for example, the respective appliances 1702. In some examples, the sensor circuitry 1706 is implemented by, for example, a cloud-based device, programmable circuitry of a user device, etc. and the outputs of the sensor(s) 1707 are transmitted to the sensor circuitry 1706 via a network 1712. In some examples, outputs of sensor circuitry implemented at, for example, the respective appliances 1702 are transmitted via the network 1712 to (e.g., remote) sensor circuitry 1706 that serves as a central repository. The various locations of the sensor circuitry 1706 illustrated in FIG. 17 represent possible locations and/or configurations for the sensor circuitry 1706 in the environment 1700 with the understanding that additional or alternative locations and/or configurations are possible.

The example sensor circuitry 1706 of FIG. 17 is communicatively coupled to example telemetry analysis circuitry 1708 and example orchestration circuitry 1710 via the network 1712. The telemetry analysis circuitry 1708 and the orchestration circuitry 1710 (and/or components thereof) can be implemented at one or more of the appliances 1702 (e.g., by programmable circuitry located at one or more of the appliances 1702), by cloud-based device(s), by programmable circuitry of user device(s), etc. As disclosed herein, the telemetry analysis circuitry 1708 and the orchestration circuitry 1710 use the outputs of the sensor circuitry 1706 to control cooling and/or workload activity within the environment 1700.

In the illustrated example of FIG. 17, the network 1712 is implemented as a public network such as, the Internet. However, any other type of networks (e.g., wired/cabled, wireless, mobile cellular, etc.), which may be public or private, and any combination(s) thereof may additionally and/or alternatively be used. Additionally, although the example environment 1700 utilizes the network 1712 for communications between the appliances 1702 (e.g., via the sensor circuitry 1706) and the telemetry analysis circuitry 1708 and the orchestration circuitry 1710, it should be understood that the appliances 1702 and the telemetry analysis circuitry 1708 and the orchestration circuitry 1710 can communicate using any alternative forms of communication to implement the examples disclosed herein.

In the example of FIG. 17, a location of each of the sensors 1707 is known in the environment 1700. For example, each sensor 1707 can be assigned an identifier and the sensor circuitry 1706 determines the location of the sensor 1707 based on the identifier. In the illustrated example of FIG. 17, the sensor circuitry 1706 determines properties of the coolant used to cool the edge devices 1702, 1718, 1720, 1726 in the environment 1700 based on the outputs of the sensor(s) 1707. In particular, the sensor circuitry 1706 provides granular details of the properties of the coolant distributed throughout the environment 1700 in connection with a particular location within the environment 1700 at a given time (e.g., substantially real time). As used herein "substantially real time" refers to occurrence in a near instantaneous manner recognizing there may be real world delays for computing time, transmission, etc. Thus, unless otherwise specified, "substantially real time" refers to real time+/−1 second. In some examples, the sensor circuitry 1706 determines a temperature of the coolant, a density of the coolant, chemical properties (e.g., a chemical composition) of the coolant, a pressure of the coolant, a flow rate of the coolant, and/or other properties that affect or are associated with the exchange of thermal energy between the coolant and the edge devices 1702, 1718, 1720, 1726. In some examples, the sensor circuitry 1706 determines an operating temperature of the edge devices 1702, 1718, 1720, 1726 based on outputs of the sensor(s) 1707 (e.g., the sensor(s) 1707 located at the compute device(s) 1726).

In the example of FIG. 17, the outputs or telemetry of the sensor circuitry 1706 include thermal properties of the coolant and/or the edge device(s) 1702, 1718, 1720, 1726. Additionally, the sensor circuitry 1706 can communicate a location (e.g., a geographical location, geolocations, three-dimensional coordinates, etc.) of the sensor(s) 1707 and, thus, a location of an edge device 1702, 1718, 1720, 1726 or a portion or area of the edge device 1702, 1718, 1720, 1726 associated therewith (e.g., an edge device 1702, 1718, 1720, 1726 to which a particular sensor 1707 is closest in proximity). Thus, the sensor circuitry 1706 identifies properties of the coolant relative to particular ones of the edge devices 1702, 1718, 1720, 1726 in the environment 1700 to which the coolant is exposed or expected to be exposed at a given time and/or over time.

In addition to the metric(s) associated with properties of the coolant identified by the sensor circuitry 1706 and corresponding location(s) in the environment 1700 associated with the coolant properties (e.g., as determined based on the locations of the sensor(s) 1707), telemetry or outputs of the sensor circuitry 1706 can identify owner(s) of the edge device(s) 1702, 1718, 1720, 1726 associated with the location(s) and/or one or more tenant(s) accessing and/or utilizing those edge device(s) 1702, 1718, 1720, 1726. For example, telemetry from the sensor circuitry 1706 can indicate a temperature of the coolant and/or the edge device(s) 1702, 1718, 1720, 1726 measured by the sensor(s) 1707; a position of the sensor 1707 within the environment 1700 (e.g., three-dimensional (x-y-z) coordinates based on a mapping of the environment 1700); one or more edge device(s) 1702, 1718, 1720, 1726 associated with the position of the sensors 1707, an owner of the edge device(s) 1702, 1718, 1720, 1726; and/or a tenant or user associated with the edge device(s) 1702, 1718, 1720, 1726, etc.

In the illustrated example of FIG. 17, the telemetry analysis circuitry 1708 and/or the orchestration circuitry 1710 access the sensor telemetry from the sensor circuitry 1706. In some examples, the telemetry analysis circuitry 1708 and/or the orchestration circuitry 1710 access the sensor telemetry from multiple instances of the sensor circuitry 1706 implemented in the environment 1700 such as at the edge devices 1702, 1718, 1720, 1726. In some examples, the telemetry analysis circuitry 1708 and the orchestration circuitry 1710 access the sensor telemetry from a central sensor circuitry 1706 that collects data from multiple ones of the sensor(s) 1707 and/or multiple instances of sensor circuitry 1706 in the environment 1700 (e.g., via the network 1712).

Also, in the example of FIG. 17, the telemetry analysis circuitry 1708 and/or the orchestration circuitry 1710 are in communication with the compute device(s) 1726 (and/or, in some examples, infrastructure monitoring circuitry that manages heat and/or cooling usage of the heat consumers 1705 and/or the edge devices 1702, 1718, 1720, 1726). In the example of FIG. 17, the telemetry analysis circuitry 1708 and/or the orchestration circuitry 1710 access compute performance telemetry (e.g., workload parameters) associated with compute devices 1726. The compute performance telemetry can include, for example, operational states of the compute device(s) 1726, parameters of workload(s) being performed or expected to be performed by the compute device(s) 1726, resource availability, etc. for respective ones of the compute device(s) 1726, owners, and/or tenants.

The example telemetry analysis circuitry 1708 aggregates the sensor telemetry and the compute performance telemetry to generate dynamic heatmaps that indicate temperatures within the environment 1700 and/or other coolant parameters in the environment 1700. The heatmaps generated by the telemetry analysis circuitry 1708 can also include, indicate, and/or reflect compute performance telemetry, a mapping of the edge devices 1702, 1718, 1720, 1726 in the environment 1700, and/or parameters of the SLOs associated with the compute device(s) 1726. The telemetry analysis circuitry 1708 can utilize the heatmaps to determine (e.g., measure, estimate, predict) coolant consumption within the environment 1700 by region, by time, by edge device 1702, 1718, 1720, 1726, etc. and/or available heat output for delivery to the heat consumer(s) 1705.

As used herein, a "heatmap" refers to a mapping of a metric (e.g., device temperature, coolant temperature, coolant flow rate) to a corresponding location, edge, and/or structure, which can be represented via an image (e.g., still or video) and/or numerically. For example, the heatmap may visually represent a corresponding environment (e.g., the environment 1700 of FIG. 17) and/or the heatmap may represent the locations in the environment and the data associated therewith (e.g., the sensor telemetry, compute performance telemetry, SLOs, device identifiers, etc.) numerically and/or alphanumerically, such as via a table, a graph, and/or the like.

In the illustrated example of FIG. 17, the orchestration circuitry 1710 determines a cooling strategy (e.g., a thermal management plan, a cooling program, cooling parameter(s) (e.g., coolant propert(ies) and/or coolant parameter(s); propert(ies) of workload distribution(s) and/or device operation(s); set point(s); metric(s); and/or adjustment(s) thereto)) to be implemented based on the heatmap. The orchestration circuitry 1710 is in communication with the CDUs 1704, 1721, 1721 (e.g., via the network 1712) and generates instructions to affect (e.g., control, adjust) distribution of the coolant by the CDUs 1704, 1721, 1724 to increase or decrease an amount of coolant provided to a portion of a tank 1718 or a chassis 1720 including particular compute device(s) 1726 (or portions thereof) satisfying or being within a certain range of an operating temperature threshold defined in the SLO(s) detected based on the heatmap(s), etc.

For example, the orchestration circuitry 1710 can cause the CDU(s) 1724, 1721, 1704 of the appliances 1702 to distribute cooling fluid to the one or more edge devices 1702, 1718, 1720, 1726 based on factors and/or variables such as the SLOs corresponding to the one or more tenants, the telemetry from the sensor circuitry 1706, compute performance telemetry (e.g., workload parameters), resource utilization, and/or resource availability. The SLO(s) can indicate a particular threshold (e.g., maximum) temperature of the edge device(s) 1702, 1718, 1720, 1726 corresponding to the tenants, a particular temperature or temperature range of coolant provided to the edge device(s) 1702, 1718, 1720, 1726, expected fluid properties or parameters of the coolant provided to the edge device(s) 1702, 1718, 1720, 1726 (e.g., flow rate, density), etc. In some examples, the orchestration circuitry 1710 accesses compute performance telemetry data indicative of performance conditions (e.g., throughput, latency, instructions per second, etc.) associated with the compute device(s) 1726. In some examples, the orchestration circuitry 1710 determines a utilization and/or an availability of computing resources (e.g., processing resources available, storage resources available, etc.) based on capabilities of the compute device(s) 1726 and the workloads being, or waiting to be, executed by the compute device(s) 1726. As such, the orchestration circuitry 1710 can cause devices associated with the pipe(s) 1714, 1716 (e.g., pumps, valves, etc.) and/or the CDUs 1724, 1721, 1704 within the appliances 1702 to distribute coolant to the one or more edge devices 1702, 1718, 1720, 1726 based on the SLOs corresponding to the one or more tenants, the sensor telemetry, the compute performance telemetry, the resource utilization, and/or the resource availability. In some examples, through implementation of a cooling strategy and/or cooling parameter(s), the orchestration circuitry 1710 adjusts (e.g., redistributes) workloads between the edge device(s) 1702, 1718, 1720, 1726 based on the SLOs corresponding to the one or more tenants, the sensor telemetry, the workloads, the resource utilization, and/or the resource availability. In some examples, through implementation of a cooling strategy and/or cooling parameter(s), the orchestration circuitry 1710 can cause the CDUs 1704, 1721, 1724 to target a certain portion of the compute device(s) 1726 in response to the portion satisfying or being within a certain range of a temperature threshold identified by the SLO associated with the portion of the compute device(s) 1726 and/or the workload(s) being performed by the compute device(s) 1726.

As an example, the appliance CDU 1704 can distribute the coolant to and/or between one(s) of the tanks 1718 based on a cooling strategy and/or cooling parameter(s) determined by the orchestration circuitry 1710. In some examples, the appliance CDU 1704 distributes the coolant to one(s) of the tanks 1718 via the one or more pipe(s) 1719 fluidly coupled to the tank(s) 1718. Similarly, the cooling strategy and/or cooling parameter(s) generated by the telemetry analysis circuitry 1708 may include coolant parameters associated with coolant that the appliance CDU 1704 is to bring into and/or release from the appliance 1702 to and/or from one or more of the pipe(s) 1714, 1716. As used herein, the term "coolant parameters" includes coolant properties, such as a temperature of the coolant, a density of the coolant, chemical properties of the coolant, a pressure of the coolant, a flow rate of the coolant, and/or the like.

Figure 18:
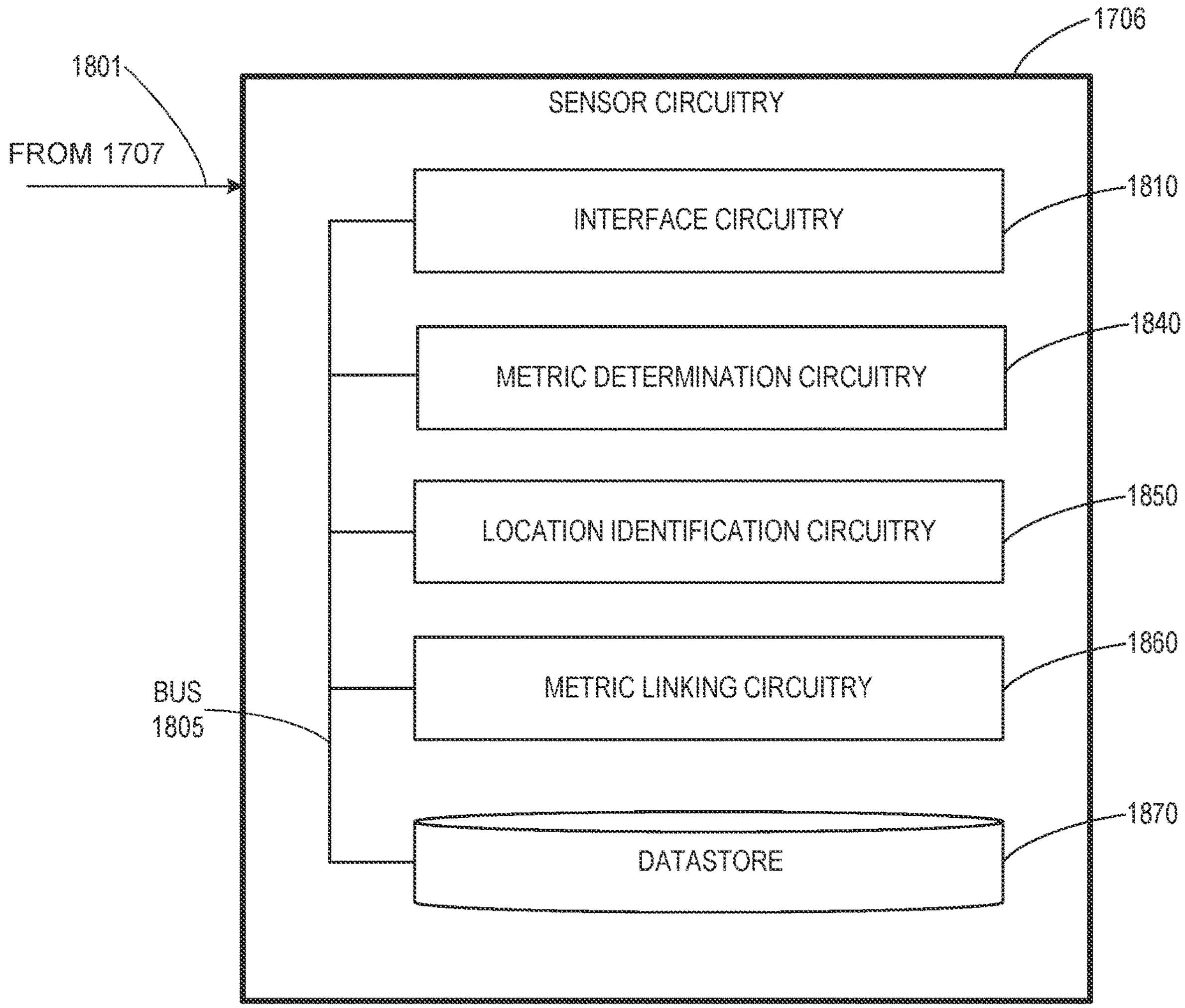
FIG. 18 is a block diagram of an example implementation of the sensor circuitry of FIG. 17.

FIG. 18 is a block diagram of an example implementation of the sensor circuitry 1706 of FIG. 17 to provide information about the coolant distributed in the environment 1700 and/or information about the edge devices 1702, 1718, 1720, 1726 that can be used by the telemetry analysis circuitry 1708 and/or the orchestration circuitry 1710 of FIG. 17 to manage, for example, distribution of the coolant and/or workloads of the compute device(s) 1726. The sensor circuitry 1706 of FIG. 18 may be instantiated (e.g., creating an instance of, bring into being for any length of time, materialize, implement, etc.) by one or more transducer(s) and programmable circuitry such as a Central Processor Unit (CPU) executing first instructions. Additionally or alternatively, the sensor circuitry 1706 of FIG. 18 may be instantiated (e.g., creating an instance of, bring into being for any length of time, materialize, implement, etc.) by one or more transducer(s) and (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 18 may, thus, be instantiated at the same or different times. Some or all of the circuitry of FIG. 18 may be instantiated, for example, in one or more threads executing concurrently on hardware and/or in series on hardware. Moreover, in some examples, some or all of the circuitry of FIG. 18 may be implemented by microprocessor circuitry executing instructions and/or FPGA circuitry performing operations to implement one or more virtual machines and/or containers.

In the illustrated example of FIG. 18, the sensor circuitry 1706 includes an example bus 1805, example interface circuitry 1810, example metric determination circuitry 1840, example location identification circuitry 1850, example metric linking circuitry 1860, and an example datastore 1870. In the illustrated example of FIG. 18, the interface circuitry 1810, the metric determination circuitry 1840, the location identification circuitry 1850, the metric linking circuitry 1860, and the datastore 1870 are in communication via the bus 1805. The bus 1805 can correspond to, be representative of, and/or otherwise implement at least one of an Inter-Integrated Circuit (I2C) bus, a Serial Peripheral Interface (SPI) bus, a PCI bus, or a PCIe bus.

The interface circuitry 1810 provides for interfaces between (a) the sensor circuitry 1706 and the sensors 1707, (b) the sensor circuitry 1706 and the telemetry analysis circuitry 1708, and/or (c) the sensor circuitry 1706 and the orchestration circuitry 1710. The interface circuitry 1810 can be implemented by a communication device (e.g., a network interface card (NIC), a smart NIC, an Infrastructure Processing Unit (IPU), etc.) such as a transmitter, a receiver, a transceiver, a modem, a residential gateway, a wireless access point, and/or a network interface to facilitate exchange of data with external machines (e.g., computing devices of any kind). For example, the interface circuitry 1810 can be implemented by any type of interface standard, such as a wireless fidelity (Wi-Fi) interface, an Ethernet interface, a universal serial bus (USB), a Bluetooth interface, a near field communication (NFC) interface, a Peripheral Component Interconnect (PCI) interface, a Peripheral Component Interconnect express (PCI-e or PCIe) interface, and/or other types of interface standards.

The example interface circuitry 1810 facilitates access by the sensor circuitry 1706 to the outputs of the sensors 1707. The interface circuitry 1810 facilitates transmission of data generated by the sensor circuitry 1706 (e.g., sensor telemetry) to the telemetry analysis circuitry 1708 and/or the orchestration circuitry 1710. In some examples, the interface circuitry 1810 receives information from the telemetry analysis circuitry 1708, such as location information and/or related edge device 1702, 1718, 1720, 1726, owner, and/or tenant information. The example interface circuitry 1810 exchanges information with the telemetry analysis circuitry 1708 and/or the orchestration circuitry 1710 via the network 1712 of FIG. 17.

As represented by arrow 1801 in FIG. 18, the sensor circuitry 1706 accesses outputs (e.g., electrical signals) of the sensors 1707 indicative of, for example, a temperature of the coolant and/or the edge devices 1702, 1718, 1720, 1726, a density of the coolant, chemical properties (e.g., a chemical composition) of the coolant, a pressure of the coolant, a flow rate of the coolant, operating temperature(s) of the compute device(s) 1726, and/or other properties that affect the exchange of thermal energy between the coolant and the edge devices 1702, 1718, 1720, 1726.

The sensor circuitry 1706 of the illustrated example includes the metric determination circuitry 1840 to process the electrical signal(s) output by the sensors 1707 and determine corresponding metric(s). For example, the metric determination circuitry 1840 can determine a temperature value, a chemical composition, a pressure value, a density, a flow rate, and/or other properties measured by the sensors 1707 at a given time and/or over time. In some examples, the metric determination circuitry 1840 is instantiated by programmable circuitry executing metric determination instructions and/or configured to perform operations such as those represented by the flowchart of FIG. 24.

The sensor circuitry 1706 of the illustrated example includes the location identification circuitry 1850 to identify respective locations associated with the sensor 1707 from which the outputs are obtained. For example, the location identification circuitry 1850 can identify three-dimensional coordinates representative of a position of the sensor 1707 in the environment 1700. In some examples, the location identification circuitry 1850 receives and identifies a nearby location indicator, such as a radio-frequency identification tag associated with a location in the environment. In some examples, the location identification circuitry 1850 includes a global positioning system (GPS), a position sensor, and/or an altitude sensor that provide location information. In some examples, the location identification circuitry 1850 identifies a predetermined location of the sensor 1707 based on data (e.g., user defined mapping data, data received from the telemetry analysis circuitry 1708) stored in the datastore 1870. In some examples, the location identification circuitry 1850 is instantiated by programmable circuitry executing location identification instructions and/or configured to perform operations such as those represented by the flowchart of FIG. 24.

The sensor circuitry 1706 includes metric linking circuitry 1860 to link or otherwise generate correlation(s) or mapping(s) between the determined metric, the identified location, an edge device 1702, 1718, 1720, 1726 associated with the location, an owner associated with the edge device 1702, 1718, 1720, 1726, and/or a tenant associated with the edge device 1702, 1718, 1720, 1726. For example, the metric linking circuitry 1860 can identify the edge device 1702, 1718, 1720, 1726, the owner, and/or the tenant based on data (e.g., user-defined tenant/owner data, data received from the telemetry analysis circuitry 1708) stored in the datastore 1870. In some examples, the metric linking circuitry 1860 identifies the edge device 1702, 1718, 1720, 1726, the owner, and/or the tenant based on the identified location. In the illustrated example of FIG. 17, the metric linking circuitry 1860 causes the interface circuitry 1810 to transmit information indicative of the linked metric, location, edge device 1702, 1718, 1720, 1726, owner, and/or tenant to the telemetry analysis circuitry 1708 and/or the orchestration circuitry 1710. In some examples, the metric linking circuitry 1860 is instantiated by programmable circuitry executing metric linking instructions and/or configured to perform operations such as those represented by the flowchart of FIG. 24.

In some examples, the sensor circuitry 1706 includes means for locating the sensors 1707. For example, the means for locating may be implemented by the location identification circuitry 1850. In some examples, the location identification circuitry 1850 may be instantiated by programmable circuitry such as the example programmable circuitry 2812 of FIG. 28. For instance, the location identification circuitry 1850 may be instantiated by the example microprocessor 3100 of FIG. 31 executing machine executable instructions such as those implemented by at least block 2404 of FIG. 24. In some examples, the location identification circuitry 1850 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the location identification circuitry 1850 may be instantiated by any other combination of hardware, software, and/or firmware. For example, the location identification circuitry 1850 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the sensor circuitry 1706 includes means for linking data with one or more associated structure(s), (e.g., the pipe(s) 1714, 1716), edge device(s) 1702, 1718, 1720, 1726, owner(s), and/or tenant(s)). For example, the means for linking may be implemented by metric linking circuitry 1860. In some examples, the metric linking circuitry 1860 may be instantiated by programmable circuitry such as the example programmable circuitry 2812 of FIG. 28. For instance, the metric linking circuitry 1860 may be instantiated by the example microprocessor 3100 of FIG. 31 executing machine executable instructions such as those implemented by at least block 2406 of FIG. 24. In some examples, the metric linking circuitry 1860 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the metric linking circuitry 1860 may be instantiated by any other combination of hardware, software, and/or firmware. For example, the metric linking circuitry 1860 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the sensor circuitry 1706 includes means for determining metrics. For example, the means for determining metrics may be implemented by metric determination circuitry 1840. In some examples, the metric determination circuitry 1840 may be instantiated by programmable circuitry such as the example programmable circuitry 2812 of FIG. 28. For instance, the metric determination circuitry 1840 may be instantiated by the example microprocessor 3100 of FIG. 31 executing machine executable instructions such as those implemented by at least block 2408 of FIG. 24. In some examples, the metric determination circuitry 1840 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the metric determination circuitry 1840 may be instantiated by any other combination of hardware, software, and/or firmware. For example, the metric determination circuitry 1840 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the sensor circuitry 1706 includes means for transmitting sensor telemetry. For example, the means for transmitting may be implemented by the interface circuitry 1810. In some examples, the interface circuitry 1810 may be instantiated by programmable circuitry such as the example programmable circuitry 2812 of FIG. 28. For instance, the interface circuitry 1810 may be instantiated by the example microprocessor 3100 of FIG. 31 executing machine executable instructions such as those implemented by at least block 2410 of FIG. 24. In some examples, the interface circuitry 1810 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the interface circuitry 1810 may be instantiated by any other combination of hardware, software, and/or firmware. For example, the interface circuitry 1810 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

While an example manner of implementing the sensor circuitry 1706 of FIG. 17 is illustrated in FIG. 18, one or more of the elements, processes, and/or devices illustrated in FIG. 18 may be combined, divided, re-arranged, omitted, eliminated, and/or implemented in any other way. Further, the bus 1805, the example interface circuitry 1810, the example metric determination circuitry 1840, the example location identification circuitry 1850, the example metric linking circuitry 1860, the example datastore 1870, and/or, more generally, the example sensor circuitry 1706 FIG. 17, may be implemented by hardware alone or by hardware in combination with software and/or firmware. Thus, for example, any of the example interface circuitry 1810, the example metric determination circuitry 1840, the example location identification circuitry 1850, the example metric linking circuitry 1860, the example datastore 1870, and/or, more generally, the example sensor circuitry 1706, could be implemented by one or more transducer(s) and/or programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example sensor circuitry 1706 of FIG. 17 may include one or more elements, processes, and/or devices in addition to, or instead of, those illustrated in FIG. 18, and/or may include more than one of any or all of the illustrated elements, processes and devices.

Figure 19:
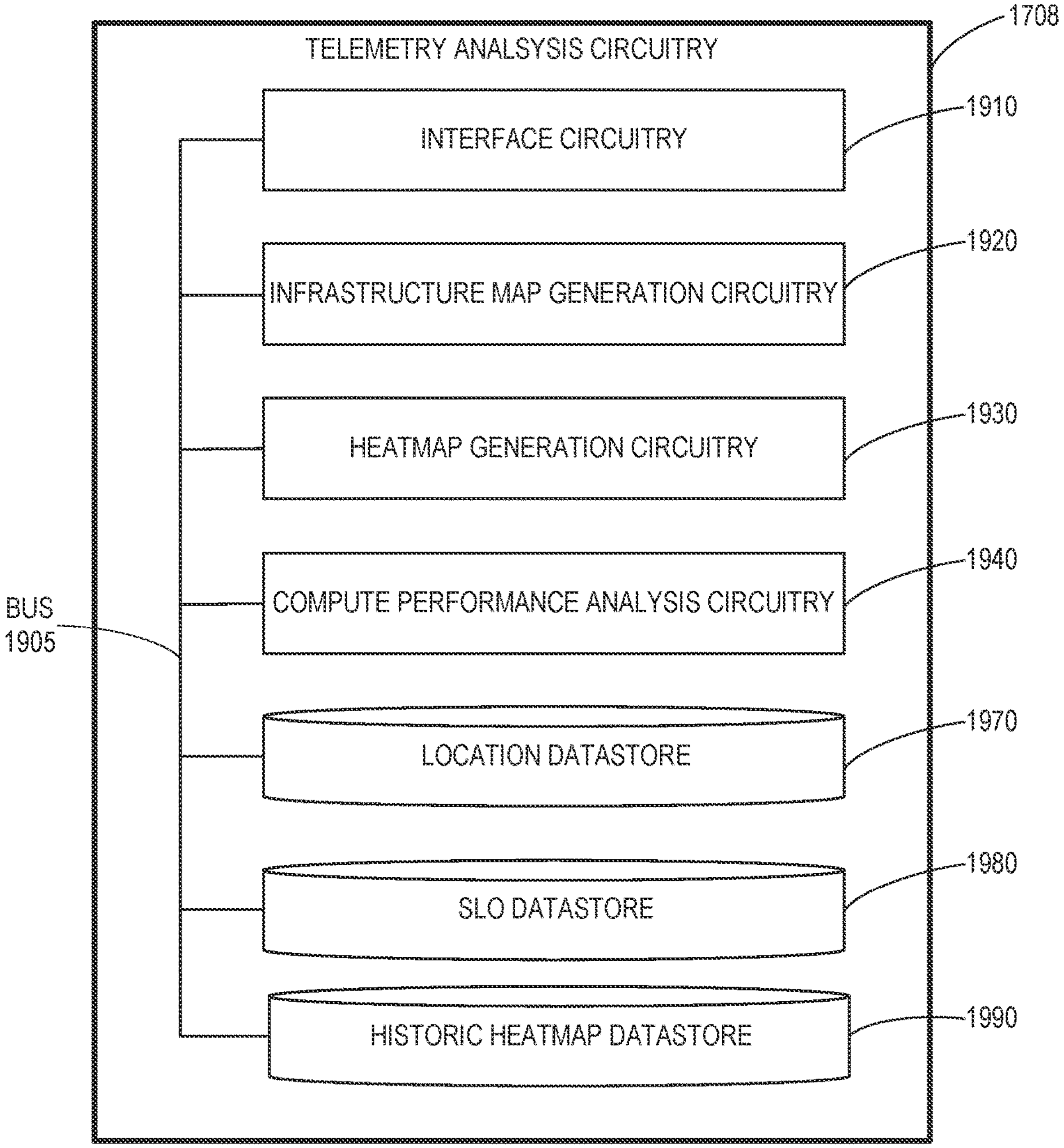
FIG. 19 is a block diagram of an example implementation of the telemetry analysis circuitry of FIG. 17.

FIG. 19 is a block diagram of an example implementation of the telemetry analysis circuitry 1708 of FIG. 17 to monitor and/or control cooling of electronic components (e.g., the edge devices 1702, 1718, 1720, 1726) in the example environment 1700 of FIG. 17. The telemetry analysis circuitry 1708 of FIG. 19 may be instantiated (e.g., creating an instance of, bring into being for any length of time, materialize, implement, etc.) by programmable circuitry such as a Central Processor Unit (CPU) executing first instructions. Additionally or alternatively, the telemetry analysis circuitry 1708 of FIG. 19 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 19 may, thus, be instantiated at the same or different times. Some or all of the circuitry of FIG. 19 may be instantiated, for example, in one or more threads executing concurrently on hardware and/or in series on hardware. Moreover, in some examples, some or all of the circuitry of FIG. 19 may be implemented by microprocessor circuitry executing instructions and/or FPGA circuitry performing operations to implement one or more virtual machines and/or containers.

In the illustrated example of FIG. 19, the telemetry analysis circuitry 1708 includes an example bus 1905, example interface circuitry 1910, example infrastructure map generation circuitry 1920, example heatmap generation circuitry 1930, example compute performance analysis circuitry 1940, an example location datastore 1970, an example SLO datastore 1980, and/or an example historic heatmap datastore 1990. In the illustrated example of FIG. 19, the interface circuitry 1910, the infrastructure map generation circuitry 1920, the heatmap generation circuitry 1930, the compute performance analysis circuitry 1940, the location datastore 1970, the SLO datastore 1980, and/or the historic heatmap datastore 1990 are in communication via the bus 1905.

In the illustrated example of FIG. 19, the interface circuitry 1910 provides for interfaces between (a) the telemetry analysis circuitry 1708 and the sensor circuitry 1706, (b) the telemetry analysis circuitry 1708 and the orchestration circuitry 1710, and/or (c) the telemetry analysis circuitry 1708 and the compute device(s) 1726. For example, the interface circuitry 1910 can be implemented by a communication device (e.g., a network interface card (NIC), a smart NIC, an Infrastructure Processing Unit (IPU), etc.) such as a transmitter, a receiver, a transceiver, a modem, a residential gateway, a wireless access point, and/or a network interface to facilitate exchange of data with external machines (e.g., computing devices of any kind). For example, the interface circuitry 1910 can be implemented by any type of interface standard, such as a Wi-Fi interface, an Ethernet interface, a USB, a Bluetooth interface, an NFC interface, a PCI interface, and/or a PCI-e or PCIe interface, and/or any other standard.

The example interface circuitry 1910 receives or accesses sensor telemetry transmitted by the example sensor circuitry 1706 of FIGS. 17 and/or 18. In some examples, the interface circuitry 1910 transmits information to the sensor circuitry 1706, such as location information, related edge device information, related owner information, and/or related tenant information for the edge device(s) 1702, 1718, 1720, 1726 stored in the location datastore 1970. The interface circuitry 1910 can transmit the information in response to, for example, requests from the sensor circuitry 1706, periodically, or based on some other schedule. In some examples, the interface circuitry 1910 transmits information associated with analysis of the sensor telemetry to the orchestration circuitry 1710 of FIG. 17. In some examples, the interface circuitry 1910 transmits information to and/or receives information from the CDUs 1704, 1721, 1724 and/or the compute device(s) 1726 of FIG. 17. In some examples, the example interface circuitry 1910 exchanges information with the sensor circuitry 1706, the orchestration circuitry 1710, the CDUs 1704, 1721, 1724, and/or the compute device(s) 1726 via the network 1712 of FIG. 17.

The telemetry analysis circuitry 1708 of the illustrated example includes the infrastructure map generation circuitry 1920 to generate map(s) corresponding to a layout of the environment 1700 of FIG. 17. For example, the infrastructure map generation circuitry 1920 can generate map(s) indicative of locations of the edge devices 1702, 1718, 1720, 1726 and the pipe(s) 1714, 1716, 1719 that convey the coolant between the edge devices 1702, 1718, 1720, 1726 in the environment 1700. In some examples, the infrastructure map generation circuitry 1920 can identify a spatial boundary based on coordinates spanning the three-dimensional planes within the boundary. For example, the spatial boundar(ies) can correspond to the boundary of one or more of the edge device(s) 1702, 1718, 1720, 1726, the heat consumers 1705, and/or the pipe(s) 1714, 1716, 1719. Additionally or alternatively, the boundary can be representative of a boundary of the environment 1700 (e.g., a boundary of the environment monitored by the sensor circuitry 1706, the telemetry analysis circuitry 1708, and the orchestration circuitry 1710).

In some examples, the infrastructure map generation circuitry 1920 generates one or more three-dimensional coordinate systems and identifies the locations of the edge devices 1702, 1718, 1720, 1726 and the pipe(s) 1714, 1716, 1719 within the coordinate system(s). In some examples, the infrastructure map generation circuitry 1920 generates coordinate systems for each of the appliances 1702 and/or the network of pipe(s) 1714, 1716, 1719. In such examples, the infrastructure map generation circuitry 1920 associates an identifier indicative of, for instance, the respective appliance 1702 or the pipe(s) 1714, 1716, 1719 (e.g., portions thereof within the environment 1700) with the three-dimensional coordinates. Similarly, the infrastructure map generation circuitry 1920 can generate three-dimensional coordinate systems and identifiers for the edge devices 1718, 1720, 1726 within the appliance 1702, such as the tanks 1718, the chassis 1720, the CDU 1724 of the chassis 1720, and/or the electronic component(s) and/or compute devices 1726 supported by the chassis 1720. In some examples, the infrastructure map generation circuitry 1920 identifies reference points for the spatial boundaries based on location(s) of an edge device 1702, 1718, 1720, 1726 or a related structure (e.g., the pipe(s) 1714, 1716, 1719) that conveys the coolant. In such examples, the infrastructure map generation circuitry 1920 can set the reference point as a particular location on (e.g., a corner of, an end of, a midpoint of, etc.) the appliance 1702, the tank 1718, the chassis 1720, the CDU 1724, the electrical component(s) 1726, and/or the pipe(s) 1714, 1716. For example, the infrastructure map generation circuitry 1920 can associate the reference point (e.g., a corner) of the first tank 1718A with the coordinate (Tank-1,0,0,0) where "Tank-1" is the coordinate system identifier and (0,0,0) are Cartesian coordinates along an x-axis, a y-axis, and a z-axis, respectively.

In the illustrated example of FIG. 19, the infrastructure map generation circuitry 1920 identifies the locations of the edge devices 1702, 1718, 1720, 1726 and the pipe(s) 1714, 1716, 1719 within the coordinate system(s). As such, the infrastructure map generation circuitry 1920 generates one or more maps representative of the environment 1700. In some examples, the infrastructure map generation circuitry 1920 identifies the locations of the locations of the edge devices 1702, 1718, 1720, 1726 and the pipe(s) 1714, 1716, 1719 based on the sensor telemetry. For example, the infrastructure map generation circuitry 1920 can identify an area occupied by the edge devices 1702, 1718, 1720, 1726 and the pipe(s) 1714, 1716, 1719 based on the location information in the sensor telemetry and the edge device 1702, 1718, 1720, 1726 or the pipe 1714, 1716, 1719 identified by the sensor telemetry. In some examples, the infrastructure map generation circuitry 1920 identifies an area occupied by the edge devices 1702, 1718, 1720, 1726 and/or the pipe(s) 1714, 1716, 1719 in the coordinate system(s) based on an input (e.g., user input) received by the interface circuitry 1910. In some examples, the infrastructure map generation circuitry 1920 identifies an area occupied by the edge devices 1702, 1718, 1720, 1726 and/or the pipe(s) 1714, 1716, 1719 based on data (e.g., user defined data) stored in the location datastore 1970. In some examples, the infrastructure map generation circuitry 1920 is instantiated by programmable circuitry executing infrastructure map instructions and/or configured to perform operations such as those represented by the flowchart(s) of FIGS. 25 and/or 26.

The telemetry analysis circuitry 1708 of the illustrated example includes the heatmap generation circuitry 1930 to generate maps based on or representative of the metrics received in the sensor telemetry for the environment 1700. For example, the heatmap generation circuitry 1930 can access the sensor telemetry output by the sensor circuitry 1706 via the interface circuitry 1910. The heatmap generation circuitry 1930 can map the metric(s) to a location associated with the sensor using, for example, the location data generated by the infrastructure map generation circuitry 1920. In some examples, the sensor telemetry includes three-dimensional coordinates (e.g., indicative of a location of a sensor 1707 that provided the output corresponding to the metric). The heatmap generation circuitry 1930 can associate the metric with a specific position in the map generated by the infrastructure map generation circuitry 1920 (e.g., coolant temperature at a particular location). In some examples, the heatmap generation circuitry 1930 identifies a location associated with the particular metric based on data stored in the location datastore 1970. For example, the sensor telemetry can include an identification value associated with the respective sensor 1707 from which the metric was generated, and the heatmap generation circuitry 1930 can perform a look-up of the identification value in the location datastore 1970, which maps sensor identification values to associated locations. The example heatmap generation circuitry 1930 generates heatmaps associated with metrics communicated by the sensor telemetry. In some examples, heatmap generation circuitry 1930 incorporates parameters associated with the SLAs of the respective edge device(s) 1702, 1718, 1720, 1726 in the corresponding area of the generated heatmap(s). In some examples, the heatmap generation circuitry 1930 is instantiated by programmable circuitry executing infrastructure map instructions and/or configured to perform operations such as those represented by the flowchart(s) of FIGS. 25 and/or 26.

Figure 20A:
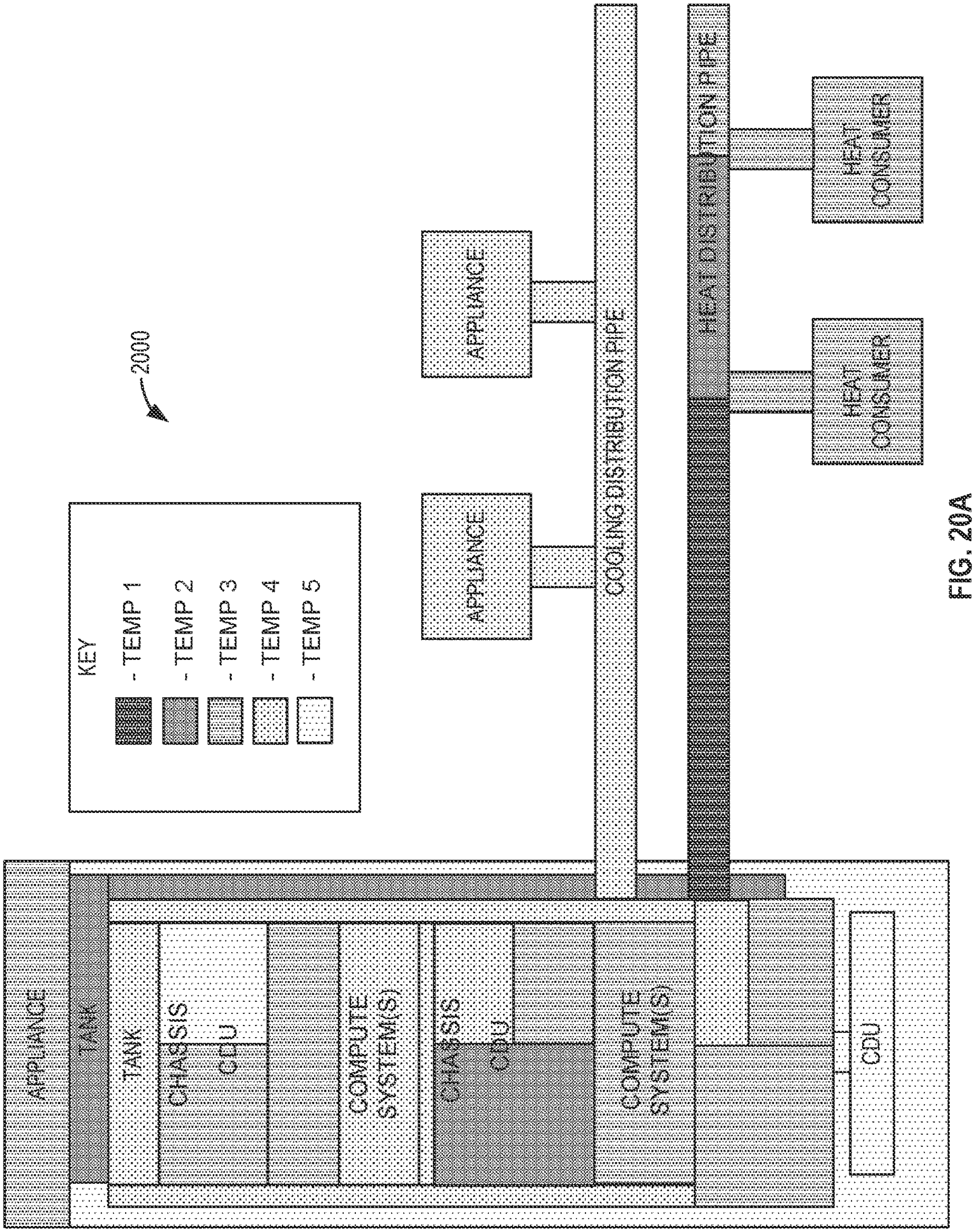
FIGS. 20A-20C illustrate example heatmaps generated by the example telemetry analysis circuitry of FIG. 17 for the example environment of FIG. 17 and/or components thereof.
Figure 20B:
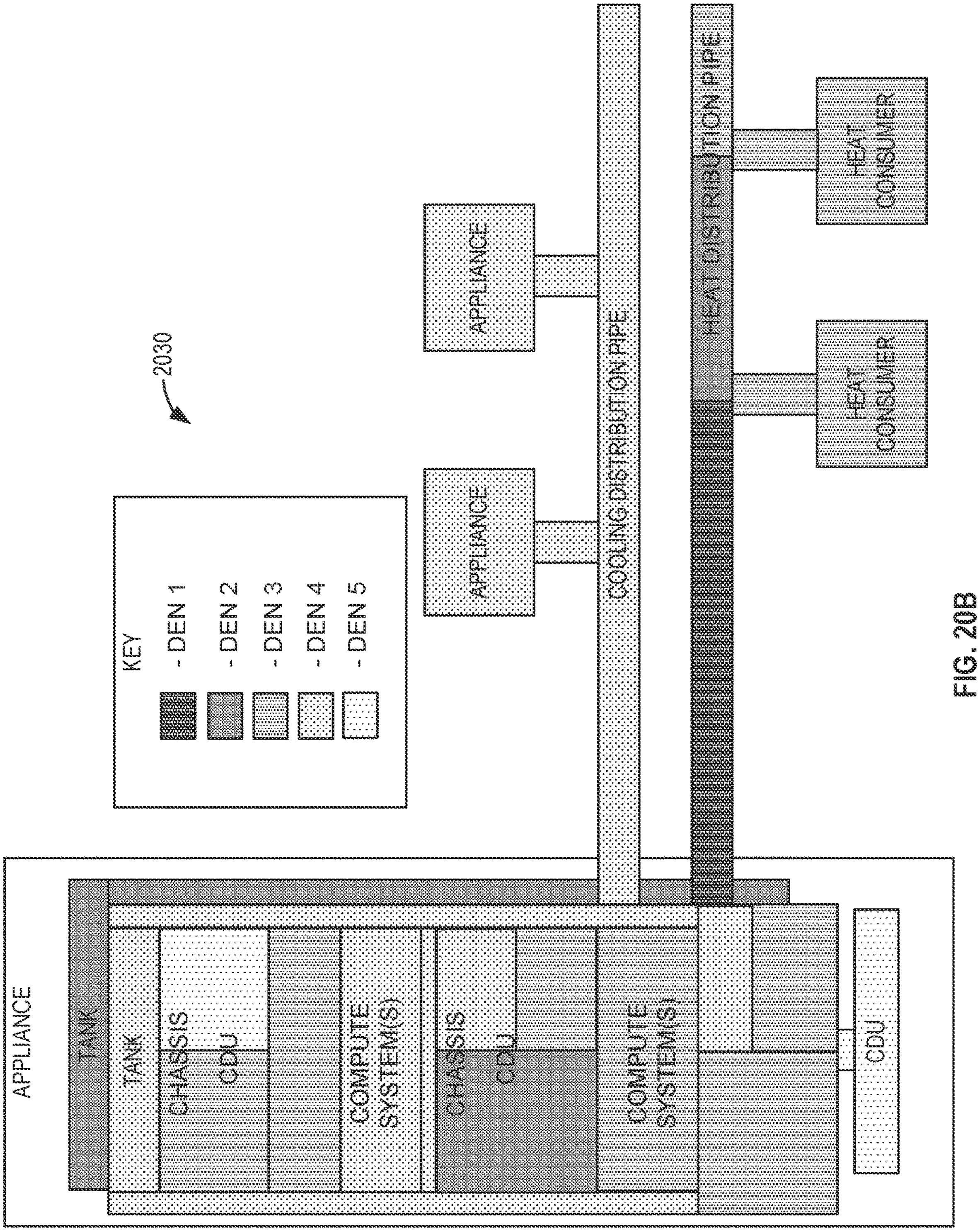
Figure 20C:
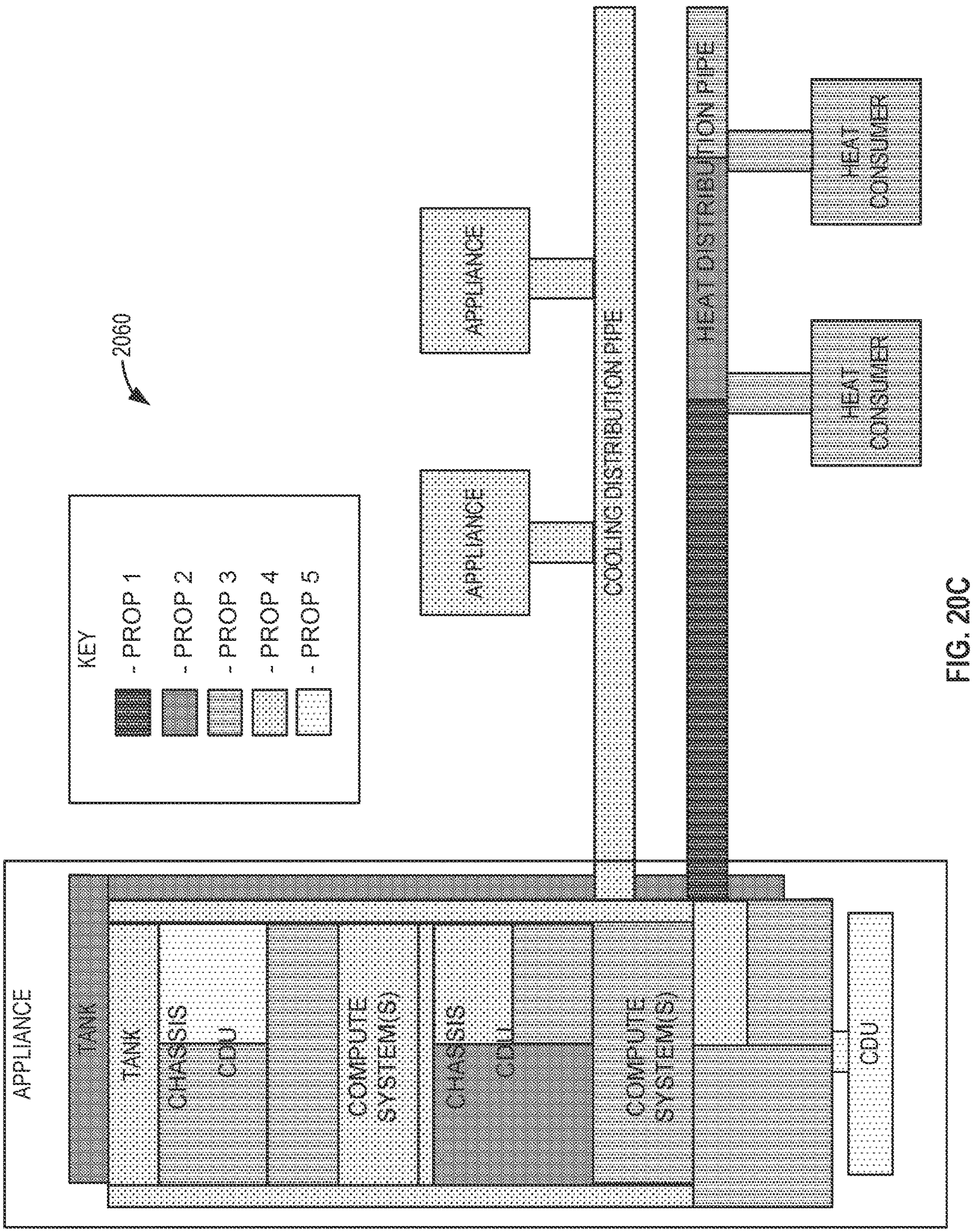

Turning to FIGS. 20A-20C, FIG. 20A illustrates a first example heatmap 2000 generated by the heatmap generation circuitry 1930 representative of temperatures of the coolant across the environment 1700 of FIG. 17. Alternatively, the first example heatmap 2000 could represent operating temperatures of the edge device(s) 1702, 1718, 1720, 1726. FIG. 20B illustrates a second example heatmap 2030 generated by the heatmap generation circuitry 1930 representative of a density of the coolant in the environment 1700 of FIG. 17. FIG. 20C illustrates a third example heatmap 2060 generated by the heatmap generation circuitry 1930 representative of chemical properties (e.g., different chemical concentrations, different chemical compounds, etc.) of the coolant in the environment 1700 of FIG. 17. Although for illustrative purposes, the locations of the respective edge devices 1702, 1718, 1720, 1726 are not shown in FIGS. 20A-20C, the heatmap generation circuitry 1930 includes information identifying locations of the respective edge devices 1702, 1718, 1720, 1726 in the environment 1700 in the heatmaps 2000, 2030, 2060. Additionally, heatmap generation circuitry 1930 can generate heatmaps for different properties than those shown in FIGS. 20A-20C (e.g., other properties that can affect the thermal energy exchange between the edge devices 1702, 1718, 1720, 1726 and the coolant and/or cooling behavior in the environment 1700).

Although the heatmaps 2000, 2030, 2060 of FIGS. 20A-20C represent multiple portions of the environment 1700 (e.g., the appliances 1702, the pipes 1714, 1716), the heatmap generation circuitry 1930 can also generate heatmaps for particular portions of the environment 1700 (e.g., the appliance 1702A to show granular details of thermal activity for that appliance). In some examples, the heatmap generation circuitry 1930 includes information representative of compute performance telemetry and/or SLAs associated with the edge devices 1702, 1718, 1720, 1726 in the heatmap. In some examples, the heatmap generation circuitry 1930 indicates a flow rate and/or direction of the coolant in the heatmap(s).

Returning again to FIG. 19, the telemetry analysis circuitry 1708 includes compute performance analysis circuitry 1940 to analyze compute performance telemetry associated with the compute device(s) 1726 of FIG. 17. In some examples, the compute performance analysis circuitry 1940 accesses compute performance telemetry and, service level agreements, and/or service level objectives associated with the compute device(s) 1726 and/or the workload(s) to be performed by the compute device(s) 1726 via the interface circuitry 1910 and the SLO datastore 1980, respectively. In some examples, the compute performance analysis circuitry 1940 flags an area in the heatmap in which the property associated with the coolant does not satisfy a threshold associated with at least one of the compute performance telemetry and/or the service level objective of the compute device(s) 1726 in the area and/or associated with the workload(s) being, or to be, performed by the compute device(s) 1726. In such examples, the compute performance analysis circuitry 1940 transmits a signal indicative of the flagged area and/or edge devices 1702, 1718, 1720, 1726 in the flagged area to the orchestration circuitry 1710. In some examples, the compute performance analysis circuitry 1940 is instantiated by programmable circuitry executing compute performance analysis instructions and/or configured to perform operations such as those represented by the flowchart(s) of FIGS. 25 and/or 26.

In some examples, the telemetry analysis circuitry 1708 includes means for generating an edge environment map. For example, the means for generating the edge environment map may be implemented by infrastructure map generation circuitry 1920. In some examples, infrastructure map generation circuitry 1920 may be instantiated by programmable circuitry such as the example programmable circuitry 2912 of FIG. 29. For instance, the infrastructure map generation circuitry 1920 may be instantiated by the example microprocessor 3100 of FIG. 31 executing machine executable instructions such as those implemented by at least blocks 2502, 2504 of FIG. 25. In some examples, the infrastructure map generation circuitry 1920 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the infrastructure map generation circuitry 1920 may be instantiated by any other combination of hardware, software, and/or firmware. For example, the infrastructure map generation circuitry 1920 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the telemetry analysis circuitry 1708 includes means for analyzing data associated with the compute device(s) 1726. For example, the means for analyzing may be implemented by compute performance analysis circuitry 1940. In some examples, the compute performance analysis circuitry 1940 may be instantiated by programmable circuitry such as the example programmable circuitry 2912 of FIG. 29. For instance, the compute performance analysis circuitry 1940 may be instantiated by the example microprocessor 3100 of FIG. 31 executing machine executable instructions such as those implemented by at least blocks 2506, 2608, of FIGS. 25 and/or 26. In some examples, the compute performance analysis circuitry 1940 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the compute performance analysis circuitry 1940 may be instantiated by any other combination of hardware, software, and/or firmware. For example, the compute performance analysis circuitry 1940 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the telemetry analysis circuitry 1708 includes means for generating heatmap(s). For example, the means for generating the heatmap(s) may be implemented by heatmap generation circuitry 1930. In some examples, the heatmap generation circuitry 1930 may be instantiated by programmable circuitry such as the example programmable circuitry 2912 of FIG. 29. For instance, the heatmap generation circuitry 1930 may be instantiated by the example microprocessor 3100 of FIG. 31 executing machine executable instructions such as those implemented by at least blocks 2514, 2602, 2604, 2606, 2608, 2610 of FIGS. 25 and/or 26. In some examples, the heatmap generation circuitry 1930 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the heatmap generation circuitry 1930 may be instantiated by any other combination of hardware, software, and/or firmware. For example, the heatmap generation circuitry 1930 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the telemetry analysis circuitry 1708 includes means for transmitting instructions. For example, the means for transmitting may be implemented by interface circuitry 1910. In some examples, the interface circuitry 1910 may be instantiated by programmable circuitry such as the example programmable circuitry 2912 of FIG. 29. For instance, the interface circuitry 1910 may be instantiated by the example microprocessor 3100 of FIG. 31 executing machine executable instructions such as those implemented by at least block 2514 of FIG. 25. In some examples, the interface circuitry 1910 may be instantiated by hardware logic circuitry, which may be implemented by an ASIC, XPU, or the FPGA circuitry 33200 of FIG. 32 configured and/or structured to perform operations corresponding to the machine readable instructions. Additionally or alternatively, the interface circuitry 1910 may be instantiated by any other combination of hardware, software, and/or firmware. For example, the interface circuitry 1910 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

While an example manner of implementing the telemetry analysis circuitry 1708 of FIG. 17 is illustrated in FIG. 19, one or more of the elements, processes, and/or devices illustrated in FIG. 19 may be combined, divided, re-arranged, omitted, eliminated, and/or implemented in any other way. Further, the interface circuitry 1910, the infrastructure map generation circuitry 1920, the heatmap generation circuitry 1930, the compute performance analysis circuitry 1940, the location datastore 1970, the SLO datastore 1980, the historic heatmap datastore 1990, and/or, more generally, the example telemetry analysis circuitry 1708 of FIG. 19, may be implemented by hardware alone or by hardware in combination with software and/or firmware. Thus, for example, any of the interface circuitry 1910, the infrastructure map generation circuitry 1920, the heatmap generation circuitry 1930, the compute performance analysis circuitry 1940, the location datastore 1970, the SLO datastore 1980, the historic heatmap datastore 1990, and/or, more generally, the example telemetry analysis circuitry 1708, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example telemetry analysis circuitry 1708 of FIG. 19 may include one or more elements, processes, and/or devices in addition to, or instead of, those illustrated in FIG. telemetry analysis circuitry 1708, and/or may include more than one of any or all of the illustrated elements, processes and devices.

Figure 21:
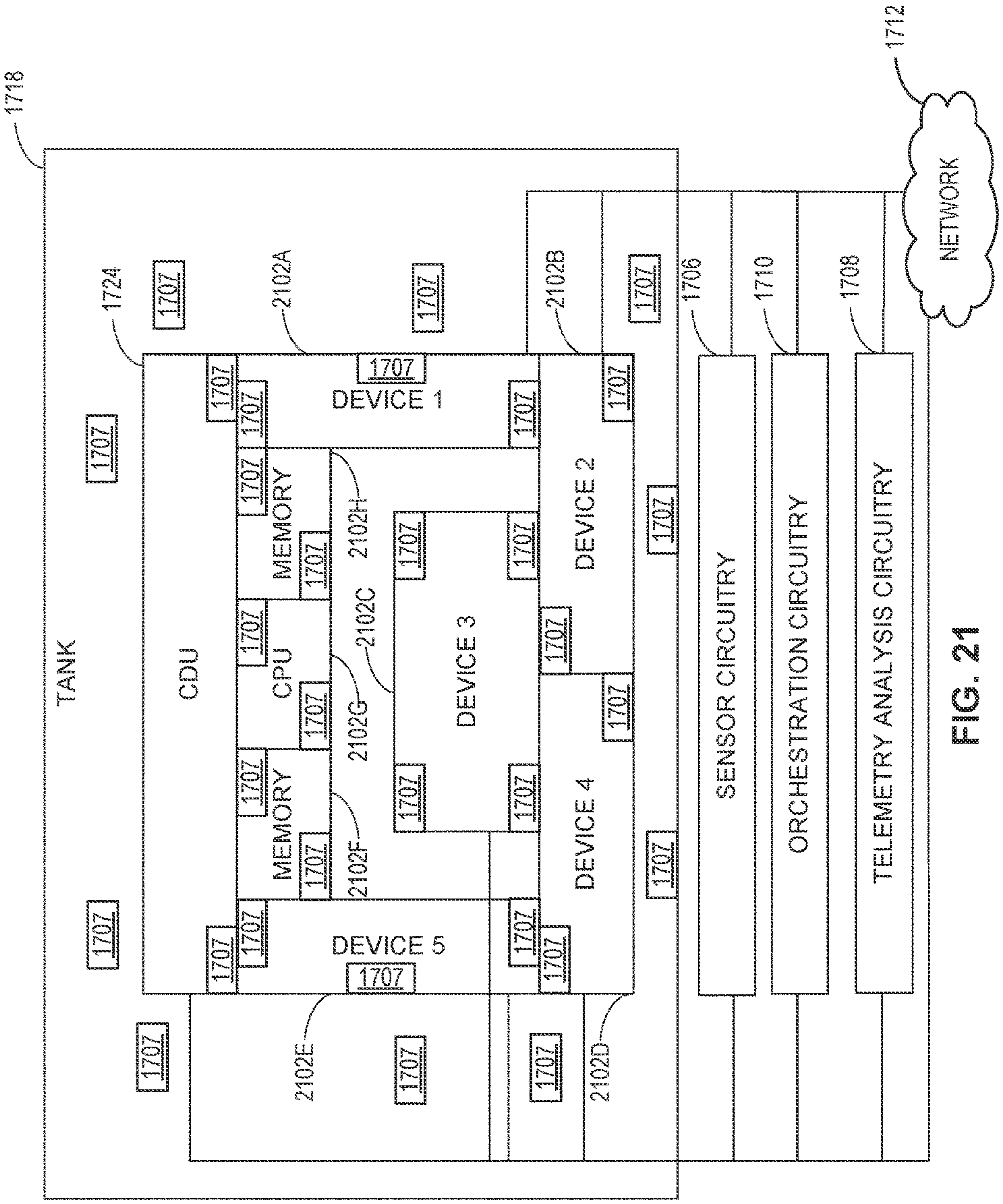
FIG. 21 illustrates an example cooling tank containing compute devices in communication with the orchestration circuitry of FIG. 17.

FIG. 21 is a block diagram of an example implementation of one of the cooling tanks 1718 of FIG. 17 (e.g., the first cooling tank 1718A, the second cooling tank 1718B). The tank 1718 includes (e.g., supports) compute devices 2102. The compute devices 2102 are exposed to fluid in the tank 1718 for purposes of cooling the compute devices 2102. The CDU 1724 directs the flow of fluid in the tank 1718. Although the example tank 1718 of FIG. 17 includes the CDU 1724, in other examples, the CDU 1724 is exterior to the tank 1718, the tank 1718 is fluidly coupled to a CDU that provides fluid to two or more tanks, etc.

In the example of FIG. 21, the CDU 1724 and the compute devices 2102 are in communication with one or more of the sensor circuitry 1706, the telemetry analysis circuitry 1708, and the orchestration circuitry 1710. The compute devices 2102 of the illustrated example can be part of, for example, the compute device 1726 (e.g., the first compute device 1726A, the second compute device 1726B) located in the tank 1718. For instance, the compute devices 2102 can include a memory and a CPU of the compute device 1726A.

The compute devices 2102 of the illustrated example 2102 include a first compute device 2102A, a second compute device 2102B, a third compute device 2102C, a fourth compute device 2102D, a fifth compute device 2102E, a first memory 2102F, a CPU 2102G, and a second memory 2102H. In some examples, the first, second, third, fourth, and/or fifth compute devices 2102A, 2102B, 2102C, 2102D include additional ones of memory and/or CPUs, or include different electronic components (e.g., GPUs). In the illustrated example, the tank 1718 also houses the CDU 1724 (e.g., the first chassis CDU 1724A, the second chassis CDU 1724B), which distributes coolant to the compute devices 2102. In some examples, the tank 1718 also contains the chassis 1720 (e.g., the first chassis 1720A, the second chassis 1720B), which can house the CDU 1724 and the compute devices 2102. In some examples, the sensor circuitry 1706 (or component(s) thereof) the orchestration circuitry 1710 (or component(s) thereof) and/or the telemetry analysis circuitry 1708 (or component(s) thereof) are implemented at the tank 1718. For example, the sensor circuitry 1706, the orchestration circuitry 1710, and/or the telemetry analysis circuitry 1708 may be implemented by one of the compute devices 2102 and communicatively coupled to the CDU 1724. In other examples, the CDU 1724 and the compute devices 2102 communicate with the sensor circuitry 1706, the telemetry analysis circuitry 1708, and/or the orchestration circuitry 1710 via the network 1712.

In the illustrated example of FIG. 21, the CDU 1724 controls parameters of the coolant flowing in the 1718. For example, the CDU 1724 can adjust a temperature of the coolant, a flow of the coolant, a density of the coolant, chemical properties of the coolant, a pressure of the coolant within the tank 1718, etc. The CDU 1724 receives coolant from the cooling distribution pipe 1716 of FIG. 17, can facilitate circulation or re-circulation of the coolant within the tank 1718, and can control the parameters of the coolant such as flow rate. In some examples, the output of the coolant from the CDU 1724 follows a flow path that exposes the coolant to the first compute device 2102A, then the second compute device 2102B, then the third compute device 2102C, then the fourth compute device 2102D, and then the fifth compute device 2102E before returning to the CDU 1724 for treatment. In some examples, the CDU 1724 facilitates the flow path that defines a sequence in which the respective compute devices 2102 are exposed to the coolant. In some examples, the CDU 1724 controls a rate at which the coolant flows, for instance, through a chassis including the compute devices 2102, past the individual compute devices 2102, etc. For example, the CDU 1724 can include one or more valve(s) and/or pump(s) operatively connected to a flow path of the fluid. In some examples, the CDU 1724 is fluidly coupled to one or more of the compute devices 2102 individually. For example, the CDU 1724 can direct the coolant to and/or from a respective compute device 2102 via one or more pipes disposed in the tank 1718.

In the illustrated example of FIG. 21, one or more of the sensors 1707 are dispersed throughout the tank 1718 to collect coolant parameters and/or parameters of the compute devices 2102, such as operating temperature. For example, ones of the sensors 1707 can be associated with the CDU 1724 and the respective compute devices 2102. In some examples, the CDU 1724 and/or the respective compute devices 2102 each include at least two of the sensors 1707 to record changes in coolant properties along a flow path of the coolant as the coolant moves through the CDU 1724, is exposed to the compute devices 2102, etc. In such example, outputs of the sensors 1707 can indicate heat generated and/or heat dissipated by the CDU 1724 and/or the respective compute devices 2102. In some examples, ones of the sensors 1707 are located throughout the tank 1718 based on average or expected workloads of the compute devices 2102 and/or SLOs associated with the compute devices 2102. The tank 1718 can include additional or fewer sensors 1707 than illustrated in FIG. 21 and/or sensors 1707 at different locations than illustrated in FIG. 21.

As disclosed in connection with FIG. 17, the outputs of the sensors 1707 are transmitted to the sensor circuitry 1706. The sensor circuitry 1706 outputs the collected telemetry to the telemetry analysis circuitry 1708 and/or the orchestration circuitry 1710. For example, the sensor circuitry 1706 can communicate with the telemetry analysis circuitry 1708 and/or the orchestration circuitry 1710 via the network 1712.

In the illustrated example of FIG. 21, the telemetry analysis circuitry 1708 generates heatmap(s) based on the outputs of the respective ones of the sensors 1707 (e.g., the telemetry received from the sensor circuitry 1706, which can identify the locations of the sensor(s) 1707 generating the output(s)). For example, the telemetry analysis circuitry 1708 can generate the heatmap(s) for the tank 1718, for the environment 1700 of FIG. 17 including the tank 1718, etc. The heatmap(s) can indicate data associated with coolant parameters, workloads of the compute devices 2102, SLOs associated with the compute devices, resource consumption, and/or resource availability at one or more locations in the tank 1718, in the environment 1700, etc. For example, the coolant parameters can include a heat dissipation potential, which the telemetry analysis circuitry 1708 computes based on the outputs of the sensor circuitry 1706 and/or the resource availability.

In the illustrated example of FIG. 21, the orchestration circuitry 1710 receives and/or accesses the heatmap(s) (e.g., the first heatmap 2000, the second heatmap 2030, the third heatmap 2060, etc.) generated by the telemetry analysis circuitry 1708. The example orchestration circuitry 1710 determines a cooling strategy and/or cooling parameter(s) to be implemented in the tank 1718 based on the information in the heatmap(s). The cooling strategy and/or cooling parameter(s) can define, for example, parameters of the coolant relative to the tank 1718 such as flow rate, flow path, coolant temperature, etc. For example, the orchestration circuitry 1710 can determine the cooling strategy and/or cooling parameter(s) based on the SLOs corresponding to the one or more tenants, the sensor telemetry, the workloads, resource utilization, and/or resource availability associated with the compute devices 2102.

In the illustrated example of FIG. 21, the orchestration circuitry 1710 causes the CDU 1724 to implement the determined cooling strategy and/or cooling parameter(s). For example, the orchestration circuitry 1710 can transmit signal(s) indicative of operating parameters of the CDU 1724 that will enable implementation the cooling strategy and/or cooling parameter(s) to the CDU 1724. In response to the signal(s), the CDU 1724 can control and/or adjust a temperature of the coolant, a flow of the coolant, a density of the coolant, chemical properties of the coolant, a pressure of the coolant within the tank 1718, etc. In some examples, the orchestration circuitry 1710 transmits signal(s) to the compute device(s) 2102 and/or components thereof to cause the compute device(s) 2102 adjust the workloads and, in turn, the amount of heat generated by the compute device(s) 2102, which can affect the amount of heat that the coolant can dissipate from the respective compute device 2120 or another compute device that encounters the coolant downstream. In some examples, one or more of the compute devices 2102 include a sub-CDU that directs the coolant to components therein, as discussed further in association with FIG. 22.

In some examples, the orchestration circuitry 1710 determines a heat influx associated with the workloads of the compute devices 2102, where heat influx includes heat generated by the compute devices 2102 as a result of operational state, performance of workloads, etc. For example, the orchestration circuitry 1710 can determine the heat influx based on historical data indicative of workloads and resulting heat generated by the devices 2102 when performing those workloads. In such examples, the orchestration circuitry 1710 can determine coolant parameters that would provide for cooling (e.g., sufficient cooling) to prevent, for instance, overheating of the compute devices 2102 in view of the heat generated and released by the compute devices 2102 in the tank 1718 environment (e.g., heat outflux, heat dissipation). In turn, the example orchestration circuitry 1710 can control the CDU 1724 based on the determined coolant parameters to address the heat generated and output by associated ones of the compute devices 2102 by facilitating dissipation of the heat. In some examples, when the compute devices 2102 have different workloads and, thus, different heat influxes, the orchestration circuitry 1710 controls the CDU 1724 and, thus, the coolant circulating in the tank 1718, based on the highest priority workload, the workload associated with the greatest heat influx, and/or the SLO of the compute device 2102 associated with the highest priority workload or the workload associated with the greatest heat influx. For example, the orchestration circuitry 1710 can instruct the CDU 1724 to direct coolant to the compute device 2102 associated with the highest priority workload relative to other compute devices 2102 in the tank 1718 at given time.

Figure 22:
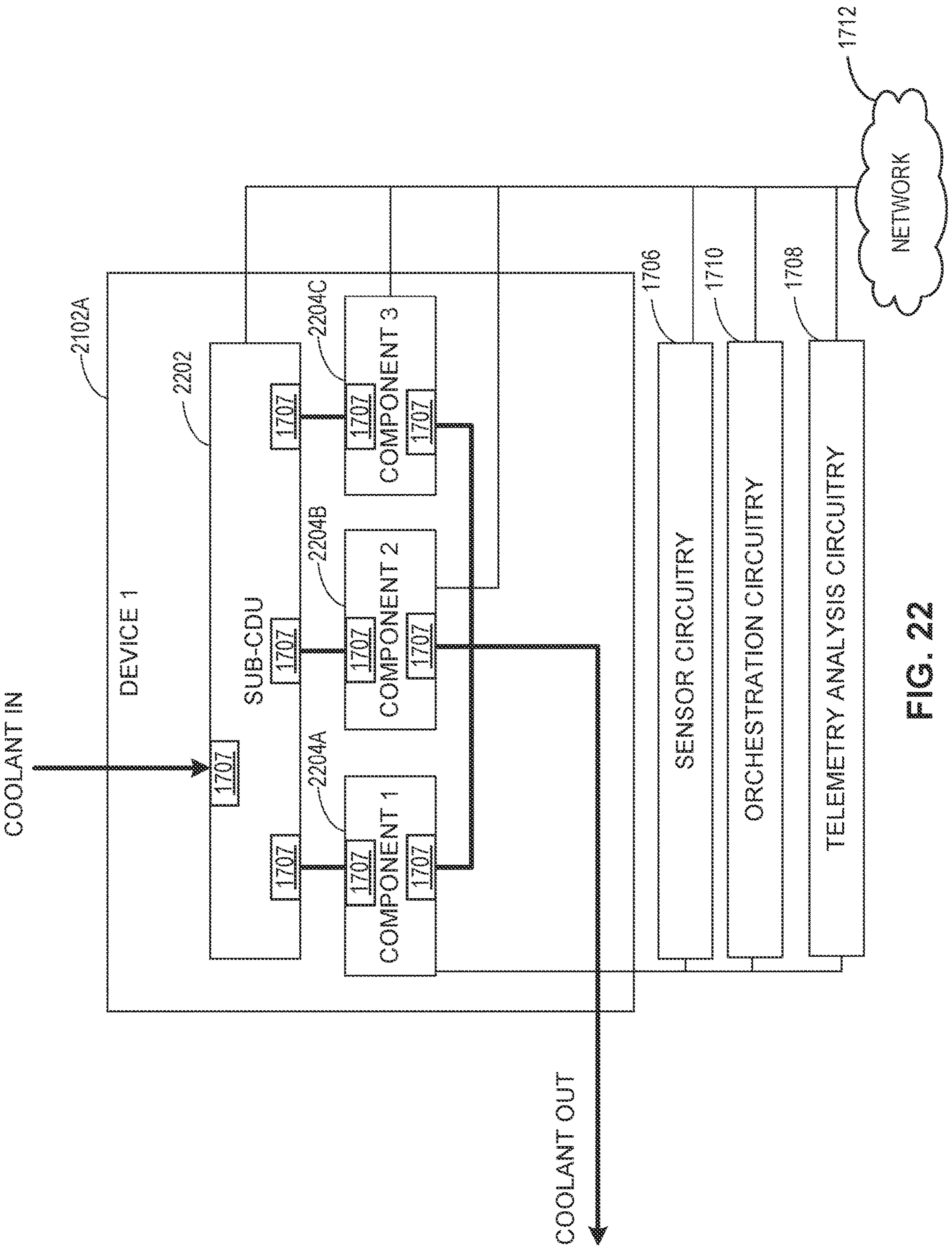
FIG. 22 illustrates an example compute device in the cooling tank of FIG. 21.

FIG. 22 is a block diagram of the first example compute device 2102A within the cooling tank 1718 of FIG. 21. The first compute device 2102A includes a sub-CDU 2202, a first compute component 2204A, a second compute component 2204B, and a third compute component 2204C. For example, the first compute device 2102A can be a GPU and the component 2204 can be parts of the GPU. The first example compute device 2102A can include additional or fewer components than shown in FIG. 21. The sub-CDU 2202 and the compute component 2204 are communicatively coupled to the sensor circuitry 1706, the telemetry analysis circuitry 1708, and the orchestration circuitry 1710. In some examples, the sub-CDU 2202 and the compute components 2204 communicate with the sensor circuitry 1706, the telemetry analysis circuitry 1708, and/or the orchestration circuitry 1710 via the network 1712.

The first compute device 2102A is exposed to coolant circulating in the tank 1718 (e.g., fluid provided by the tank CDU 1724 of FIG. 21). In the example of FIG. 21, the sub-CDU 2202 directs the coolant to the respective compute components 2204. For example, separate fluid flow paths (e.g., conduits, pipes, tubing) are defined between each of the components 2204 and the sub-CDU 2202. After the coolant flows through or past the compute components 2204, the coolant can flow back to the CDU 1724 or to (e.g., past) one of the other compute devices 2102B-H to provide for cooling of those devices. Although the example of FIG. 22 includes the sub-CDU 2022, in other examples, the first compute device 2102A does not include the sub-CDU 2022. In some such examples, the coolant can be directed via fluid flows path through, for instance, tubing extending from the tank CDU 1724.

In the illustrated example of FIG. 22, the sub-CDU 2202 and/or the compute components 2204 include the sensors 1707. In some examples, the sub-CDU 2202 and/or the compute components 2204 include two or more sensors 1707 to detect changes in coolant properties as, for instance, the coolant is exposed to the different device components 2204. In some examples, a first one of the sensors 1707 can be positioned at or near one or more coolant inlet(s) of the sub-CDU 2202 and a second one of the sensors 1707 can be positioned at one or more coolant outlet(s) of the sub-CDU 2202. The outputs of the sensors 1707 are transmitted to the sensor circuitry 1706.

In the illustrated example of FIG. 22, the orchestration circuitry 1710 analyzes the outputs of the sensor circuitry

1706; workloads of the components 2204 and/or, more generally, the compute device 2102A; resource utilization and availability; and/or SLO(s) associated with the compute device 2102A and/or the components 2204. For example, the orchestration circuitry 1710 can analyze the sensor telemetry and data associated with the compute device 2102A and/or the components 2204 using heatmap(s) generated by the telemetry analysis circuitry 1708, where the heatmap(s) include data associated with properties of the coolant flowing at the compute device 2102A, operating temperature of the compute device 2102A and/or the components 2204 thereof, etc. The orchestration circuitry 1710 controls operations of the sub-CDU 2202 and/or the compute components 2204 based on the determined cooling strategy and/or cooling parameter(s) to be implemented. For example, the orchestration circuitry 1710 can cause the sub-CDU 2202 to adjust properties of the coolant provided to the first component 2204A, the second component 2204B, and/or the third component 2204C. In some examples, the orchestration circuitry 1710 causes the sub-CDU 2202 to adjust a temperature of the coolant provided to the respective components 2204, a flow rate of the coolant provided to the respective components 2204, an amount of the coolant provided between the respective components 2204, etc. In some examples, the determined cooling strategy and/or cooling parameter(s) includes a schedule of execution of workloads by and/or between the respective components 2204 to manage cooling of the first compute device 2102A, prevent overheating, etc. For example, the orchestration circuitry 1710 can generate instructions to cause the first component 2204A to delay from executing a low priority workload in response to the second component 2204B executing a high priority workload and requiring additional cooling. In some examples, the orchestration circuitry 1710 generates instructions to cause some of the high priority workload to be performed by the first component 2204A to reduce the heat generated by the second component 2204B while executing the workload.

Figure 23:
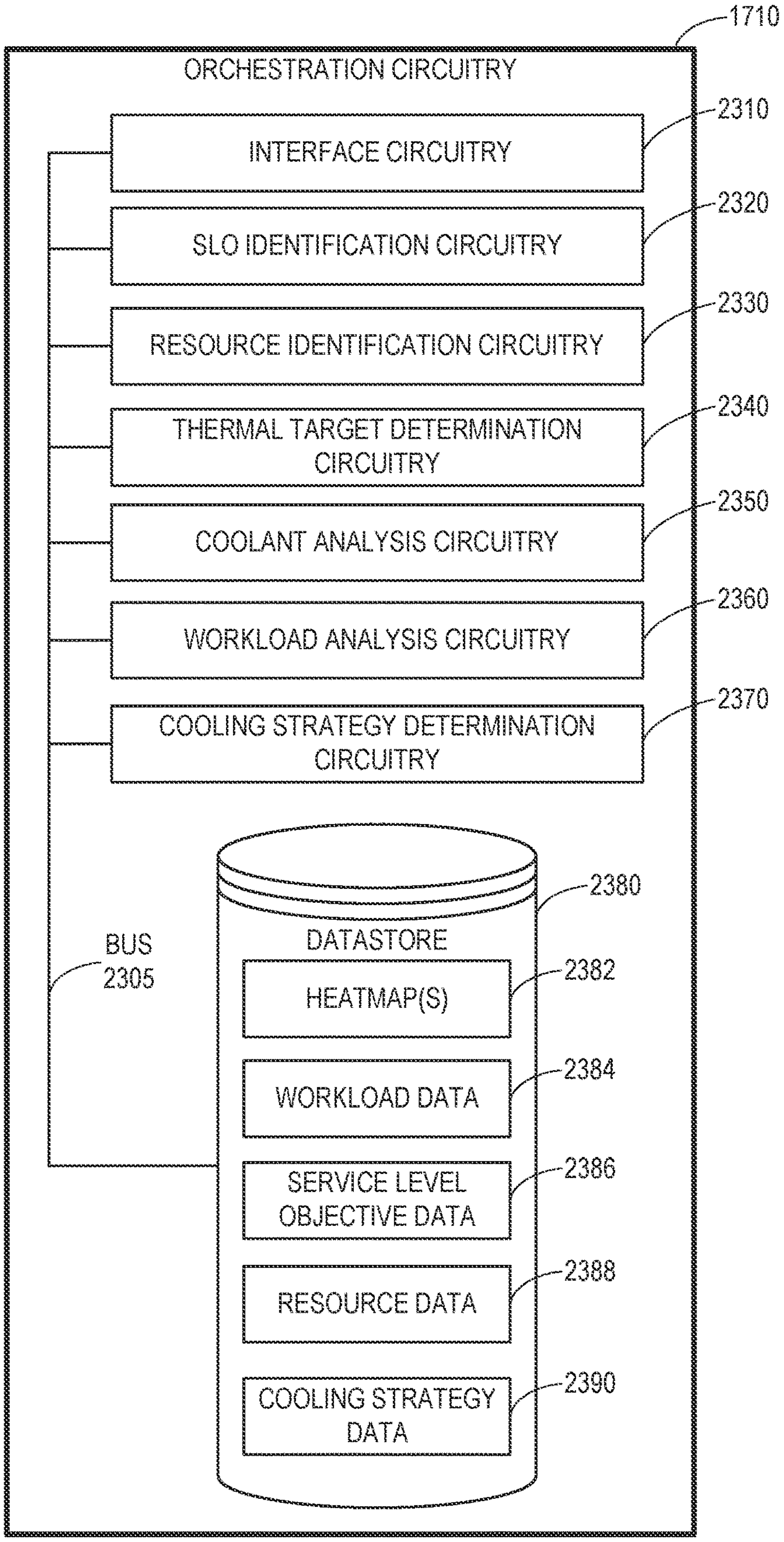
FIG. 23 is a block diagram of an example implementation of the orchestration circuitry of FIG. 17.

FIG. 23 is a block diagram of an example implementation of the orchestration circuitry 1710 of FIG. 17 to control cooling of edge device(s) (e.g., the 1702, 1718, 1720, 1726 of FIG. 17). The orchestration circuitry 1710 of FIG. 23 may be instantiated (e.g., creating an instance of, bring into being for any length of time, materialize, implement, etc.) by programmable circuitry such as a Central Processor Unit (CPU) executing first instructions. Additionally or alternatively, the orchestration circuitry 1710 of FIG. 23 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 23 may, thus, be instantiated at the same or different times. Some or all of the circuitry of FIG. 23 may be instantiated, for example, in one or more threads executing concurrently on hardware and/or in series on hardware. Moreover, in some examples, some or all of the circuitry of FIG. 23 may be implemented by microprocessor circuitry executing instructions and/or FPGA circuitry performing operations to implement one or more virtual machines and/or containers.

In the illustrated example of FIG. 23, the orchestration circuitry 1710 includes an example bus 2305, example interface circuitry 2310, example SLO identification circuitry 2320, example resource identification circuitry 2330, example thermal target determination circuitry 2340, example coolant analysis circuitry 2350, example workload analysis circuitry 2360, example cooling strategy determination circuitry 2370, and an example datastore 2380 including one or more heatmap(s) 2382, workload data 2384, SLO data 2386, resource data 2388, and cooling strategy data 2390. In the illustrated example of FIG. 23, the interface circuitry 2310, the SLO identification circuitry 2320, the resource identification circuitry 2330, the thermal target determination circuitry 2340, the coolant analysis circuitry 2350, the workload analysis circuitry 2360, the cooling strategy determination circuitry 2370, and the datastore 2380 are in communication with the bus 2305.

In the illustrated example of FIG. 23, the interface circuitry 2310 provides for interfaces between (a) the orchestration circuitry 1710 and the sensor circuitry 1706, (b) the orchestration circuitry 1710 and the telemetry analysis circuitry 1708, and/or (c) the orchestration circuitry 1710 and the compute device(s) 1726 and/or the CDUs 1704, 1721, 1724. The interface circuitry 2310 can be implemented by a communication device (e.g., a network interface card (NIC), a smart NIC, an Infrastructure Processing Unit (IPU), etc.) such as a transmitter, a receiver, a transceiver, a modem, a residential gateway, a wireless access point, and/or a network interface to facilitate exchange of data with external machines (e.g., computing devices of any kind). For example, the interface circuitry 1810 can be implemented by any type of interface standard, such as a wireless fidelity (Wi-Fi) interface, an Ethernet interface, a universal serial bus (USB), a Bluetooth interface, a near field communication (NFC) interface, a Peripheral Component Interconnect (PCI) interface, a Peripheral Component Interconnect express (PCI-e or PCIe) interface, and/or other types of interface standards.

For example, the interface circuitry 2310 receives the heatmap(s) 2382 from the telemetry analysis circuitry 1708. The example interface circuitry 2310 receives the workload data 2384, the service level objective data, and/or the resource data from the compute device(s) 1726 and/or the CDUs 1704, 1721, 1724. In some examples, the interface circuitry 2310 transmits signals to the compute device(s) 1726 and/or the CDUs 1704, 1721, 1724 to implement cooling strategy and/or cooling parameter(s) adjustments. In some examples, the interface circuitry 2310 exchanges information with the telemetry analysis circuitry 1708, the compute device(s) 1726, and/or the CDUs 1704, 1721, 1724 via the network 1712 of FIG. 17.

The orchestration circuitry 1710 of the illustrated example includes the SLO identification circuitry 2320 to identify the SLOs (and/or related SLA data) associated with the compute device(s) 1726 and/or the workload(s) to be performed by the compute device(s) 1726. For example, the SLO identification circuitry 2320 can identify the SLO(s) associated with the respective compute device(s) 1726, 2102; the compute components 2204 of the compute device(s) 1726, 2102; the workload(s) to be performed by the compute device(s) 1726, 2102 and/or the compute components 2204; and/or the tenants based on the SLO data 2386. In some examples, the SLO identification circuitry 2320 identifies and/or monitors the SLO(s) using the heatmap(s) generated by the telemetry analysis circuitry 1708. In some examples, the SLO identification circuitry 2320 identifies QoS targets and/or thermal targets, of the compute device(s) 1726, the compute devices 2102, the compute components 2204, and/or the workload(s) to be performed by the compute device(s) 1726, 2102 and/or the compute components 2204. In some examples, the SLO identification circuitry 2320 identifies a target throughput, a target latency, target execution of instructions per second, etc. for the compute device(s) 1726, 2102, the compute component(s) 2204 and/or the workload(s). The SLO(s) can be based on, for example, agreements between the provider of the edge appliance 1702 and the respective tenants for certain workloads and/or ones of the compute device(s) 1726, 2102, and/or the compute components 2204 thereof. In some examples, the SLO identification circuitry 2320 is instantiated by programmable circuitry executing SLO identification instructions and/or configured to perform operations such as those represented by the flowchart of FIG. 27.

The orchestration circuitry 1710 of the illustrated example includes the resource identification circuitry 2330 to identify an allocation of compute resources associated with the SLO(s). For example, the resource identification circuitry 2330 can determine the available compute resources (e.g., the respective compute device(s) 1726, 2102; the compute components 2204; and/or portions thereof) that can be utilized to achieve the SLOs during performance of the workload(s). In some examples, the resource identification circuitry 2330 determines the compute resources based on the resource data 2388. For example, the resource data 2388 can indicate compute resources available for respective tenants and/or workloads at a given time. In some examples, the resource identification circuitry 2330 is instantiated by programmable circuitry executing resource identification instructions and/or configured to perform operations such as those represented by the flowchart of FIG. 27.

The orchestration circuitry 1710 of the illustrated example includes the thermal target determination circuitry 2340 to identify cooling targets based on, for example, the workload(s), the SLO(s), the compute resources associated with the workload(s) and/or the SLO(s), etc. For example, the thermal target determination circuitry 2340 can determine particular ones of the compute resources to perform the workload(s) and/or an amount of the compute resources to be used to achieve the SLOs. In some examples, the thermal target determination circuitry 2340 determines a heat influx (e.g., an amount of heat generated by the compute device(s) 1726, 2102) that will occur as result of the performance of the workload(s). In some examples, the thermal target determination circuitry 2340 determines the heat influx associated with the workload(s) based on the heatmap(s) 2382 and/or the outputs of the sensor(s) 1707 (e.g., telemetry received from the sensor circuitry 1706). For example, when the workload(s) are being performed, the thermal target determination circuitry 2340 can monitor for increases or decreases in, for instance, coolant temperature and/or device operating temperature during execution of the workload(s) based on the heatmap(s) 2382 and/or the outputs of the sensor(s) 1707. In some examples, the thermal target determination circuitry 2340 predicts the heat influx based on historical data, such as historical sensor data, historical heatmap data, etc. For example, the heatmap(s) 2382 can include historical heatmap data, and the thermal target determination circuitry 2340 can identify a heat influx resulting from execution a similar historical workload (e.g., a workload with similar workload parameter(s), a similar SLO, and/or similar compute resources). In some examples, the thermal target determination circuitry 2340 determines a device operating temperature range (e.g., an optimal operating temperature) and/or a coolant temperature range (e.g., an optimal coolant temperature) that facilitates performance of the workload(s) while achieving the SLOs associated with the tenant and/or the workload(s) while addressing the generation of heat during workload performance. In some examples, the thermal target determination circuitry 2340 determines target heat outflux thresholds (e.g., an amount of heat released by the devices 1726, 2102 into the coolant) based on the historical data associated with the heatmap(s) 2382. For example, the thermal target determination circuitry 2340 can determine the target heat outflux thresholds based on historical characteristics associated with the resources (e.g., an age of the resources, prior heat dissipation data, etc.) and/or the workload(s). In some examples, the thermal target determination circuitry 2340 is instantiated by programmable circuitry executing thermal target determination instructions and/or configured to perform operations such as those represented by the flowchart of FIG. 27.

The orchestration circuitry 1710 of the illustrated example includes the coolant analysis circuitry 2350 to evaluate the cooling target(s) in view of, for example, CDU operating parameters, coolant properties, device properties, etc. For example, the coolant analysis circuitry 2350 can determine (e.g., predict) an amount (e.g., a maximum amount) of heat likely to be dissipated during cooling based on coolant properties and operational parameters of the CDU(s) 1704, 1721, 1724 and/or sub-CDU 2202 such as flow rates to be generated, available flow paths, etc. In some examples, the coolant analysis circuitry 2350 determines or learns (e.g., via machine learning) the capabilities of the coolant distributed by the CDU(s) 1704, 1721, 1724 and/or sub-CDU 2202 based on the historical data associated with the heatmap(s). In some examples, the coolant analysis circuitry 2350 can determine the coolant parameters that the CDU(s) 1704, 1721, 1724 and/or sub-CDU 2202 can provide to the compute resources 1726, 2102 based on the amount of cooling resources available, such as a power that the CDU(s) 1704, 1721, 1724 and/or sub-CDU 2202 can utilize to provide the cooling and/or an apportionment of the CDU(s) 1704, 1721, 1724 and/or sub-CDU 2202 resources between the compute resources 1726, 2102 performing the workload(s) and other compute resources 1726, 2102 performing other workloads. In some examples, the coolant analysis circuitry 2350 is instantiated by programmable circuitry executing coolant analysis instructions and/or configured to perform operations such as those represented by the flowchart of FIG. 27.

The orchestration circuitry 1710 of the illustrated example includes the workload analysis circuitry 2360 to identify one or more workload(s) of the compute device(s) 1726, 2102 and/or the compute components 2204. For example, the workload analysis circuitry 2360 can determine the workloads being, or to be, performed by the compute device(s) 1726, the compute devices 2102, the compute components 2204, and/or tenants based on the workload data 2384. In some examples, the workload analysis circuitry 2360 determines the workloads of the respective compute device(s) 1726, the respective compute devices 2102, the receive compute components 2204, and/or the tenants based on the heatmap(s) and/or based on data received from the respective compute device(s) 1726, 2102 and/or the receive compute components 2204.

In the illustrated example of FIG. 23, the workload analysis circuitry 2360 determines a distribution and/or schedule for the workload(s) to be performed by the compute device(s) 1726, 2102. For example, the workload analysis circuitry 2360 can determine the workload distribution and/or schedule and/or adjustments to previous workload distributions and/or schedules based on available coolant, coolant properties, expected amounts of heat to be generated as a result of the performance of the workloads, expected heat dissipation during cooling, workload priority, SLO(s), etc. In some examples, the workload analysis circuitry 2360 identifies other available compute resources that can be used to perform the workload(s) while still achieving the SLO(s) of the tenants to facilitate efficient cooling throughout, for instance, the tank 1718, the appliance 1702, etc. In such examples, the workload analysis circuitry 2360 redistributes the workload(s) to the other available compute resources. In some examples, the workload analysis circuitry 2360 causes the interface circuitry 2310 to transmit signals to the compute resources 1726, 2102 to, for instance, initiate, redistribute, or delay performance workload(s) to manage cooling of the compute device(s) 1726, 2102. In some examples, the workload analysis circuitry 2360 is instantiated by programmable circuitry executing workload processor instructions and/or configured to perform operations such as those represented by the flowchart of FIG. 27.

The orchestration circuitry 1710 of the illustrated example includes the cooling strategy determination circuitry 2370 to determine coolant properties to be provided for cooling in the environment 1700 and, in particular, for cooling the compute devices 1726, 2102 and/or the component(s) 2204 thereof. For example, the cooling strategy determination circuitry 2370 can determine coolant parameters to achieve the target heat outflux threshold(s) (e.g., heat dissipation, an amount of heat generated by the compute device(s) 1726, 2102 and/or the component(s) 2204 thereof and transferred to the coolant). In some examples, the cooling strategy determination circuitry 2370 determines the coolant parameters that can achieve the target heat outflux threshold via the cooling strategy data 2390. For example, the cooling strategy data 2390 can indicate respective coolant parameters that provide respective heat outfluxes for certain compute resources (e.g., resource types and/or sizes) and/or workload parameters (e.g., throughputs, instructions per second, latency, etc.). In the illustrated example of FIG. 23, the cooling strategy determination circuitry 2370 generates instructions for the CDU(s) 1704, 1721, 1724 and/or sub-CDU(s) 2202 based on the determined coolant parameters. For example, the cooling strategy determination circuitry 2370 can determine operating parameters of the CDU(s) 1704, 1721, 1724 and/or sub-CDU(s) 2202 that provide the determined coolant parameters (e.g., flow rate, input coolant temperature). In some examples, the cooling strategy determination circuitry 2370 causes the interface circuitry 2310 to transmit signal(s) indicative of the operating parameters to the CDU(s) 1704, 1721, 1724 and/or sub-CDU(s) 2202 for implementation. In some examples, the cooling strategy determination circuitry 2370 is instantiated by programmable circuitry executing cooling strategy determination instructions and/or configured to perform operations such as those represented by the flowchart of FIG. 27.

In some examples, the orchestration circuitry 1710 includes means for identifying SLO(s). For example, the means for identifying may be implemented by SLO identification circuitry 2320. In some examples, the SLO identification circuitry 2320 may be instantiated by programmable circuitry such as the example programmable circuitry 3012 of FIG. 30. For instance, the SLO identification circuitry 2320 may be instantiated by the example microprocessor 3100 of FIG. 31 executing machine executable instructions such as those implemented by at least blocks 2706 of FIG. 27. In some examples, the SLO identification circuitry 2320 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the SLO identification circuitry 2320 may be instantiated by any other combination of hardware, software, and/or firmware. For example, the SLO identification circuitry 2320 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for determining compute resources. For example, the means for compute resource determining may be implemented by resource identification circuitry 2330. In some examples, the resource identification circuitry 2330 may be instantiated by programmable circuitry such as the example programmable circuitry 3012 of FIG. 30. For instance, the resource identification circuitry 2330 may be instantiated by the example microprocessor 3100 of FIG. 31 executing machine executable instructions such as those implemented by at least block 2708 of FIG. 27. In some examples, the resource identification circuitry 2330 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the resource identification circuitry 2330 may be instantiated by any other combination of hardware, software, and/or firmware. For example, the resource identification circuitry 2330 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for determining cooling targets. For example, the means for cooling target determining may be implemented by thermal target determination circuitry 2340. In some examples, the thermal target determination circuitry 2340 may be instantiated by programmable circuitry such as the example programmable circuitry 3012 of FIG. 30. For instance, the thermal target determination circuitry 2340 may be instantiated by the example microprocessor 3100 of FIG. 31 executing machine executable instructions such as those implemented by at least block 2710 of FIG. 27. In some examples, the thermal target determination circuitry 2340 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the thermal target determination circuitry 2340 may be instantiated by any other combination of hardware, software, and/or firmware. For example, the thermal target determination circuitry 2340 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for evaluating. For example, the means for evaluating may be implemented by coolant analysis circuitry 2350. In some examples, the coolant analysis circuitry 2350 may be instantiated by programmable circuitry such as the example programmable circuitry 3012 of FIG. 30. For instance, the coolant analysis circuitry 2350 may be instantiated by the example microprocessor 3100 of FIG. 31 executing machine executable instructions such as those implemented by at least block 2712 of FIG. 27. In some examples, the coolant analysis circuitry 2350 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the coolant analysis circuitry 2350 may be instantiated by any other combination of hardware, software, and/or firmware. For example, the coolant analysis circuitry 2350 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for distributing workload(s). For example, the means for distributing may be implemented by workload analysis circuitry 2360. In some examples, the workload analysis circuitry 2360 may be instantiated by programmable circuitry such as the example programmable circuitry 3012 of FIG. 30. For instance, the workload analysis circuitry 2360 may be instantiated by the example microprocessor 3100 of FIG. 31 executing machine executable instructions such as those implemented by at least blocks 2702, 2704, 2714 of FIG. 27. In some examples, the workload analysis circuitry 2360 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the workload analysis circuitry 2360 may be instantiated by any other combination of hardware, software, and/or firmware. For example, the workload analysis circuitry 2360 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for generating cooling strateg(ies) and/or cooling parameter(s). For example, the means for generating may be implemented by cooling strategy determination circuitry 2370. In some examples, the cooling strategy determination circuitry 2370 may be instantiated by programmable circuitry such as the example programmable circuitry 3012 of FIG. 30. For instance, the cooling strategy determination circuitry 2370 may be instantiated by the example microprocessor 3100 of FIG. 31 executing machine executable instructions such as those implemented by at least blocks 2716, 2718 of FIG. 27. In some examples, the cooling strategy determination circuitry 2370 may be instantiated by hardware logic circuitry, which may be implemented by an ASIC, XPU, or the FPGA circuitry 3200 of FIG. 32 configured and/or structured to perform operations corresponding to the machine readable instructions. Additionally or alternatively, the cooling strategy determination circuitry 2370 may be instantiated by any other combination of hardware, software, and/or firmware. For example, the cooling strategy determination circuitry 2370 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the orchestration circuitry 1710 includes means for transmitting instructions. For example, the means for transmitting may be implemented by interface circuitry 2310. In some examples, the interface circuitry 2310 may be instantiated by programmable circuitry such as the example programmable circuitry 3012 of FIG. 30. For instance, the interface circuitry 2310 may be instantiated by the example microprocessor 3100 of FIG. 31 executing machine executable instructions such as those implemented by at least block 2718 of FIG. 27. In some examples, the interface circuitry 2310 may be instantiated by hardware logic circuitry, which may be implemented by an ASIC, XPU, or the FPGA circuitry 33200 of FIG. 32 configured and/or structured to perform operations corresponding to the machine readable instructions. Additionally or alternatively, the interface circuitry 2310 may be instantiated by any other combination of hardware, software, and/or firmware. For example, the interface circuitry 2310 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

While an example manner of implementing the orchestration circuitry 1710 of FIG. 17 is illustrated in FIG. 23, one or more of the elements, processes, and/or devices illustrated in FIG. 23 may be combined, divided, re-arranged, omitted, eliminated, and/or implemented in any other way. Further, the example interface circuitry 2310, the example SLO identification circuitry 2320, the example resource identification circuitry 2330, the example thermal target determination circuitry 2340, the example coolant analysis circuitry 2350, the example workload analysis circuitry 2360, the example cooling strategy determination circuitry 2370, the example datastore 2380, and/or, more generally, the example orchestration circuitry 1710 of FIG. 23, may be implemented by hardware alone or by hardware in combination with software and/or firmware. Thus, for example, any of the example interface circuitry 2310, the example SLO identification circuitry 2320, the example resource identification circuitry 2330, the example thermal target determination circuitry 2340, the example coolant analysis circuitry 2350, the example workload analysis circuitry 2360, the example cooling strategy determination circuitry 2370, the example datastore 2380, and/or, more generally, the example orchestration circuitry 1710, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example orchestration circuitry 1710 of FIG. 23 may include one or more elements, processes, and/or devices in addition to, or instead of, those illustrated in FIG. 23, and/or may include more than one of any or all of the illustrated elements, processes and devices.

Figure 24:
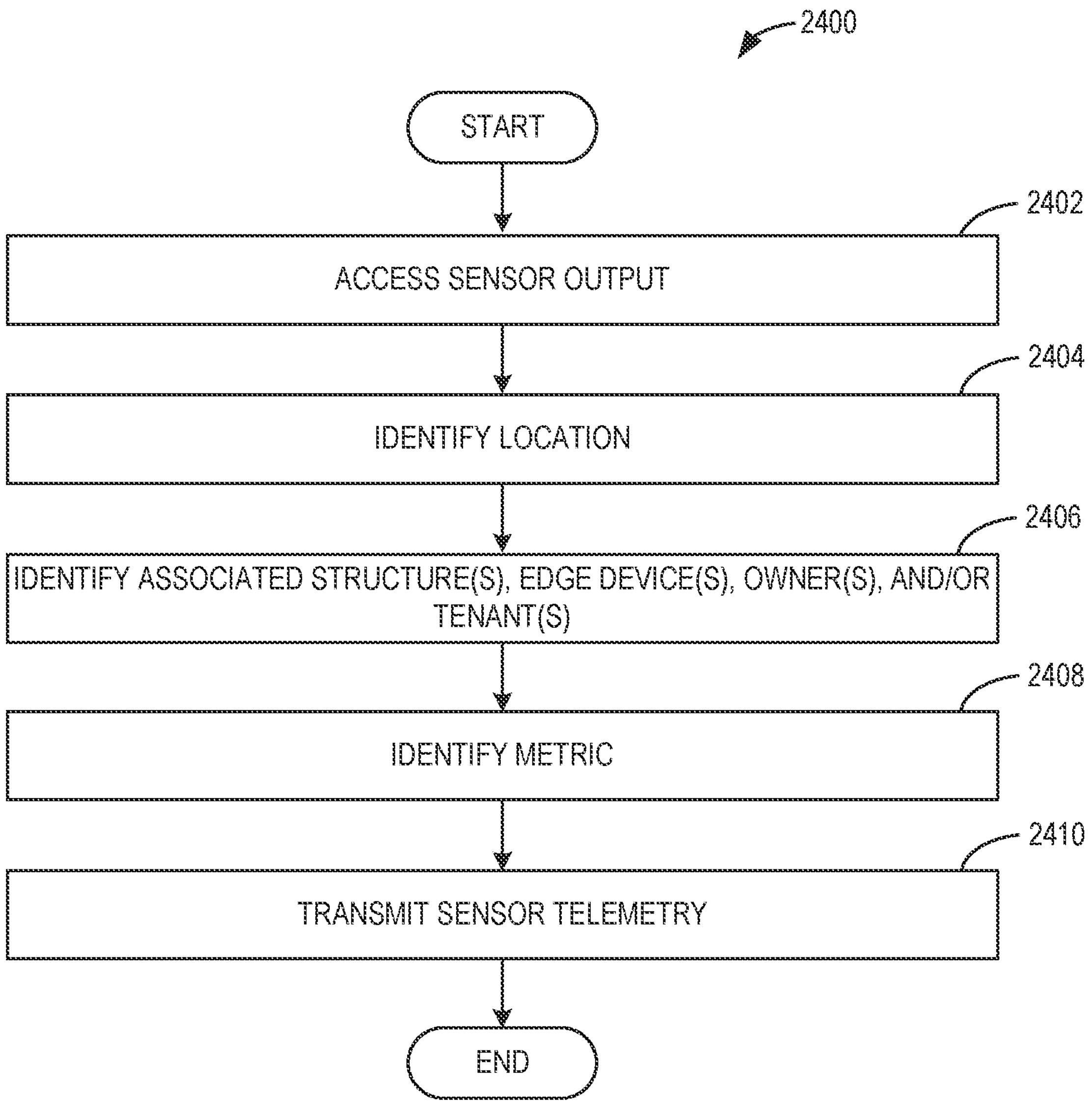
FIG. 24 is a flowchart representative of example machine readable instructions and/or example operations that may be executed, instantiated, and/or performed by example programmable circuitry to implement the sensor circuitry of FIG. 18 to collect thermal data associated with the environment of FIG. 17.

A Flowchart representative of example machine readable instructions, which may be executed by programmable circuitry to implement and/or instantiate the sensor circuitry 1706 of FIG. 18 and/or representative of example operations which may be performed by programmable circuitry to implement and/or instantiate the sensor circuitry 1706 of FIG. 18, is shown in FIG. 24. The machine readable instructions may be one or more executable programs or portion(s) of one or more executable programs for execution by programmable circuitry such as the processor circuitry 2812 shown in the example processor platform 2800 discussed below in connection with FIG. 29 and/or may be one or more function(s) or portion(s) of functions to be performed by the example programmable circuitry (e.g., an FPGA) discussed below in connection with FIGS. 32 and/or 33. In some examples, the machine readable instructions cause an operation, a task, etc., to be carried out and/or performed in an automated manner in the real world. As used herein, "automated" means without human involvement.

Figure 25:
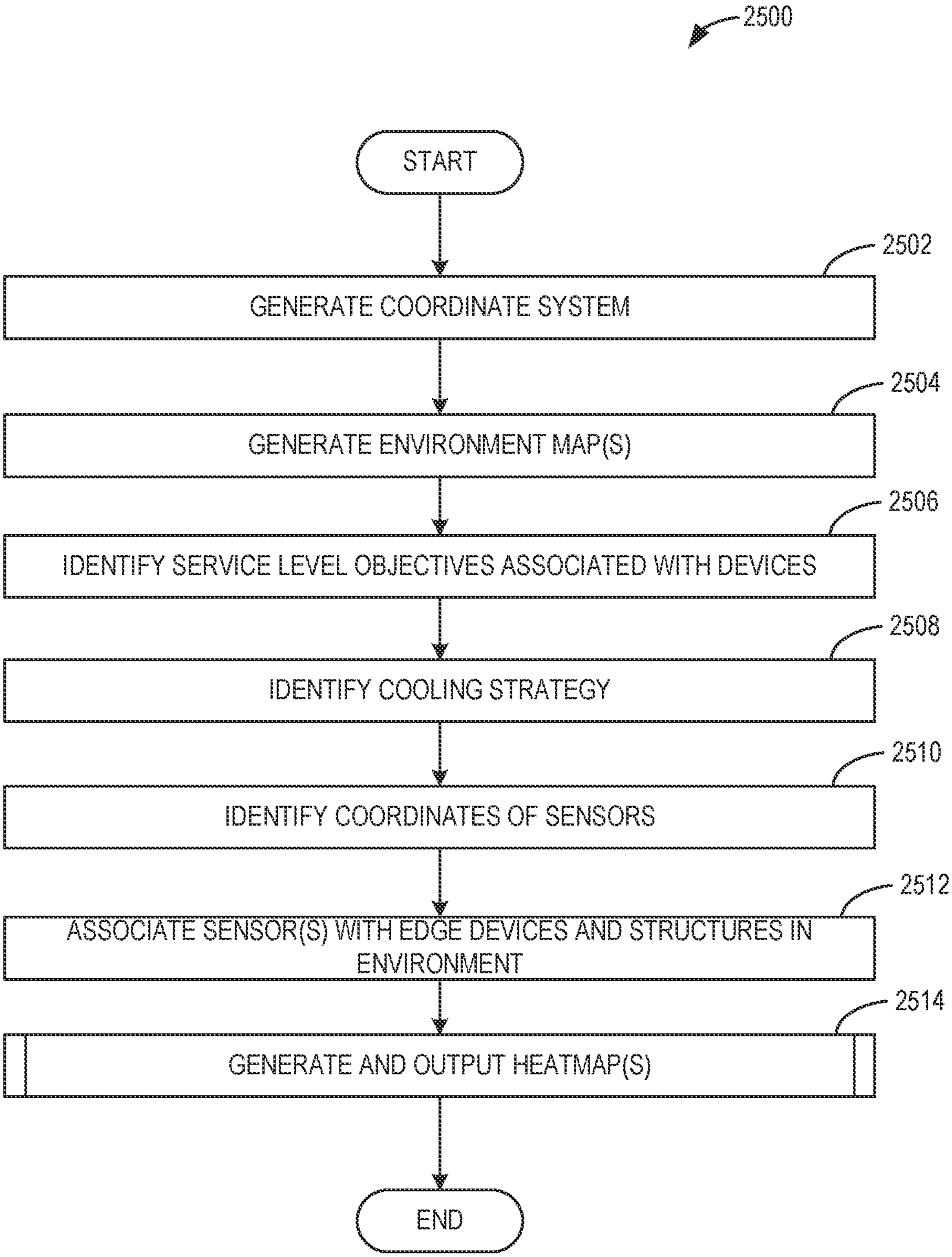
FIG. 25 is a flowchart representative of example machine readable instructions and/or example operations that may be executed, instantiated, and/or performed by example programmable circuitry to implement the telemetry analysis circuitry of FIG. 19 to implement the telemetry analysis circuitry of FIG. 20 to monitor thermal activity in the environment of FIG. 17.

Flowcharts representative of example machine readable instructions, which may be executed by programmable circuitry to implement and/or instantiate the telemetry analysis circuitry 1708 of FIG. 19 and/or representative of example operations which may be performed by programmable circuitry to implement and/or instantiate the telemetry analysis circuitry 1708 of FIG. 19, are shown in FIGS. 25 and/or 26. The machine readable instructions may be one or more executable programs or portion(s) of one or more executable programs for execution by programmable circuitry such as the processor circuitry 3012 shown in the example processor platform 3000 discussed below in connection with FIG. 30 and/or may be one or more function(s) or portion(s) of functions to be performed by the example programmable circuitry (e.g., an FPGA) discussed below in connection with FIGS. 32 and/or 33. In some examples, the machine readable instructions cause an operation, a task, etc., to be carried out and/or performed in an automated manner in the real world.

Figure 27:
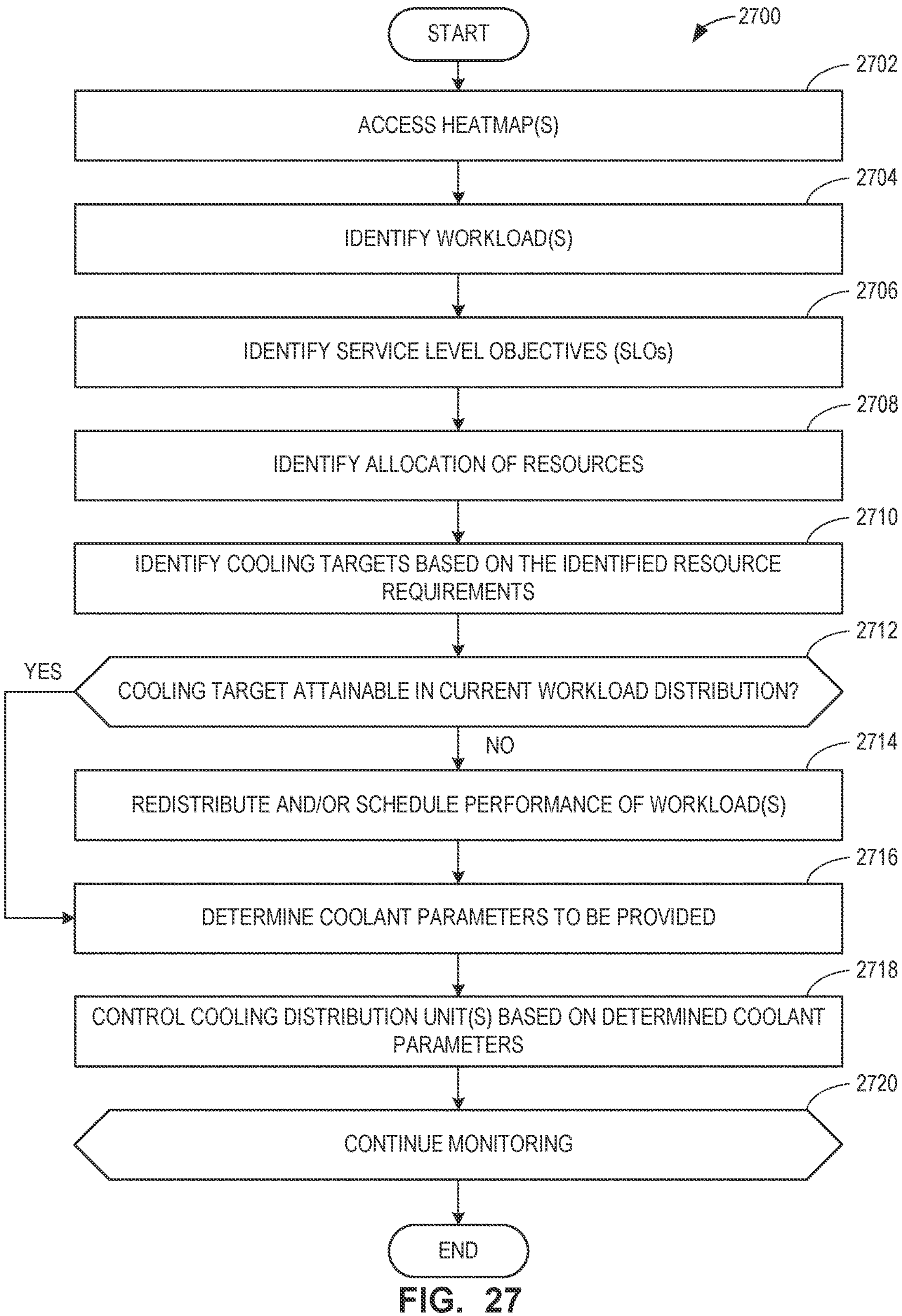
FIG. 27 is another flowchart representative of example machine readable instructions and/or example operations that may be executed, instantiated, and/or performed by example programmable circuitry to implement the orchestration circuitry of FIG. 23 to determine cooling strateg(ies) for the environment of FIG. 17.

Flowcharts representative of example machine readable instructions, which may be executed by programmable circuitry to implement and/or instantiate the orchestration circuitry 1710 of FIG. 21 and/or representative of example operations which may be performed by programmable circuitry to implement and/or instantiate the orchestration circuitry 1710 of FIG. 21, are shown in FIG. 27. The machine readable instructions may be one or more executable programs or portion(s) of one or more executable programs for execution by programmable circuitry such as the processor circuitry 3112 shown in the example processor platform 3100 discussed below in connection with FIG. 31 and/or may be one or more function(s) or portion(s) of functions to be performed by the example programmable circuitry (e.g., an FPGA) discussed below in connection with FIGS. 32 and/or 33. In some examples, the machine readable instructions cause an operation, a task, etc., to be carried out and/or performed in an automated manner in the real world.

The program may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 24-27, many other methods of implementing the example sensor circuitry 1706, the example telemetry analysis circuitry 1708, and/or the example orchestration circuitry 1710 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine readable instructions may be fragmented and stored on one or more storage devices, disks and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable, computer readable and/or machine readable media, as used herein, may include instructions and/or program(s) regardless of the particular format or state of the machine readable instructions and/or program(s).

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example operations of FIGS. 24-27 may be implemented using executable instructions (e.g., computer readable and/or machine readable instructions) stored on one or more non-transitory computer readable and/or machine readable media. As used herein, the terms non-transitory computer readable medium, non-transitory computer readable storage medium, non-transitory machine readable medium, and/or non-transitory machine readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 24 is a flowchart representative of example machine readable instructions and/or example operations 2400 that may be executed, instantiated, and/or performed by programmable circuitry to collect thermal data associated with the environment 1700 of FIG. 17. The example machine-readable instructions and/or the example operations 2400 of FIG. 24 begin at block 2402, at which the sensor circuitry 1706 accesses outputs of the sensors 1707. For example, the interface circuitry 1810 can access the outputs of the sensors 1707.

At block 2404, the sensor circuitry 1706 identifies a location within the environment where the sensors 1707 are positioned. For example, the location identification circuitry 1850 can identify three-dimensional coordinates representative of a position of the sensors 1707 in the environment 1700. In some examples, the location identification circuitry 1850 receives and/or identifies a nearby location indicator, such as a radio-frequency identification tag, associated with a location in the environment. In some examples, the location identification circuitry 1850 includes a global positioning system (GPS), a position sensor, and/or an altitude sensor that provide location information. In some examples, the location identification circuitry 1850 identifies a predetermined location of the sensor circuitry 1706 via the datastore 1870. For example, the location identification circuitry 1850 can determine the respective locations of the sensors 1707 based on identifiers (e.g., identification values) that the sensors 1707 output and locations associated with the identifies stored in the datastore 1870.

At block 2406, the sensor circuitry 1706 identifies one or more structures (e.g., the pipe(s) 1714, 1716); edge device(s) 1702, 1718, 1720, 1726; owner(s); and/or tenant(s) associated with the sensor outputs and/or data derived therefrom. In some examples, the metric linking circuitry 1860 identifies the edge device 1702, 1718, 1720, 1726, the heat consumers 1705, the owner, and/or the tenant associated with the identifiers of the sensors in the datastore 1870. In some examples, the metric linking circuitry 1860 identifies the edge device 1702, 1718, 1720, 1726, the heat consumers 1705, the owner, and/or the tenant based on the identified location of the sensor circuitry 1706. In such examples, the metric linking circuitry 1860 identifies areas associated with the edge device 1702, 1718, 1720, 1726, the heat consumers 1705, the owner, and/or the tenant via the datastore 1870. Accordingly, the metric linking circuitry 1860 can correlate the identified location of the sensor circuitry 1706 with coordinates of an edge device 1702, 1718, 1720, 1726, a heat consumer 1705, an owner, and/or a tenant having an area that includes or is near the identified location. In some examples, the metric linking circuitry 1860 causes the interface circuitry 1810 to transmit a request for one or more identifier(s) of the edge device 1702, 1718, 1720, 1726, the heat consumers 1705, the owner, and/or the tenant to the compute device(s) 1726 and/or the telemetry analysis circuitry 1708. In some examples, the interface circuitry 1810 receives information associated with one or more related edge device(s) 1702, 1718, 1720, 1726, the heat consumers 1705, an owner of the related edge device(s) 1702, 1718, 1720, 1726 or the heat consumers 1705, and/or a tenant of the related edge device(s) 1702, 1718, 1720, 1726 or the heat consumers 1705 from the compute device(s) 1726 and/or the telemetry analysis circuitry 1708.

At block 2408, the sensor circuitry 1706 identifies metrics corresponding to the signals that the sensors 1707 outputted. For example, the metric determination circuitry 1840 can determine a temperature value, a chemical composition, a pressure value, a density, a flow rate, and/or any other property measured by the sensor(s) 1707.

At block 2410, the sensor circuitry 1706 transmits sensor telemetry to the telemetry analysis circuitry 1708 and/or the orchestration circuitry 1710. For example, the sensor telemetry can include the determined metric (e.g., a value for the metric and a label for property represented by the metric); the location of the related sensor 1707; and/or associated structures (e.g., the pipe(s) 1714, 1716), edge device(s) 1702, 1718, 1720, 1726, owner(s), and/or tenant(s). In some examples, the metric linking circuitry 1860 links the determined metric, the identified location, a pipe 1714, 1716 and/or an edge device 1702, 1718, 1720, 1726 associated with the location, an owner associated with the edge device 1702, 1718, 1720, 1726, and/or a tenant associated with the edge device 1702, 1718, 1720, 1726 to form a sensor telemetry packet. In some examples, the metric linking circuitry 1860 causes the interface circuitry 1810 to transmit the sensor telemetry packet to the telemetry analysis circuitry 1708 and/or the orchestration circuitry 1710.

FIG. 25 is a flowchart representative of example machine readable instructions and/or example operations 2500 that may be executed, instantiated, and/or performed by programmable circuitry to monitor thermal activity in an edge environment (e.g., the environment 1700). The example machine-readable instructions and/or the example operations 2500 of FIG. 25 begin at block 2502, at which the telemetry analysis circuitry 1708 generates a coordinate system. For example, the infrastructure map generation circuitry 1920 can generate one or more coordinate system(s) for the environment 1700. In some examples, the infrastructure map generation circuitry 1920 generates coordinate systems for each of the appliances 1702 and/or the pipe(s) 1714, 1716. In such examples, the infrastructure map generation circuitry 1920 associates an identifier indicative of the respective appliance 1702 or pipe 1714, 1716 with the three-dimensional coordinates. Similarly, the infrastructure map generation circuitry 1920 can generate three-dimensional coordinate systems and identifiers for the other edge devices 1718, 1720, 1726 within the appliance 1702, such as the tanks 1718 within the appliance 1702, the chassis 1720 within the tanks 1718, the CDU within the chassis 1720, and/or the electrical component(s) 1726 within the chassis 1720. In some examples, the infrastructure map generation circuitry 1920 identifies reference points for the boundaries based on a point on an edge device 1702, 1718, 1720, 1726 or a related structure (e.g., the pipe(s) 1714, 1716, 1719) that conveys the coolant. In such examples, the infrastructure map generation circuitry 1920 can set the reference point as a point on (e.g., a corner of, an end of, a midpoint of, etc.) the appliance 1702, the tank 1718, the chassis 1720, the CDU 1724, the electrical component(s) 1726, and/or the pipe(s) 1714, 1716. For example, the infrastructure map generation circuitry 1920 can associate a corner of the first tank 1718A with the coordinate (Tank-1,0,0,0) where "Tank-1" is the coordinate system identifier and (0,0,0) are Cartesian coordinates along an x-axis, a y-axis, and a z-axis, respectively.

At block 2504, the telemetry analysis circuitry 1708 generates a map of the environment 1700. For example, the infrastructure map generation circuitry 1920 identifies and/or indicates the locations of the edge devices 1702, 1718, 1720, 1726 and the pipe(s) 1714, 1716, 1719 within the generated coordinate system(s). In some examples, the infrastructure map generation circuitry 1920 sets the locations of the locations of the edge devices 1702, 1718, 1720, 1726 and the pipe(s) 1714, 1716, 1719 based on the sensor telemetry. For example, the infrastructure map generation circuitry 1920 can identify an area occupied by the edge devices 1702, 1718, 1720, 1726 and the pipe(s) 1714, 1716, 1719 based on the location information in the sensor telemetry and the edge device 1702, 1718, 1720, 1726 or pipe 1714, 1716, 1719 identified by the sensor telemetry. In some examples, the infrastructure map generation circuitry 1920 identifies an area occupied by the edge devices 1702, 1718, 1720, 1726 and/or the pipe(s) 1714, 1716, 1719 in the coordinate system(s) based on an input received by the interface circuitry 1910. In some examples, the infrastructure map generation circuitry 1920 identifies an area occupied by the edge devices 1702, 1718, 1720, 1726 and/or the pipe(s) 1714, 1716, 1719 via the location datastore 1970.

At block 2506, the telemetry analysis circuitry 1708 identifies SLAs and/or SLOs associated with one or more of the edge device(s) 1702, 1718, 1720, 1726 in the generated map(s). In some examples, the compute performance analysis circuitry 1940 accesses compute performance telemetry and service level objectives associated with the compute device(s) 1726 and/or the workload(s) being, or to be, performed by the compute device(s) 1726 via the interface circuitry 1910 and the SLO datastore 1980, respectively. In such examples, the infrastructure map generation circuitry 1920 inserts parameters associated with the SLOs of the respective edge device(s) 1702, 1718, 1720, 1726 in the corresponding area of the generated map(s). For example, the infrastructure map generation circuitry 1920 can indicate a temperature range that the compute device(s) 1726 are to be within in an area of the map(s) associated with the compute device(s) 1726. In some examples, the infrastructure map generation circuitry 1920 indicates resource utilizations (e.g., processing elements per second) and/or QoS targets of the compute device(s) 1726 in the map(s).

At block 2508, the telemetry analysis circuitry 1708 identifies cooling strateg(ies) implemented or to be implemented in the environment 1700 or a portion thereof. In some examples, the heatmap generation circuitry 1930 identifies the cooling strateg(ies) based on communications from the orchestration circuitry 1710. The orchestration circuitry 1710 determines the cooling strateg(ies) to be implemented and controls the CDU(s) 1704, 1721, 1724 and/or operations of the compute device(s) 1726 to implement the cooling strateg(ies), as disclosed in connection with FIG. 27.

At block 2510, the telemetry analysis circuitry 1708 associates respective ones of the sensor(s) 1707 with corresponding locations in the generated map(s). For example, the infrastructure map generation circuitry 1920 can access the sensor telemetry via the interface circuitry 1910. In some examples, the heatmap generation circuitry 1930 identifies the coordinates of the respective ones of the sensors 1707 based on the sensor telemetry. In some examples, the infrastructure map generation circuitry 1920 identifies locations of the respective ones of the sensors 1707 via the location datastore 1970. For example, the infrastructure map generation circuitry 1920 can identify the locations of the respective ones of the sensors 1707 based on a sensor identifier and/or an identifier of an edge device 1702, 1718, 1720, 1726 and/or pipe(s) 1714, 1716 received in the sensor telemetry.

At block 2512, the telemetry analysis circuitry 1708 associates respective ones of the sensors 1707 with a corresponding edge device 1702, 1718, 1720, 1726 and/or pipe(s) 1714, 1716. For example, the infrastructure map generation circuitry 1920 can identify the corresponding edge device 1702, 1718, 1720, 1726 and/or pipe(s) 1714, 1716 based on the sensor telemetry. In some examples, the infrastructure map generation circuitry 1920 determines the corresponding edge device 1702, 1718, 1720, 1726 and/or pipe(s) 1714, 1716 associated with the sensor circuitry 1706 based on the identified location of the sensor circuitry 1706.

At block 2514, the telemetry analysis circuitry 1708 generates one or more heatmap(s) for the environment based on the sensor telemetry and the generated environment map(s). For example, the heatmap generation circuitry 1930 can adapt the environment map(s) to numerically and/or symbolically include the sensor telemetry. The generating of the heatmap(s) at block 2514 is described further below in connection with FIG. 26. The interface circuitry 1910 of the telemetry analysis circuitry 1708 can transmit the heatmap(s) to, for example, the orchestration circuitry 1710.

Figure 26:
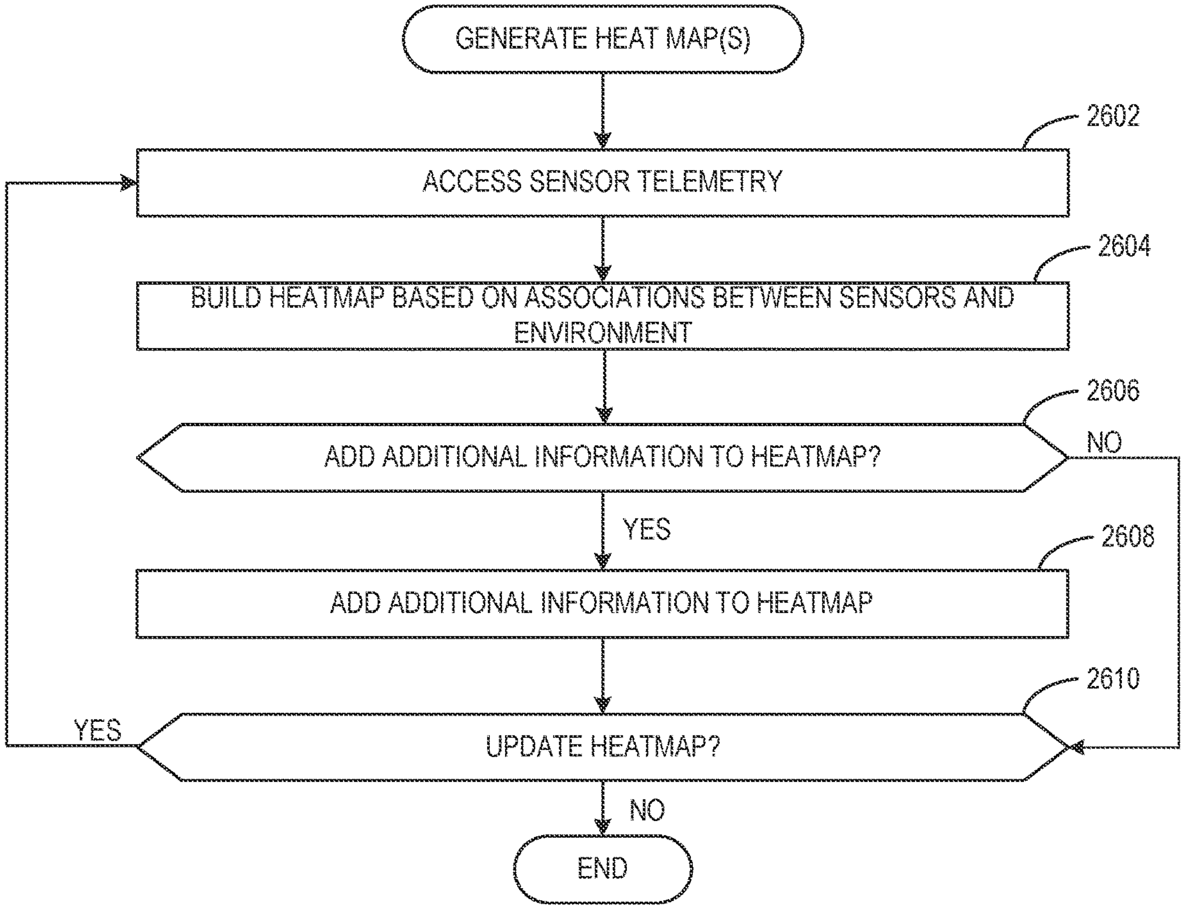
FIG. 26 is another flowchart representative of example machine readable instructions and/or example operations that may be executed, instantiated, and/or performed by example programmable circuitry to implement the telemetry analysis circuitry of FIG. 19 to generate heatmaps.

FIG. 26 is a flowchart representative of example machine readable instructions and/or example operations 2600 that may be executed, instantiated, and/or performed by programmable circuitry to generate a heatmap of an edge environment (e.g., the environment 1700) in connection with block 2514 of FIG. 25. The example machine-readable instructions and/or the example operations 2600 of FIG. 26 begin at block 2502, at which the telemetry analysis circuitry 1708 accesses the sensor telemetry from the sensor circuitry 1706 representing outputs of the sensors 1707 in the environment 1700. For example, the interface circuitry 1910 can receive the sensor telemetry via the network 1712. In some examples, the interface circuitry 1910 accesses the sensor telemetry via a pub/sub protocol.

At block 2604, the telemetry analysis circuitry 1708 builds one or more heatmap(s) based on the sensor telemetry and the associations between the respective ones of the sensor circuitry 1706 and the corresponding locations, edge devices 1702, 1718, 1720, 1726, and/or pipes 1714, 1716. In some examples, the heatmap generation circuitry 1930 identifies a metric communicated by the sensor telemetry and location, edge device 1702, 1718, 1720, 1726, and/or pipe 1714, 1716 associated with the respective sensor 1707 from which the sensor outputs were obtained. In such examples, the heatmap generation circuitry 1930 attributes the metric to the corresponding location, edge device 1702, 1718, 1720, 1726, and/or pipe 1714, 1716. In some examples, the heatmap generation circuitry 1930 generates various heatmaps for different metrics. In some examples, the heatmap generation circuitry 1930 includes multiple metrics in the same heatmap. In some examples, the heatmap generation circuitry 1930 updates the heatmap based on the sensor telemetry in substantially real time.

At block 2606, the telemetry analysis circuitry 1708 determines whether to add additional information to the heatmap(s) (e.g., details about the coolant flow paths, compute performance telemetry, SLAs, SLOs, resource usage, resource availability, etc.). In response to the telemetry analysis circuitry 1708 determining to add additional information to the heatmap(s) (e.g., block 2606 returns a result of YES based on, for example, a user request or a setting), control proceeds to block 2608. Otherwise, in response to the telemetry analysis circuitry 1708 determining not to add additional information to the heatmaps(s) (e.g., block 2606 returns a result of NO), control terminates.

At block 2608, the telemetry analysis circuitry 1708 adds additional information to the heatmap(s). In some examples, the heatmap generation circuitry 1930 indicates a flow path and/or potential flow paths of the coolant in the heatmap(s).

For example, the heatmap generation circuitry 1930 can identify the flow path and/or potential flow paths based on the cooling strategy and/or cooling parameter(s) implemented by the cooling strategy determination circuitry 1950. In some examples, the heatmap generation circuitry 1930 overlays the flow path and/or potential flow paths on one or more images of the environment 1700 representative of the heatmap(s). For example, an actual flow path of the coolant can be indicated by a solid line in the image and potential flow paths can be indicated by dashed lines in the image. In some examples, the heatmap generation circuitry 1930 indicates the flow path and/or potential flow paths of the coolant via a numerical order in which the respective edge devices 1702, 1718, 1720, 1726 and the CDUs 1704, 1721, 1724 encounter the coolant in the cooling strategy and/or cooling parameter(s). In some examples, the heatmap generation circuitry 1930 indicates a flow rate of the fluid with the flow path in the heatmap(s). In some examples, the telemetry analysis circuitry 1708 accesses the compute performance telemetry and/or SLOs associated with the edge devices 1702, 1718, 1720, 1726. For example, the heatmap generation circuitry 1930 can access compute performance telemetry and/or SLOs associated with the compute device(s) 1726 via the interface circuitry 1910 and the SLO datastore 1980, respectively. In some examples, the telemetry analysis circuitry 1708 indicates the compute performance telemetry and/or the SLOs in the heatmap(s). For example, the heatmap generation circuitry 1930 can indicate the compute performance telemetry and/or the SLOs in the heatmap(s). In some examples, the heatmap generation circuitry 1930 updates the compute performance telemetry and/or the SLOs in the heatmap(s) in response to a metric in the telemetry and/or the SLOs changing. In some examples, the heatmap generation circuitry 1930 flags an area(s) in the heatmap in which the metric associated with the coolant and/or the edge devices 1702, 1718, 1720, 1726 does not satisfy a threshold associated with the SLO of the edge devices 1702, 1718, 1720, 1726 and/or the workload(s) associated therewith. In some examples, the heatmap generation circuitry 1930 indicates a difference between the metric and the threshold in the heatmap(s). In some examples, the heatmap generation circuitry 1930 indicates resource usage and/or resource availability for the compute device(s) 1726 and/or the associated tenants in the heatmap.

At block 2610, the telemetry analysis circuitry 1708 determines whether to update the heatmap(s). In response to the telemetry analysis circuitry 1708 determining to update the heatmap(s) (e.g., block 2612 returns a result of YES based on, for example, newly received sensor telemetry), control returns to block 2602. Otherwise, in response to the telemetry analysis circuitry 1708 determining not to update the heatmaps(s) (e.g., block 2612 returns a result of NO), control terminates.

FIG. 27 is a flowchart representative of example machine readable instructions and/or example operations 2700 that may be executed, instantiated, and/or performed by programmable circuitry to generate a cooling strategy and/or cooling parameter(s) for providing coolant to compute devices (e.g., the compute device(s) 1726 of FIG. 17, the compute devices 2102 of FIGS. 21 and/or 22, the compute components 2204 of FIG. 22) in an environment (e.g., the environment 1700) based on factors such as sensor telemetry, workloads and SLOs associated with the compute devices, and resource consumption. The example machine-readable instructions and/or the example operations 2700 of FIG. 27 begin at block 2702, at which the orchestration circuitry accesses one or more heatmap(s) of the environment 1700. For example, the interface circuitry 2310 can access the heatmap(s) (e.g., the heatmaps 2000, 2030, 2060 of FIGS. 20A-20C) generated by the telemetry analysis circuitry 1708.

At block 2704, the orchestration circuitry 1710 identifies one or more workload(s) of the compute device(s) 1726, the compute devices 2102, and/or the compute components 2204. For example, the workload analysis circuitry 2360 can determine the workloads being performed or expected to be performed by the compute device(s) 1726, 2102 and/or the compute components 2204 based on the workload data 2384. In some examples, the workload analysis circuitry 2360 determines the workloads of the respective compute device(s) 1726, the respective compute devices 2102, the receive compute components 2204, and/or the tenants based on the heatmap(s) and/or communications with the respective compute device(s) 1726, the respective compute devices 2102, and/or the receive compute components 2204.

At block 2706, the orchestration circuitry 1710 identifies SLOs associated with the workload(s) being, or to be, performed. For example, the SLO identification circuitry 2320 can identify the SLO(s) (and/or related SLA data) associated with the workload(s); the respective compute device(s) 1726, 2102; the compute components 2204; and/or the tenants based on the SLO data 2386. In some examples, the SLO identification circuitry 2320 identifies the SLO(s) via the heatmap(s) generated by the telemetry analysis circuitry 1708. In some examples, the SLO identification circuitry 2320 identifies QoS targets and/or thermal targets of the workload(s), the compute device(s) 1726, 2102, and/or the compute components 2204. In some examples, the SLO identification circuitry 2320 identifies a target throughput, a target latency, target instructions per second, etc. The SLO(s) can be based on agreements between the provider of the edge appliance 1702 and the respective tenants for certain workloads and/or ones of the compute device(s) 1726, 2102 and/or the compute components 2204.

At block 2708, the orchestration circuitry 1710 identifies an allocation of compute resources associated with the SLO(s). For example, the resource identification circuitry 2330 can determine the compute resources (e.g., the respective compute device(s) 1726, the respective compute devices 2102, the receive compute components 2204, and/or portions thereof) that can be utilized to achieve the SLOs during performance of the workload(s). In some examples, the resource identification circuitry 2330 determines the compute resources based on the resource data 2388. For example, the resource data 2388 can indicate compute resources available for respective tenants and/or workloads.

At block 2710, the orchestration circuitry 1710 identifies cooling targets based on the workload(s), the SLO(s), and/or the compute resources associated with the workload(s) and/or the SLO(s). For example, the thermal target determination circuitry 2340 can determine particular ones of the compute resources to perform the workload(s) and/or an amount of the compute resources to be used to achieve the SLOs. In some examples, the thermal target determination circuitry 2340 determines (e.g., predicts) heat influx or an amount of heat generated by the compute devices 1726, 2102, 2204 as result of performance of on the workload(s) to achieve the SLOs. In some examples, the thermal target determination circuitry determines the heat influx associated with the workload(s) based on the heatmap(s). In some examples, the thermal target determination circuitry 2340 determines a target heat outflux threshold (e.g., heat dissipation) based on the heat influx. In some such examples, the target heat outflux threshold is defined to maintain the compute resources within a certain operating temperature range that facilitates performance of the workload(s) while achieving the SLOs associated with the tenant and/or the workload(s).

At block 2712, the orchestration circuitry 1710 evaluates the cooling target(s) to determine if, for example, the cooling target(s) are attainable or likely attainable in view of current workload distribution(s). For example, the coolant analysis circuitry 2350 can determine (e.g., predict) a maximum heat likely to be dissipated by coolant in view of coolant properties, operating parameters of the CDU(s) 1704, 1721, 1724 and/or sub-CDU 2202, etc. If the coolant analysis circuitry 2350 determines that the cooling target(s) are likely attainable (e.g., the block 2712 returns YES), control skips to block 2716. Otherwise, control proceeds to block 2714.

At block 2714, the orchestration circuitry 1710 determines a distribution and/or schedule for performance of the workload(s) to promote efficient cooling of the compute devices 1726, 2102. For example, the workload analysis circuitry 2360 can determine the workload distribution and/or schedule based on based on available coolant, coolant properties, expected amounts of heat to be generated as a result of the performance of the workloads, expected heat dissipation during cooling, workload priority, SLO(s), CDU operating parameters, etc. In some examples, the workload analysis circuitry 2360 redistributes the workload(s) between available compute resources. In some examples, the workload analysis circuitry 2360 causes the interface circuitry 2310 to transmit signals to the compute resources to cause initiate, redistribute, or delay performance of the workload(s).

At block 2716, the orchestration circuitry 1710 determines coolant properties to be provided for cooling in the environment 1700 and, in particular, for cooling the compute devices 1726, 2102 and/or the component(s) 2204 thereof. For example, the cooling strategy determination circuitry 2370 can determine coolant parameters to achieve the target heat outflux or dissipation threshold(s). In some examples, the cooling strategy determination circuitry 2370 determines the coolant parameters that can provide for target cooling metrics in view of workload performance based on the cooling strategy data 2390. For example, the cooling strategy data 2390 can indicate respective coolant parameters that facilitate heat dissipation for certain compute resources (e.g., resource types and/or sizes) and/or workload parameters (e.g., throughputs, instructions per second, latency, etc.).

At block 2718, the orchestration circuitry 1710 generates and outputs instructions to control the CDU(s) 1704, 1721, 1724 and/or sub-CDU(s) 2202 based on the determined coolant parameters. For example, the cooling strategy determination circuitry 2370 can determine operating parameters of the CDU(s) 1704, 1721, 1724 and/or sub-CDU(s) 2202 that result in coolant having determined coolant parameters. In some examples, the cooling strategy determination circuitry 2370 causes the interface circuitry 2310 to transmit a signal indicative of the operating parameters to the CDU(s) 1704, 1721, 1724 and/or sub-CDU(s) 2202 for implementation.

At block 2720, the orchestration circuitry 1710 determines whether to continue monitoring the environment. In response to the orchestration circuitry 1710 determining to continue monitoring (e.g., block 2720 returns a result of YES), control returns to block 2702. Otherwise, in response to the telemetry analysis circuitry 1708 determining not to continue monitoring (e.g., block 2720 returns a result of NO), control terminates.

Figure 28:
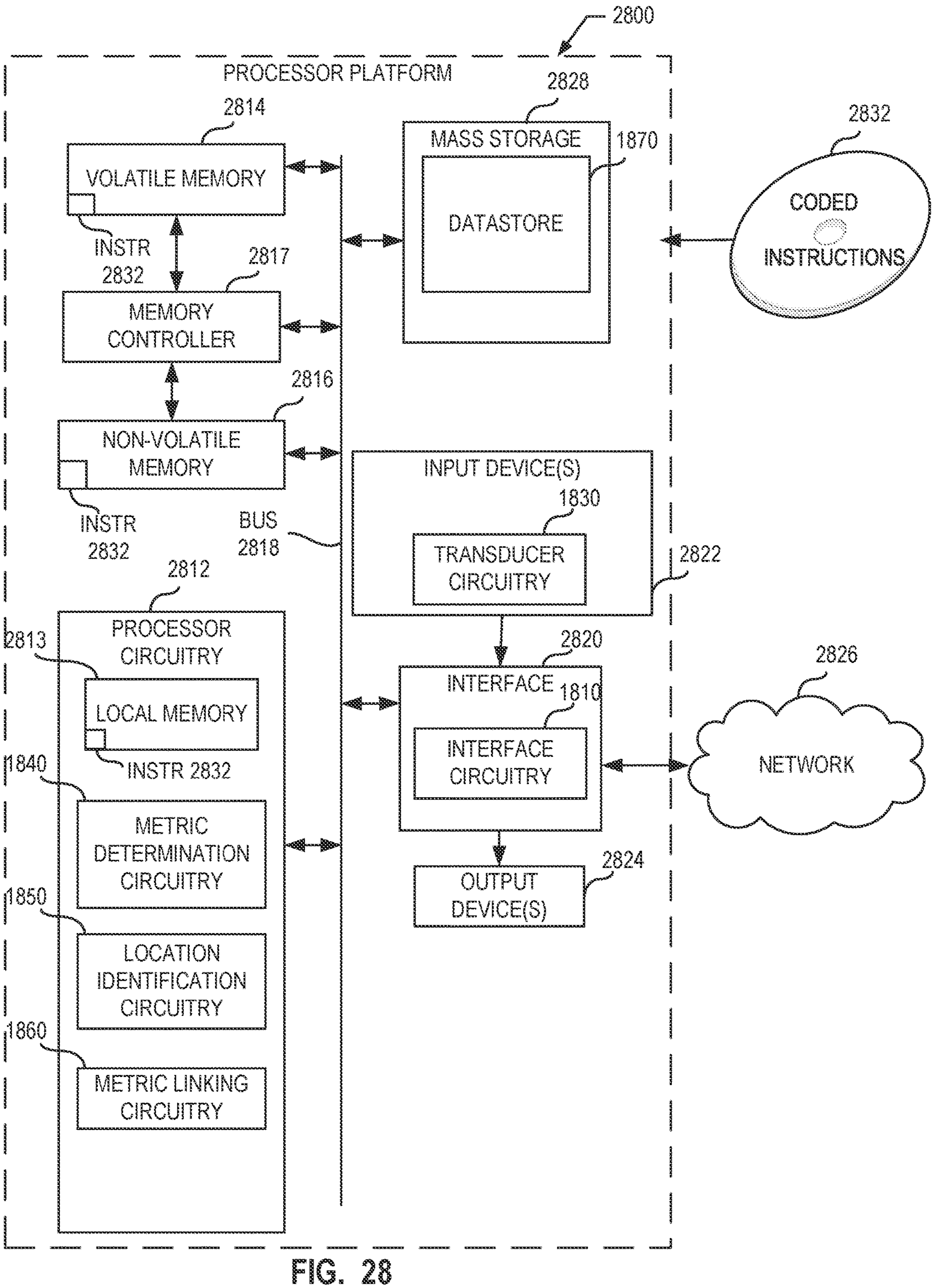
FIG. 28 is a block diagram of an example processing platform including programmable circuitry structured to execute, instantiate, and/or perform the example machine readable instructions and/or perform the example operations of FIG. 24 to implement the sensor circuitry of FIGS. 17 and 18.

FIG. 28 is a block diagram of an example programmable circuitry platform 2800 structured to execute and/or instantiate the example machine-readable instructions and/or the example operations of FIG. 24 to implement the sensor circuitry 1706 of FIG. 18. The programmable circuitry platform 2800 can be, for example, a transducer and a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing and/or electronic device.

The programmable circuitry platform 2800 of the illustrated example includes programmable circuitry 2812. The programmable circuitry 2812 of the illustrated example is hardware. For example, the programmable circuitry 2812 can be implemented by one or more integrated circuits, logic circuits, FPGAs, microprocessors, CPUs, GPUs, DSPs, and/or microcontrollers from any desired family or manufacturer. The programmable circuitry 2812 may be implemented by one or more semiconductor based (e.g., silicon based) devices. In this example, the programmable circuitry 2812 implements the metric determination circuitry 1840, the location identification circuitry 1850, and the metric linking circuitry 1860.

The programmable circuitry 2812 of the illustrated example includes a local memory 2813 (e.g., a cache, registers, etc.). The programmable circuitry 2812 of the illustrated example is in communication with main memory 2814, 2816, which includes a volatile memory 2814 and a non-volatile memory 2816, by a bus 2818. The volatile memory 2814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2816 may be implemented by flash memory and/or any other desired type of memory device. Access to the main memory 2814, 2816 of the illustrated example is controlled by a memory controller 2817. In some examples, the memory controller 2817 may be implemented by one or more integrated circuits, logic circuits, microcontrollers from any desired family or manufacturer, or any other type of circuitry to manage the flow of data going to and from the main memory 2814, 2816.

The programmable circuitry platform 2800 of the illustrated example also includes interface circuitry 2820. The interface circuitry 2820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In this example, the interface circuitry 2820 implements the interface circuitry 1810.

In the illustrated example, one or more input devices 2822 are connected to the interface circuitry 2820. The input device(s) 2822 permit(s) a user (e.g., a human user, a machine user, etc.) to enter data and/or commands into the programmable circuitry 2812. The input device(s) 2822 can be implemented by, for example, an audio sensor, a microphone, a camera (still or video), a keyboard, a button, a mouse, a touchscreen, a trackpad, a trackball, an isopoint device, a temperature sensor, a pressure sensor, a density sensor, a chemical composition sensor, and/or a flow rate sensor.

One or more output devices 2824 are also connected to the interface circuitry 2820 of the illustrated example. The output device(s) 2824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2820 of the illustrated example, thus, typically includes a graphics driver card, a graphics driver chip, and/or graphics processor circuitry such as a GPU.

The interface circuitry 2820 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2826. The communication can be by, for example, an Ethernet connection, a digital subscriber line (DSL) connection, a telephone line connection, a coaxial cable system, a satellite system, a beyond-line-of-site wireless system, a line-of-site wireless system, a cellular telephone system, an optical connection, etc.

The programmable circuitry platform 2800 of the illustrated example also includes one or more mass storage discs or devices 2828 to store firmware, software, and/or data. Examples of such mass storage discs or devices 2828 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs. In this example, the mass storage discs or devices 2828 implements the datastore 1870.

The machine readable instructions 2832, which may be implemented by the machine readable instructions of FIG. 24, may be stored in the mass storage device 2828, in the volatile memory 2814, in the non-volatile memory 2816, and/or on at least one non-transitory computer readable storage medium such as a CD or DVD which may be removable.

Figure 29:
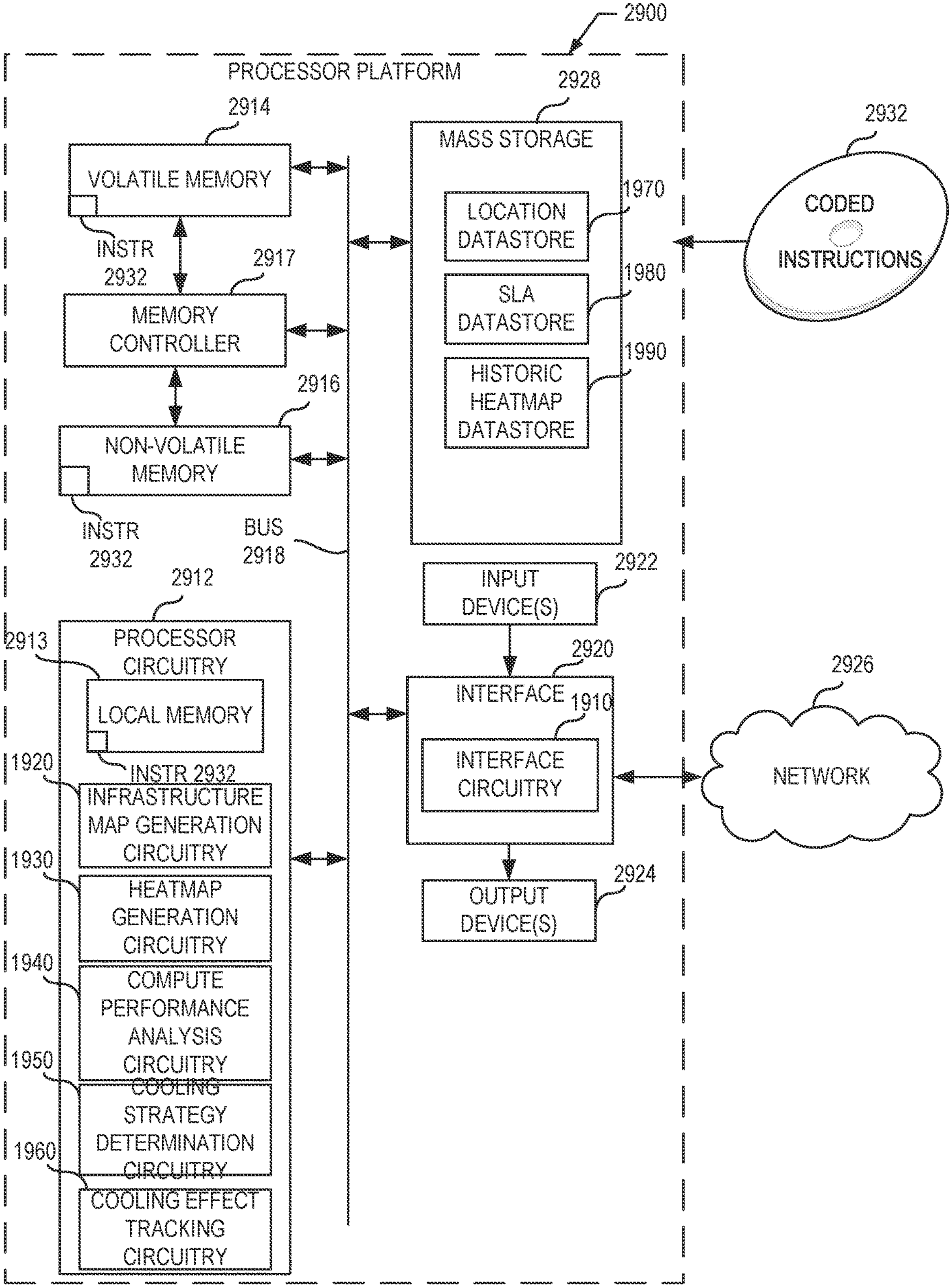
FIG. 29 is a block diagram of an example processing platform including programmable circuitry structured to execute, instantiate, and/or perform the example machine readable instructions and/or perform the example operations of FIGS. 25-26 to implement the telemetry analysis circuitry of FIGS. 17 and 19.

FIG. 29 is a block diagram of an example programmable circuitry platform 2900 structured to execute and/or instantiate the example machine-readable instructions and/or the example operations of FIGS. 25 and/or 26 to implement the telemetry analysis circuitry 1708 of FIG. 19. The programmable circuitry platform 2900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 2900 of the illustrated example includes programmable circuitry 2912. The programmable circuitry 2912 of the illustrated example is hardware. For example, the programmable circuitry 2912 can be implemented by one or more integrated circuits, logic circuits, FPGAs, microprocessors, CPUs, GPUs, DSPs, and/or microcontrollers from any desired family or manufacturer. The programmable circuitry 2912 may be implemented by one or more semiconductor based (e.g., silicon based) devices. In this example, the programmable circuitry 2912 implements the infrastructure map generation circuitry 1920, the heatmap generation circuitry 1930, and/or the compute performance analysis circuitry 1940.

The programmable circuitry 2912 of the illustrated example includes a local memory 2913 (e.g., a cache, registers, etc.). The programmable circuitry 2912 of the illustrated example is in communication with main memory 2914, 2916, which includes a volatile memory 2914 and a non-volatile memory 2916, by a bus 2918. The volatile memory 2914 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2916 may be implemented by flash memory and/or any other desired type of memory device. Access to the main memory 2914, 2916 of the illustrated example is controlled by a memory controller 2917. In some examples, the memory controller 2917 may be implemented by one or more integrated circuits, logic circuits, microcontrollers from any desired family or manufacturer, or any other type of circuitry to manage the flow of data going to and from the main memory 2914, 2916.

The programmable circuitry platform 2900 of the illustrated example also includes interface circuitry 2920. The interface circuitry 2920 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In this example, the interface circuitry 2920 implements the interface circuitry 1910.

In the illustrated example, one or more input devices 2922 are connected to the interface circuitry 2920. The input device(s) 2922 permit(s) a user (e.g., a human user, a machine user, etc.) to enter data and/or commands into the programmable circuitry 2912. The input device(s) 2922 can be implemented by, for example, an audio sensor, a microphone, a camera (still or video), a keyboard, a button, a mouse, a touchscreen, a trackpad, a trackball, an isopoint device, and/or a voice recognition system.

One or more output devices 2924 are also connected to the interface circuitry 2920 of the illustrated example. The output device(s) 2924 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2920 of the illustrated example, thus, typically includes a graphics driver card, a graphics driver chip, and/or graphics processor circuitry such as a GPU.

The interface circuitry 2920 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2926. The communication can be by, for example, an Ethernet connection, a digital subscriber line (DSL) connection, a telephone line connection, a coaxial cable system, a satellite system, a beyond-line-of-site wireless system, a line-of-site wireless system, a cellular telephone system, an optical connection, etc.

The programmable circuitry platform 2900 of the illustrated example also includes one or more mass storage discs or devices 2928 to store firmware, software, and/or data. Examples of such mass storage discs or devices 2928 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs. In this example, the mass storage discs or devices 2928 implements the location datastore 1970, the SLO datastore 1980, and the historic heatmap datastore 1990.

The machine readable instructions 2932, which may be implemented by the machine readable instructions of FIGS. 25, 26, and/or 27, may be stored in the mass storage device 2928, in the volatile memory 2914, in the non-volatile memory 2916, and/or on at least one non-transitory computer readable storage medium such as a CD or DVD which may be removable.

Figure 30:
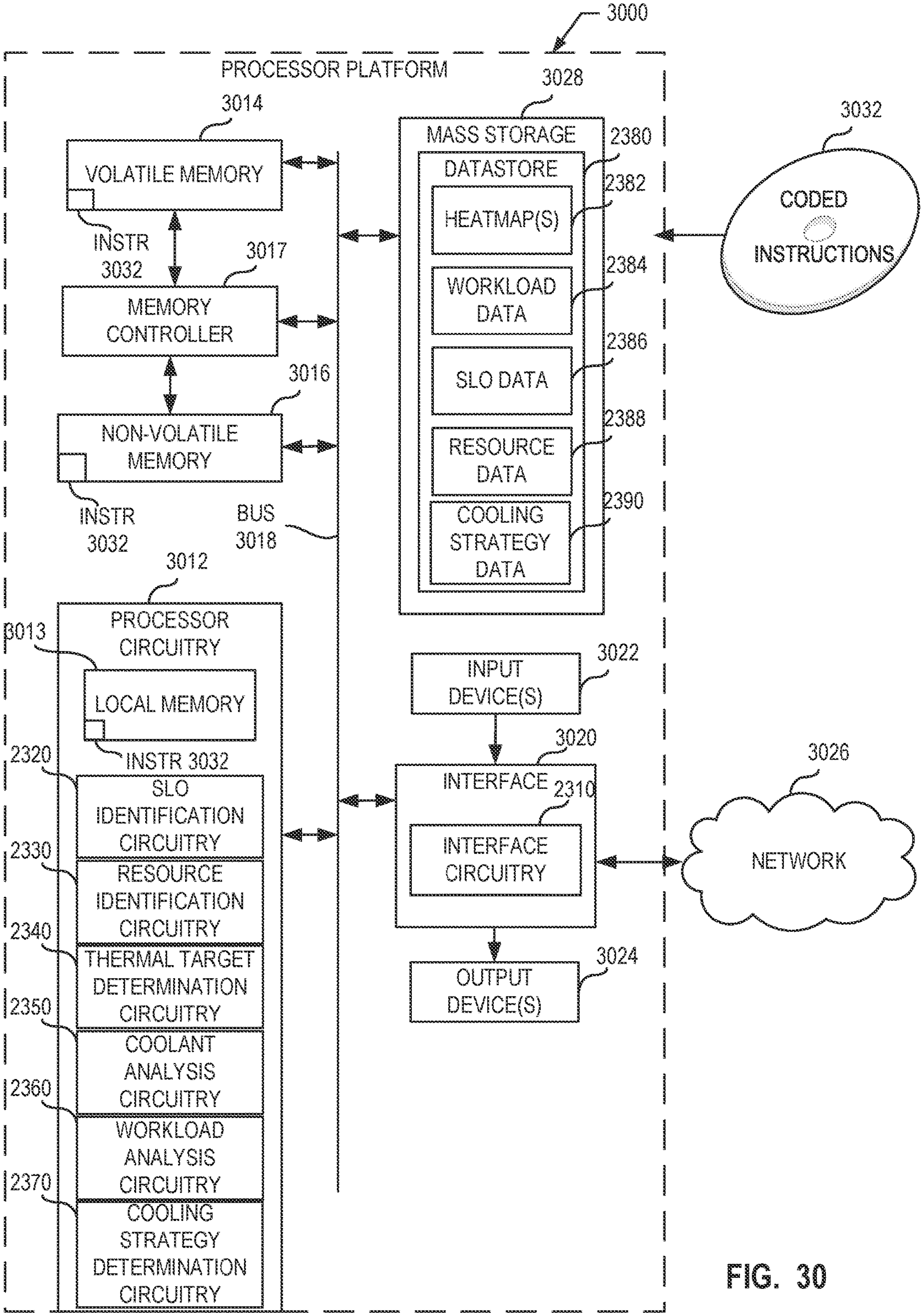
FIG. 30 is a block diagram of an example processing platform including programmable circuitry structured to execute, instantiate, and/or perform the example machine readable instructions and/or perform the example operations of FIG. 27 to implement the orchestration circuitry of FIGS. 17 and 23.

FIG. 30 is a block diagram of an example programmable circuitry platform 3000 structured to execute and/or instantiate the example machine-readable instructions and/or the example operations of FIG. 27 to implement the orchestration circuitry 1710 of FIG. 23. The programmable circuitry platform 3000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, etc.) or other wearable device, or any other type of computing and/or electronic device.

The programmable circuitry platform 3000 of the illustrated example includes programmable circuitry 3012. The programmable circuitry 3012 of the illustrated example is hardware. For example, the programmable circuitry 3012 can be implemented by one or more integrated circuits, logic circuits, FPGAs, microprocessors, CPUs, GPUs, DSPs, and/or microcontrollers from any desired family or manufacturer. The programmable circuitry 3012 may be implemented by one or more semiconductor based (e.g., silicon based) devices. In this example, the programmable circuitry 3012 implements the SLO identification circuitry 2320, the resource identification circuitry 2330, the thermal target determination circuitry 2340, the coolant analysis circuitry 2350, the workload analysis circuitry 2360, and the cooling strategy determination circuitry 2370.

The programmable circuitry 3012 of the illustrated example includes a local memory 3013 (e.g., a cache, registers, etc.). The programmable circuitry 3012 of the illustrated example is in communication with main memory 3014, 3016, which includes a volatile memory 3014 and a non-volatile memory 3016, by a bus 3018. The volatile memory 3014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 3016 may be implemented by flash memory and/or any other desired type of memory device. Access to the main memory 3014, 3016 of the illustrated example is controlled by a memory controller 3017. In some examples, the memory controller 3017 may be implemented by one or more integrated circuits, logic circuits, microcontrollers from any desired family or manufacturer, or any other type of circuitry to manage the flow of data going to and from the main memory 3014, 3016.

The programmable circuitry platform 3000 of the illustrated example also includes interface circuitry 3020. The interface circuitry 3020 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In this example, the interface circuitry 3020 implements the interface circuitry 2310.

In the illustrated example, one or more input devices 3022 are connected to the interface circuitry 3020. The input device(s) 3022 permit(s) a user (e.g., a human user, a machine user, etc.) to enter data and/or commands into the programmable circuitry 3012. The input device(s) 3022 can be implemented by, for example, an audio sensor, a microphone, a camera (still or video), a keyboard, a button, a mouse, a touchscreen, a trackpad, a trackball, an isopoint device, and/or a voice recognition system.

One or more output devices 3024 are also connected to the interface circuitry 3020 of the illustrated example. The output device(s) 3024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 3020 of the illustrated example, thus, typically includes a graphics driver card, a graphics driver chip, and/or graphics processor circuitry such as a GPU.

The interface circuitry 3020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 3026. The communication can be by, for example, an Ethernet connection, a digital subscriber line (DSL) connection, a telephone line connection, a coaxial cable system, a satellite system, a beyond-line-of-site wireless system, a line-of-site wireless system, a cellular telephone system, an optical connection, etc.

The programmable circuitry platform 3000 of the illustrated example also includes one or more mass storage discs or devices 3028 to store firmware, software, and/or data. Examples of such mass storage discs or devices 3028 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs. In this example, the one or more mass storage discs or devices 3028 implement the datastore 2380 including the heatmap(s) 2382, the workload data 2384, the service level objective data 2386, the workload resource data 2388, and/or the cooling strategy data 2390.

The machine readable instructions 3032, which may be implemented by the machine readable instructions of FIGS. 27 and/or 28, may be stored in the mass storage device 3028, in the volatile memory 3014, in the non-volatile memory 3016, and/or on at least one non-transitory computer readable storage medium such as a CD or DVD which may be removable.

Figure 31:
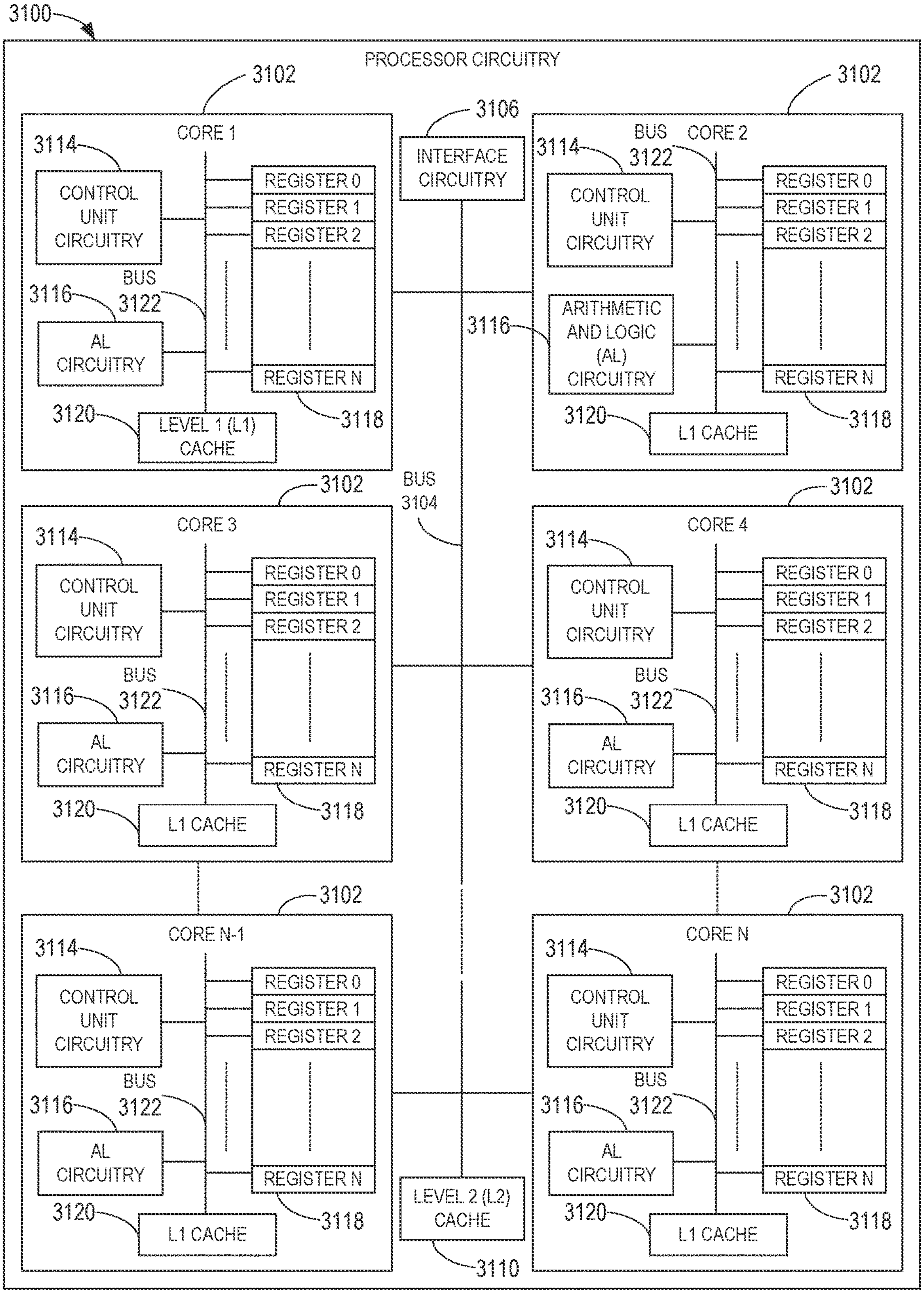
FIG. 31 is a block diagram of an example implementation of the programmable circuitry of FIGS. 28, 29, and/or 30.

FIG. 31 is a block diagram of an example implementation of the programmable circuitry 2812, 2912, 3012 of FIGS. 29, 30, and/or 31. In this example, the programmable circuitry 2812, 2912, 3012 of FIGS. 29, 30, and/or 31 is implemented by a microprocessor 3100. For example, the microprocessor 3100 may be a general-purpose microprocessor (e.g., general-purpose microprocessor circuitry). The microprocessor 3100 executes some or all of the machine-readable instructions of the flowcharts of FIGS. 24-27 to effectively instantiate the circuitry of FIG. 2 as logic circuits to perform operations corresponding to those machine readable instructions. In some such examples, the circuitry of FIGS. 18, 19, and/or 23 is instantiated by the hardware circuits of the microprocessor 3100 in combination with the machine-readable instructions. For example, the microprocessor 3100 may be implemented by multi-core hardware circuitry such as a CPU, a DSP, a GPU, an XPU, etc. Although it may include any number of example cores 3102

(e.g., 1 core), the microprocessor 3100 of this example is a multi-core semiconductor device including N cores. The cores 3102 of the microprocessor 3100 may operate independently or may cooperate to execute machine readable instructions. For example, machine code corresponding to a firmware program, an embedded software program, or a software program may be executed by one of the cores 3102 or may be executed by multiple ones of the cores 3102 at the same or different times. In some examples, the machine code corresponding to the firmware program, the embedded software program, or the software program is split into threads and executed in parallel by two or more of the cores 3102. The software program may correspond to a portion or all of the machine readable instructions and/or operations represented by the flowcharts of FIGS. 24-27.

The cores 3102 may communicate by a first example bus 3104. In some examples, the first bus 3104 may be implemented by a communication bus to effectuate communication associated with one(s) of the cores 3102. For example, the first bus 3104 may be implemented by at least one of an Inter-Integrated Circuit (I2C) bus, a Serial Peripheral Interface (SPI) bus, a PCI bus, or a PCIe bus. Additionally or alternatively, the first bus 3104 may be implemented by any other type of computing or electrical bus. The cores 3102 may obtain data, instructions, and/or signals from one or more external devices by example interface circuitry 3106. The cores 3102 may output data, instructions, and/or signals to the one or more external devices by the interface circuitry 3106. Although the cores 3102 of this example include example local memory 3120 (e.g., Level 1 (L1) cache that may be split into an L1 data cache and an L1 instruction cache), the microprocessor 3100 also includes example shared memory 3110 that may be shared by the cores (e.g., Level 2 (L2 cache)) for high-speed access to data and/or instructions. Data and/or instructions may be transferred (e.g., shared) by writing to and/or reading from the shared memory 3110. The local memory 3120 of each of the cores 3102 and the shared memory 3110 may be part of a hierarchy of storage devices including multiple levels of cache memory and the main memory (e.g., the main memory 2814, 2816, 2914, 2916, 3014, 3016 of FIGS. 28-30). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 3102 may be referred to as a CPU, DSP, GPU, etc., or any other type of hardware circuitry. Each core 3102 includes control unit circuitry 3114, arithmetic and logic (AL) circuitry (sometimes referred to as an ALU) 3116, a plurality of registers 3118, the local memory 3120, and a second example bus 3122. Other structures may be present. For example, each core 3102 may include vector unit circuitry, single instruction multiple data (SIMD) unit circuitry, load/store unit (LSU) circuitry, branch/jump unit circuitry, floating-point unit (FPU) circuitry, etc. The control unit circuitry 3114 includes semiconductor-based circuits structured to control (e.g., coordinate) data movement within the corresponding core 3102. The AL circuitry 3116 includes semiconductor-based circuits structured to perform one or more mathematic and/or logic operations on the data within the corresponding core 3102. The AL circuitry 3116 of some examples performs integer based operations. In other examples, the AL circuitry 3116 also performs floating-point operations. In yet other examples, the AL circuitry 3116 may include first AL circuitry that performs integer-based operations and second AL circuitry that performs floating-point operations. In some examples, the AL circuitry 3116 may be referred to as an Arithmetic Logic Unit (ALU).

The registers 3118 are semiconductor-based structures to store data and/or instructions such as results of one or more of the operations performed by the AL circuitry 3116 of the corresponding core 3102. For example, the registers 3118 may include vector register(s), SIMD register(s), general-purpose register(s), flag register(s), segment register(s), machine-specific register(s), instruction pointer register(s), control register(s), debug register(s), memory management register(s), machine check register(s), etc. The registers 3118 may be arranged in a bank as shown in FIG. 31. Alternatively, the registers 3118 may be organized in any other arrangement, format, or structure, such as by being distributed throughout the core 3102 to shorten access time. The second bus 3122 may be implemented by at least one of an I2C bus, a SPI bus, a PCI bus, or a PCIe bus.

Each core 3102 and/or, more generally, the microprocessor 3100 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 3100 is a semiconductor device fabricated to include many transistors interconnected to implement the structures described above in one or more integrated circuits (ICs) contained in one or more packages.

The microprocessor 3100 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those discussed herein. A GPU, DSP and/or other programmable device can also be an accelerator. Accelerators may be on-board the microprocessor 3100, in the same chip package as the microprocessor 3100 and/or in one or more separate packages from the microprocessor 3100.

Figure 32:
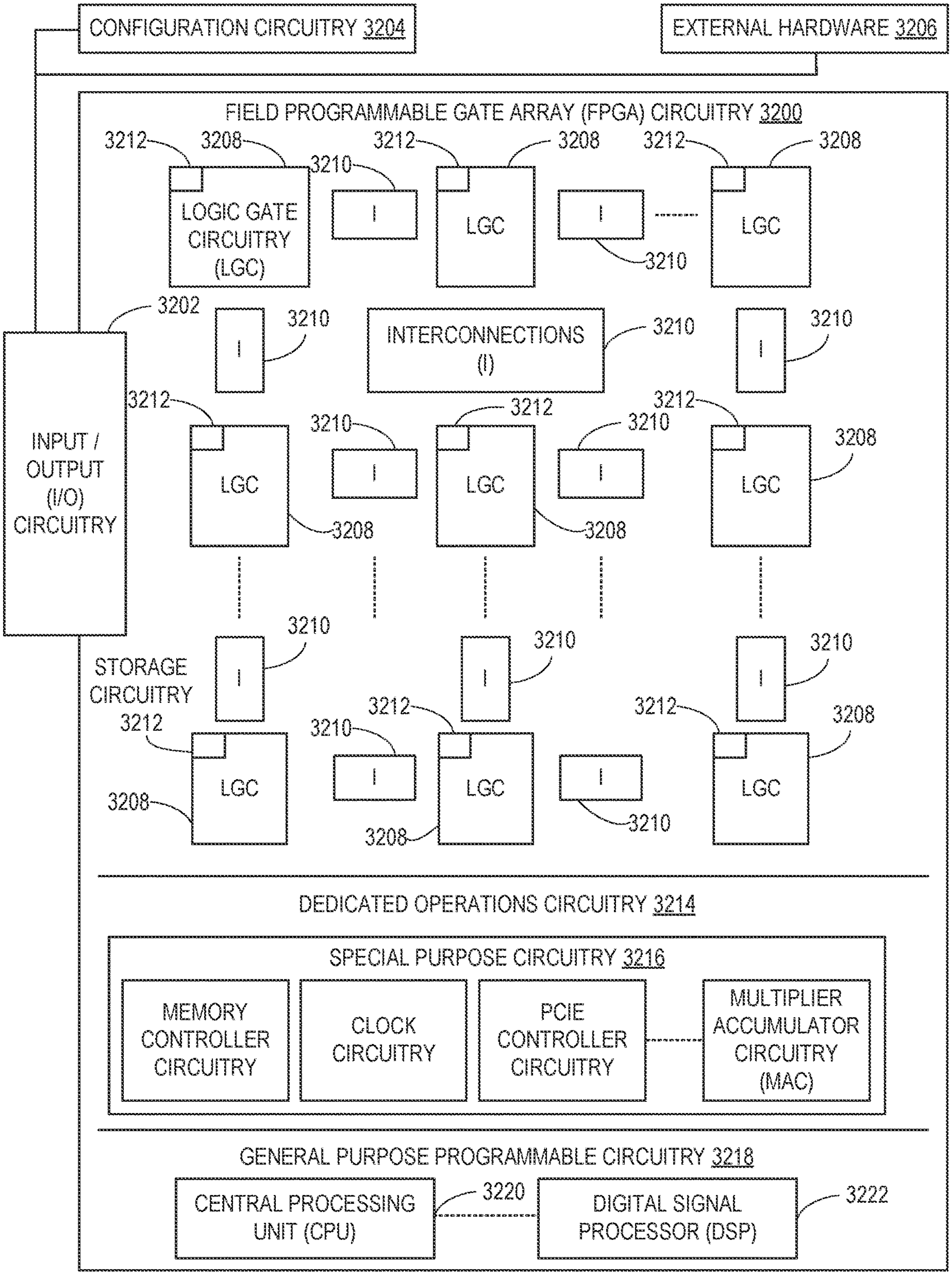
FIG. 32 is a block diagram of another example implementation of the programmable circuitry of FIGS. 28, 29, and/or 30.

FIG. 32 is a block diagram of another example implementation of the programmable circuitry 2812, 2912, 3012 of FIGS. 28-30. In this example, the programmable circuitry 2812, 2912, 3012 is implemented by FPGA circuitry 3290. For example, the FPGA circuitry 3290 may be implemented by an FPGA. The FPGA circuitry 3290 can be used, for example, to perform operations that could otherwise be performed by the example microprocessor 3100 of FIG. 31 executing corresponding machine readable instructions. However, once configured, the FPGA circuitry 3290 instantiates the operations and/or functions corresponding to the machine readable instructions in hardware and, thus, can often execute the operations/functions faster than they could be performed by a general-purpose microprocessor executing the corresponding software.

More specifically, in contrast to the microprocessor 3100 of FIG. 31 described above (which is a general purpose device that may be programmed to execute some or all of the machine readable instructions represented by the flowchart(s) of FIGS. 24-27 but whose interconnections and logic circuitry are fixed once fabricated), the FPGA circuitry 3290 of the example of FIG. 32 includes interconnections and logic circuitry that may be configured, structured, programmed, and/or interconnected in different ways after fabrication to instantiate, for example, some or all of the operations/functions corresponding to the machine readable instructions represented by the flowchart(s) of FIGS. FIGS. 24-27. In particular, the FPGA circuitry 3290 may be thought of as an array of logic gates, interconnections, and switches. The switches can be programmed to change how the logic gates are interconnected by the interconnections, effectively forming one or more dedicated logic circuits (unless and until the FPGA circuitry 3290 is reprogrammed). The configured logic circuits enable the logic gates to cooperate in different ways to perform different operations on data received by input circuitry.

Those operations may correspond to some or all of the instructions (e.g., the software and/or firmware) represented by the flowchart(s) of FIGS. FIGS. 24-27. As such, the FPGA circuitry 3290 may be configured and/or structured to effectively instantiate some or all of the operations/functions corresponding to the machine readable instructions of the flowchart(s) of FIGS. 24-27 as dedicated logic circuits to perform the operations/functions corresponding to those software instructions in a dedicated manner analogous to an ASIC. Therefore, the FPGA circuitry 3290 may perform the operations/functions corresponding to the some or all of the machine readable instructions of FIGS. 24-27 faster than the general-purpose microprocessor can execute the same.

In the example of FIG. 32, the FPGA circuitry 3290 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 3290 of FIG. 32 may access and/or load the binary file to cause the FPGA circuitry 3290 of FIG. 32 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 3290 of FIG. 32 to cause configuration and/or structuring of the FPGA circuitry 3290 of FIG. 32, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 3290 of FIG. 32 may access and/or load the binary file to cause the FPGA circuitry 3290 of FIG. 32 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 3290 of FIG. 32 to cause configuration and/or structuring of the FPGA circuitry 3290 of FIG. 32, or portion(s) thereof.

The FPGA circuitry 3290 of FIG. 32, includes example input/output (/O) circuitry 3292 to obtain and/or output data to/from example configuration circuitry 3204 and/or external hardware 3206. For example, the configuration circuitry 3204 may be implemented by interface circuitry that may obtain a binary file, which may be implemented by a bit stream, data, and/or machine-readable instructions, to configure the FPGA circuitry 3290, or portion(s) thereof. In some such examples, the configuration circuitry 3204 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 3206 may be implemented by external hardware circuitry. For example, the external hardware 3206 may be implemented by the microprocessor 3100 of FIG. 31.

The FPGA circuitry 3290 also includes an array of example logic gate circuitry 3208, a plurality of example configurable interconnections 3200, and example storage circuitry 3202. The logic gate circuitry 3208 and the configurable interconnections 3200 are configurable to instantiate one or more operations/functions that may correspond to at least some of the machine readable instructions of FIGS. 24-27 and/or other desired operations. The logic gate circuitry 3208 shown in FIG. 32 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 3208 to enable configuration of the electrical structures and/or the logic gates to form circuits to perform desired operations/functions. The logic gate circuitry 3208 may include other electrical structures such as look-up tables (LUTs), registers (e.g., flip-flops or latches), multiplexers, etc.

The configurable interconnections 3200 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 3208 to program desired logic circuits.

The storage circuitry 3202 of the illustrated example is structured to store result(s) of the one or more of the operations performed by corresponding logic gates. The storage circuitry 3202 may be implemented by registers or the like. In the illustrated example, the storage circuitry 3202 is distributed amongst the logic gate circuitry 3208 to facilitate access and increase execution speed.

The example FPGA circuitry 3290 of FIG. 32 also includes example dedicated operations circuitry 3214. In this example, the dedicated operations circuitry 3214 includes special purpose circuitry 3216 that may be invoked to implement commonly used functions to avoid the need to program those functions in the field. Examples of such special purpose circuitry 3216 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 3290 may also include example general purpose programmable circuitry 3218 such as an example CPU 3210 and/or an example DSP 3212. Other general purpose programmable circuitry 3218 may additionally or alternatively be present such as a GPU, an XPU, etc., that can be programmed to perform other operations.

Figure 33:
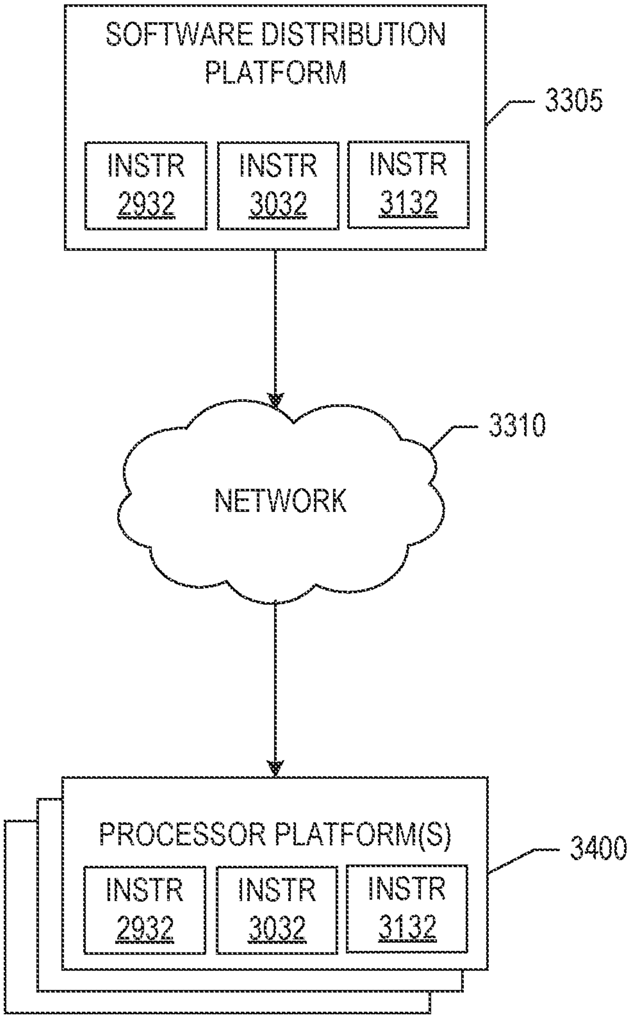
FIG. 33 is a block diagram of an example software/firmware/instructions distribution platform (e.g., one or more servers) to distribute software, instructions, and/or firmware (e.g., corresponding to the example machine readable instructions of FIGS. 24-27) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

Although FIGS. 32 and 33 illustrate two example implementations of the programmable circuitry 2812, 2912, 3012 of FIGS. 29, 30, and/or 31, many other approaches are contemplated. For example, FPGA circuitry may include an on-board CPU, such as one or more of the example CPU 3210 of FIG. 31. Therefore, the programmable circuitry 2812, 2912, 3012 of FIGS. 29, 30, and/or 31 may additionally be implemented by combining at least the example microprocessor 3100 of FIG. 31 and the example FPGA circuitry 3290 of FIG. 32. In some such hybrid examples, one or more cores 3102 of FIG. 31 may execute a first portion of the machine readable instructions represented by the flowchart(s) of FIGS. 24-27 to perform first operation(s)/function(s), the FPGA circuitry 3290 of FIG. 32 may be configured and/or structured to perform second operation(s)/function(s) corresponding to a second portion of the machine readable instructions represented by the flowcharts of FIG. FIGS. 24-27, and/or an ASIC may be configured and/or structured to perform third operation(s)/function(s) corresponding to a third portion of the machine readable instructions represented by the flowcharts of FIGS. FIGS. 24-27.

It should be understood that some or all of the circuitry of FIGS. 18, 19, and/or 23 may, thus, be instantiated at the same or different times. For example, same and/or different portion(s) of the microprocessor 3100 of FIG. 31 may be programmed to execute portion(s) of machine-readable instructions at the same and/or different times. In some examples, same and/or different portion(s) of the FPGA circuitry 3290 of FIG. 32 may be configured and/or structured to perform operations/functions corresponding to portion(s) of machine-readable instructions at the same and/or different times.

In some examples, some or all of the circuitry of FIGS. 18, 19, and/or 23 may be instantiated, for example, in one or more threads executing concurrently and/or in series. For example, the microprocessor 3100 of FIG. 31 may execute machine readable instructions in one or more threads executing concurrently and/or in series. In some examples, the FPGA circuitry 3290 of FIG. 32 may be configured and/or structured to carry out operations/functions concurrently and/or in series. Moreover, in some examples, some or all of the circuitry of FIGS. 18, 19, and/or 23 may be implemented within one or more virtual machines and/or containers executing on the microprocessor 3100 of FIG. 31.

In some examples, the programmable circuitry 2812, 2912, 3012 of FIGS. 29, 30, and/or 31 may be in one or more packages. For example, the microprocessor 3100 of FIG. 31 and/or the FPGA circuitry 3290 of FIG. 32 may be in one or more packages. In some examples, an XPU may be implemented by the programmable circuitry 2812, 2912, 3012 of FIGS. 29, 30, and/or 31, which may be in one or more packages. For example, the XPU may include a CPU (e.g., the microprocessor 3100 of FIG. 31, the CPU 3210 of FIG. 32, etc.) in one package, a DSP (e.g., the DSP 3212 of FIG. 32) in another package, a GPU in yet another package, and an FPGA (e.g., the FPGA circuitry 3290 of FIG. 32) in still yet another package.

A block diagram illustrating an example software distribution platform 3305 to distribute software such as the example machine readable instructions 2832, 2932, 3032 of FIGS. 28-30 to other hardware devices (e.g., hardware devices owned and/or operated by third parties from the owner and/or operator of the software distribution platform) is illustrated in FIG. 33. The example software distribution platform 3305 may be implemented by any computer server, data facility, cloud service, etc., capable of storing and transmitting software to other computing devices. The third parties may be customers of the entity owning and/or operating the software distribution platform 3305. For example, the entity that owns and/or operates the software distribution platform 3305 may be a developer, a seller, and/or a licensor of software such as the example machine readable instructions 2832, 2932, 3032 of FIGS. 28-30. The third parties may be consumers, users, retailers, OEMs, etc., who purchase and/or license the software for use and/or re-sale and/or sub-licensing. In the illustrated example, the software distribution platform 3305 includes one or more servers and one or more storage devices. The storage devices store the machine readable instructions 2832, 2932, 3032, which may correspond to the example machine readable instructions of FIGS. FIGS. 24-27, as described above. The one or more servers of the example software distribution platform 3305 are in communication with an example network 3410, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 2832, 2932, 3032 from the software distribution platform 3305. For example, the software, which may correspond to the example machine readable instructions of FIG. FIGS. 24-27, may be downloaded to the example programmable circuitry platform 2800, 2900, 3000, which is to execute the machine readable instructions 2832, 2932, 3032 to implement the sensor circuitry 1706, the telemetry analysis circuitry 1708, and/or the orchestration circuitry 1710. In some examples, one or more servers of the software distribution platform 3305 periodically offer, transmit, and/or force updates to the software (e.g., the example machine readable instructions 2832, 2932, 3032 of FIGS. 28-30) to ensure improvements, patches, updates, etc., are distributed and applied to the software at the end user devices. Although referred to as software above, the distributed "software" could alternatively be firmware.

From the foregoing, it will be appreciated that example systems, apparatus, articles of manufacture, and methods have been disclosed that orchestrate cooling strategies and/or cooling parameters in an edge environment based on, for example workloads being performed or expected to be, performed, resource availability, and SLOs. Examples disclosed herein facilitate dynamic adjustments to distribution of coolant for improved resource utilization based on sensor outputs across the infrastructure and performance of the compute devices. Examples disclosed herein can provide for target distribution of fluid in view of individual devices and/or device components to provide for efficient cooling within the edge environment.

Example methods, apparatus, systems, and articles of manufacture to manage cooling of compute components are disclosed herein. Further examples and combinations thereof include the following:

Example 1 includes an apparatus comprising interface circuitry, machine readable instructions, and programmable circuitry to at least one of instantiate or execute the machine readable instructions to identify a workload to be performed by a compute device, identify a service level objective associated with the workload or the compute device, determine a parameter of a coolant in an environment including the compute device, and cause at least one of (a) a cooling distribution unit to cause the coolant parameter to be adjusted to enable the service level objective to be satisfied or (b) the workload to be adjusted to enable the service level objective to be satisfied.

Example 2 includes the apparatus of example 1, wherein the programmable circuitry is to determine an expected heat influx associated with performance of the workload by the compute device based on one or more of (i) outputs of a sensor associated with the compute device or (ii) the workload.

Example 3 includes the apparatus of example 1 or 2, wherein the programmable circuitry is to determine the adjustment to coolant parameter based on the expected heat influx.

Example 4 includes the apparatus of any of examples 1-3, wherein the programmable circuitry is to determine an operational parameter of the cooling distribution unit, and cause a schedule of performance of the workload to be adjusted based on one or more of the operational parameter of the cooling distribution unit, the coolant parameter, or the adjustment to the coolant parameter.

Example 5 includes the apparatus of any of examples 1-4, wherein the workload is a first workload, the compute device is a first compute device, the first compute device to perform a second workload, and the programmable circuitry is to determine an operation parameter of the cooling distribution unit, and cause a schedule of performance of the workload to be adjusted based on one or more of the operational parameter of the cooling distribution unit, the coolant parameter, or the adjustment to the coolant parameter.

Example 6 includes the apparatus of any of examples 1-5, wherein the programmable circuitry is to determine the adjustment to the coolant parameter based on an expected operating temperature range of the compute device during performance of the workload.

Example 7 includes the apparatus of any of examples 1-6, wherein the coolant parameter includes a temperature of the coolant or a flow rate of the coolant.

Example 8 includes the apparatus of any of examples 1-7, wherein the compute device is a first compute device, and the programmable circuitry is to cause the cooling distribution unit to adjust a flow of the coolant between the first compute device and a second compute device based on the workload.

Example 9 includes the apparatus of any of examples 1-8, wherein the service level objective includes a target throughput, a target latency, target instructions per second, or an operating temperature threshold of the compute device or of the workload.

Example 10 includes the apparatus of any of examples 1-9, wherein the programmable circuitry includes one or more of at least one of a central processor unit, a graphics processor unit, or a digital signal processor, the at least one of the central processor unit, the graphics processor unit, or the digital signal processor having control circuitry to control data movement within the programmable circuitry, arithmetic and logic circuitry to perform one or more first operations corresponding to machine-readable data, and one or more registers to store a result of the one or more first operations, the machine-readable data in the apparatus, a Field Programmable Gate Array (FPGA), the FPGA including logic gate circuitry, a plurality of configurable interconnections, and storage circuitry, the logic gate circuitry and the plurality of the configurable interconnections to perform one or more second operations, the storage circuitry to store a result of the one or more second operations, or Application Specific Integrated Circuitry (ASIC) including logic gate circuitry to perform one or more third operations.

Example 11 includes a non-transitory machine readable storage medium comprising instructions to cause programmable circuitry to at least identify a first coolant parameter associated with a first compute device based on outputs generated by a first sensor associated with the first compute device, identify a second coolant parameter associated with a second compute device based on outputs generated by a second sensor associated with the second compute device, identify a first workload assigned to the first compute device, the first workload associated with a first service level objective for the first compute device, identify a second workload assigned to the second compute device, the second workload associated with a second service level objective for the second compute device, determine a cooling parameter for cooling the first compute device and the second compute device based on the first coolant parameter, the second coolant parameter, the first workload, and the second workload, and cause a cooling distribution unit to control flow of coolant with respect to the first compute device and the second compute device based on the cooling parameter.

Example 12 includes the non-transitory machine readable storage medium of example 11, wherein the instructions cause the programmable circuitry to determine heat influx associated with the first compute device based on the first workload, determine heat influx associated with the second compute device based on the second workload, perform a comparison of the heat influx associated with the first compute device to the heat influx associated with the second compute device, and determine the cooling parameter based on the comparison.

Example 13 includes the non-transitory machine readable storage medium of example 11 or 12, wherein the instructions cause the programmable circuitry to determine a third coolant parameter of the coolant based on the first workload, the cooling parameter including the third coolant parameter, and cause the cooling distribution unit to provide the coolant having the third coolant parameter for cooling the first compute device at a first time.

Example 14 includes the non-transitory machine readable storage medium of any of examples 11-13, wherein the instructions cause the programmable circuitry to detect, based on outputs of the first sensor, a change in the third coolant parameter after exposure of the coolant the first compute device at a second time, and adjust the cooling parameter based on the change.

Example 15 includes the non-transitory machine readable storage medium of any of examples 11-14, wherein the cooling parameter includes a schedule for performance of the first workload by the first compute device and performance of the second workload by the second compute device and the instructions cause the programmable circuitry to transmit the schedule to the first compute device and the second compute device.

Example 16 includes the non-transitory machine readable storage medium of any of examples 11-15, wherein the first compute device includes a first compute component and a second compute component, and the instructions cause the programmable circuitry to cause the cooling distribution unit to control the flow of coolant with respect to the first compute component and the second compute component.

Example 17 includes an apparatus comprising interface circuitry, computer readable instructions, and programmable circuitry to instantiate telemetry analysis circuitry to generate a heatmap associated with an environment based on outputs of sensors in the environment, the environment including a first compute device and a second compute device, one or more of the sensors associated with the first compute device and one or more of the sensors associated with the second compute device, and orchestration circuitry to determine a heat influx associated with the first compute device based on the heatmap, determine heat influx associated with the second compute device based on the heatmap determine a first coolant parameter for fluid in the environment based on the respective heat influxes, cause a cooling distribution unit to provide coolant having the first coolant parameter for cooling the first compute device and the second compute device.

Example 18 includes the apparatus of example 17, wherein the environment includes a tank including the first compute device and the second compute device.

Example 19 includes the apparatus of example 17 or 18, further including sensor circuitry to transmit a first output indicative of a second coolant parameter of the coolant at a first location, the first location including the first compute device, and transmit a second output indicative of a third coolant parameter of the coolant at a second location, the second location including the second compute device, the orchestration circuitry to determine the first coolant parameter based on the second coolant parameter and the third coolant parameter.

Example 20 includes the apparatus of any of examples 17-19, wherein the orchestration circuitry is to determine the first coolant parameter based on a service level objective associated with the first compute device and a service level objective associated with the second compute device.

Example 21 includes the apparatus of any of examples 17-20, wherein the orchestration circuitry is to determine the heat influx associated with the first compute device at a first time, the orchestration circuitry to detect a change in the heat influx associated with the first compute device at a second time, the second time after the first time, and responsive to the change, cause the cooling distribution unit to provide the coolant having a second cooling parameter for cooling the first compute device.

Example 22 includes a method comprising identifying a workload to be performed by a compute device, identifying a service level objective associated with the workload or the compute device, determining a parameter of a coolant to enable the service level objective to be satisfied during performance of the workload, and causing a cooling distribution unit to control the coolant based on the coolant parameter.

Example 23 includes the method of example 22, further including determining an expected heat influx associated with performance of the workload by the compute device based on one or more of (i) outputs of a sensor associated with the compute device or (ii) the workload.

Example 24 includes the method of example 22 or 23, further including determining the parameter of the coolant based on the expected heat influx.

Example 25 includes the method of any of examples 22-24, further including determining an operational parameter of the cooling distribution unit, and causing a schedule of performance of the workload to be adjusted based on the operational parameter of the cooling distribution unit and the coolant parameter.

Example 26 includes the method of any of examples 22-25, wherein the workload is a first workload, the compute device is a first compute device, the first compute device to perform a second workload, further including determining an operation parameter of the cooling distribution unit, and causing the second workload to be re-distributed from the first compute device to a second compute device based on the operational parameter of the cooling distribution unit.

Example 27 includes the method of any of examples 22-26, further including determining the coolant parameter based on an expected operating temperature range of the compute device during performance of the workload.

Example 28 includes the method of any of examples 22-27, wherein the coolant parameter includes a temperature of the coolant or a flow rate of the coolant.

Example 29 includes the method of any of examples 22-28, wherein the compute device is a first compute device, and further including causing the cooling distribution unit to adjust a flow of the coolant between the first compute device and a second compute device based on the workload.

Example 30 includes the method of any of examples 22-29, wherein the service level objective includes a target throughput, a target latency, target instructions per second, or an operating temperature threshold associated with the compute device or the workload.

Example 31 includes an apparatus comprising means for distributing workloads to identify a workload to be performed by a compute device, means for identifying a service level objective associated with the workload or the compute device, means for determining cooling targets to determine a parameter of a coolant to enable the service level objective to be satisfied during performance of the workload, and means for generating cooling parameters to cause a cooling distribution unit to control the coolant based on the coolant parameter.

Example 32 includes the apparatus of example 31, wherein the means for determining cooling targets is to determine an expected heat influx associated with performance of the workload by the compute device based on one or more of (i) outputs of a sensor associated with the compute device or (ii) the workload.

Example 33 includes the apparatus of example 31 or 32, wherein the means for determining cooling targets is to determine the parameter of the coolant based on the expected heat influx.

Example 34 includes the apparatus of any of examples 31-33, further including means for determining compute resources to determine an operational parameter of the cooling distribution unit, and means for distributing workloads to cause a schedule of performance of the workload to be adjusted based on the operational parameter of the cooling distribution unit and the coolant parameter.

Example 35 includes the apparatus of any of examples 31-34, wherein the workload is a first workload, the compute device is a first compute device, the first compute device to perform a second workload, wherein the means for distributing workloads is to cause the second workload to be re-distributed from the first compute device to a second compute device based on the operational parameter of the cooling distribution unit.

Example 36 includes the apparatus of any of examples 31-35, wherein the means for determining cooling targets is to determine the coolant parameter based on an expected operating temperature range of the compute device during performance of the workload.

Example 37 includes the apparatus of any of examples 31-36, wherein the coolant parameter includes a temperature of the coolant or a flow rate of the coolant.

Example 38 includes the apparatus of any of examples 31-37, wherein the compute device is a first compute device, and further including means for transmitting instructions to cause the cooling distribution unit to adjust a flow of the coolant between the first compute device and a second compute device based on the workload.

Example 39 includes the apparatus of any of examples 31-38, wherein the service level objective includes a target throughput, a target latency, target instructions per second, or an operating temperature threshold of the compute device or of the workload.

Example 40 includes an apparatus comprising memory, machine-readable instructions, and programmable circuitry to execute the machine-readable instructions to identify a first workload parameter associated with a first workload to be performed by a first compute device and a second workload parameter associated with a second workload to be performed by a second compute device, determine an operational parameter of the first compute device based on outputs of a first sensor associated with the first compute device, determine an operational parameter of the second compute device based on outputs of a second sensor associated with the second compute device, and cause an adjustment to a property associated with a coolant based on the first workload parameter, the second workload parameter, the operational parameter of the first compute device, and the operational parameter of the second compute device, the coolant to cool one or more of the first compute device or the second compute device.

Example 41 includes the apparatus of example 40, wherein the first workload parameter includes a service level operation parameter.

Example 42 includes the apparatus of example 40 or 41, wherein the adjustment is to cause a cooling distribution unit to adjust a temperature of the coolant provided to the first compute device.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:
interface circuitry;
machine-readable instructions; and
at least one programmable circuit to at least one of instantiate or execute the machine-readable instructions to:
identify a workload to be performed by a compute device;
identify a service level objective associated with the workload or the compute device;
determine a parameter of a coolant in an environment including the compute device;
determine a cooling target based on the workload and the service level objective;
determine a likelihood of the cooling target satisfying a threshold based on one or more of the workload or the coolant parameter;
in response to determining the likelihood is a first likelihood:
maintain a distribution of the workload to the compute device; and
cause a cooling distribution unit to cause the coolant parameter to be adjusted to enable the service level objective to be satisfied; and
in response to determining the likelihood is a second likelihood, cause the distribution of the workload to be adjusted to enable the service level objective to be satisfied.

2. The apparatus of claim 1, wherein one or more of the at least one programmable circuit is to determine an expected heat influx associated with performance of the workload by the compute device based on one or more of (i) outputs of a sensor associated with the compute device or (ii) the workload.

3. The apparatus of claim 2, wherein one or more of the at least one programmable circuit is to determine the adjustment to the coolant parameter based on the expected heat influx.

4. The apparatus of claim 2, wherein one or more of the at least one programmable circuit is to:
determine an operational parameter of the cooling distribution unit; and
cause a schedule of performance of the workload to be adjusted based on one or more of the operational parameter of the cooling distribution unit, the coolant parameter, or the adjustment to the coolant parameter.

5. The apparatus of claim 1, wherein the workload is a first workload, the compute device is a first compute device, the first compute device to perform a second workload, and one or more of the at least one programmable circuit is to cause the second workload to be re-distributed from the first compute device to a second compute device based on one or more of the service level objective, the coolant parameter, or the adjustment to the coolant parameter.

6. The apparatus of claim 1, wherein one or more of the at least one programmable circuit is to determine the adjustment to the coolant parameter based on an expected operating temperature range of the compute device during performance of the workload.

7. The apparatus of claim 6, wherein the coolant parameter includes a temperature of the coolant or a flow rate of the coolant.

8. The apparatus of claim 6, wherein the compute device is a first compute device, and one or more of the at least one programmable circuit is to cause the cooling distribution unit to adjust a flow of the coolant between the first compute device and a second compute device based on the workload.

9. The apparatus of claim 1, wherein the service level objective includes a target throughput, a target latency, target instructions per second, or an operating temperature threshold of the compute device or of the workload.

10. The apparatus of claim 1, wherein one or more of the at least one programmable circuit includes one or more of:

at least one of a central processor unit, a graphics processor unit, or a digital signal processor, the at least one of the central processor unit, the graphics processor unit, or the digital signal processor having control circuitry to control data movement within the one or more of the at least one programmable circuit, arithmetic and logic circuitry to perform one or more first operations corresponding to machine-readable data, and one or more registers to store a result of the one or more first operations, the machine-readable data in the apparatus;

a Field Programmable Gate Array (FPGA), the FPGA including logic gate circuitry, a plurality of configurable interconnections, and storage circuitry, the logic gate circuitry and the plurality of the configurable interconnections to perform one or more second operations, the storage circuitry to store a result of the one or more second operations; or Application Specific Integrated Circuitry (ASIC) including logic gate circuitry to perform one or more third operations.

11. A non-transitory machine-readable storage medium comprising machine-readable instructions to cause at least one programmable circuit to at least:

identify a first coolant parameter based on outputs generated by a first sensor associated with a first compute device;

identify a second coolant parameter based on outputs generated by a second sensor associated with a second compute device;

identify a first workload assigned to the first compute device, the first workload associated with a first service level objective for the first compute device;

identify a second workload assigned to the second compute device, the second workload associated with a second service level objective for the second compute device;

determine a cooling target for cooling the first compute device and the second compute device based on the first coolant parameter, the second coolant parameter, the first workload, and the second workload;

determine a likelihood of the cooling target satisfying a threshold based on one or more of the first workload, the second workload, the first coolant parameter, or the second coolant parameter;

in response to determining the likelihood is a first likelihood:

maintain a distribution of the first workload and the second workload; and cause a cooling distribution unit to adjust flow of coolant with respect to the first compute device and the second compute device based on the cooling target; and in response to determining the likelihood is a second likelihood, cause the distribution of at least one of the first workload or the second workload to be adjusted.

12. The non-transitory machine-readable storage medium of claim 11, wherein the machine-readable instructions are to cause one or more of the at least one programmable circuit to:

determine heat influx associated with the first compute device based on the first workload;

determine heat influx associated with the second compute device based on the second workload;

perform a comparison of the heat influx associated with the first compute device to the heat influx associated with the second compute device; and determine the cooling target based on the comparison.

13. The non-transitory machine-readable storage medium of claim 11, wherein the machine-readable instructions are to cause one or more of the at least one programmable circuit to:

determine a third coolant parameter of the coolant based on the first workload, the cooling target including the third coolant parameter; and cause the cooling distribution unit to provide the coolant having the third coolant parameter for cooling the first compute device at a first time.

14. The non-transitory machine-readable storage medium of claim 13, wherein the machine-readable instructions are to cause one or more of the at least one programmable circuit to:

detect, based on outputs of the first sensor, a change in the third coolant parameter after exposure of the coolant the first compute device at a second time; and adjust the cooling target based on the change.

15. The non-transitory machine-readable storage medium of claim 11, wherein the cooling target includes a schedule for performance of the first workload by the first compute device and performance of the second workload by the second compute device and the machine-readable instructions are to cause one or more of the at least one programmable circuit to transmit the schedule to the first compute device and the second compute device.

16. The non-transitory machine-readable storage medium of claim 11, wherein the first compute device includes a first compute component and a second compute component, and the machine-readable instructions are to cause one or more of the at least one programmable circuit to cause the cooling distribution unit to control the flow of coolant with respect to the first compute component and the second compute component.

17. An apparatus comprising:

interface circuitry;

machine-readable instructions; and at least one programmable circuit to at least one of instantiate or execute the machine-readable instructions to:

generate a heatmap associated with an environment based on outputs of sensors in the environment, the environment including a first compute device and a second compute device, one or more of the sensors associated with the first compute device and one or more of the sensors associated with the second compute device;

determine a heat influx associated with the first compute device based on the heatmap, the first compute device to perform a first workload;

determine a heat influx associated with the second compute device based on the heatmap, the second compute device to perform a second workload;

determine a cooling target based on the respective heat influxes;

determine a likelihood of the cooling target satisfying a threshold based on one or more of the first workload, the second workload, the heat influx associated with the first compute device, or the heat influx associated with the second compute device;

in response to determining the likelihood is a first likelihood:

maintain a distribution of the first workload and the second workload; and cause a cooling distribution unit to adjust a first coolant parameter of a fluid based on the cooling target; and in response to determining the likelihood is a second likelihood, cause the distribution of at least one of the first workload or the second workload to be adjusted.

18. The apparatus of claim 17, wherein the environment includes a tank including the first compute device and the second compute device.

19. The apparatus of claim 17, wherein one or more of the at least one programmable circuit is to:

transmit a first output indicative of a second coolant parameter of the fluid at a first location, the first location including the first compute device;

transmit a second output indicative of a third coolant parameter of the fluid at a second location, the second location including the second compute device; and determine the first coolant parameter based on the second coolant parameter and the third coolant parameter.

20. The apparatus of claim 17, wherein one or more of the at least one programmable circuit is to determine the first coolant parameter based on a service level objective associated with the first compute device and a service level objective associated with the second compute device.

* * * * *